US012612472B2

(12) United States Patent
Kawai et al.

(10) Patent No.: US 12,612,472 B2
(45) Date of Patent: Apr. 28, 2026

(54) ETHYLENE-VINYL ALCOHOL COPOLYMER AND RESIN COMPOSITION, AND MOLDED PRODUCT OBTAINED USING THE SAME

(71) Applicant: KURARAY CO., LTD., Kurashiki (JP)

(72) Inventors: Hiroshi Kawai, Kurashiki (JP); Yasuhiro Nonaka, Kurashiki (JP); Syunsuke Fujioka, Kurashiki (JP); Hatsuyo Miyake, Kurashiki (JP)

(73) Assignee: KURARAY CO., LTD., Kurashiki (JP)

( * ) Notice: Subject to any disclaimer, the term of this patent is extended or adjusted under 35 U.S.C. 154(b) by 0 days.

(21) Appl. No.: 15/325,317

(22) PCT Filed: Jul. 10, 2015

(86) PCT No.: PCT/JP2015/069930
§ 371 (c)(1),
(2) Date: Jan. 10, 2017

(87) PCT Pub. No.: WO2016/006694
PCT Pub. Date: Jan. 14, 2016

(65) Prior Publication Data

US 2017/0183426 A1 Jun. 29, 2017

(30) Foreign Application Priority Data

Jul. 11, 2014 (JP) ................................ 2014-143743
Jul. 11, 2014 (JP) ................................ 2014-143744
(Continued)

(51) Int. Cl.
*B29B 9/12* (2006.01)
*B29C 49/00* (2006.01)
(Continued)

(52) U.S. Cl.
CPC .................. *C08F 8/12* (2013.01); *B29B 9/12* (2013.01); *B29C 49/0005* (2013.01);
(Continued)

(58) Field of Classification Search
CPC ........... B32B 1/02; B32B 27/32; B32B 27/34; Y10T 428/1352; Y10T 428/1383;
(Continued)

(56) References Cited

U.S. PATENT DOCUMENTS 4,977,004 A * 12/1990 Bettle, III ............ B65D 1/0215 428/34.3
5,194,474 A * 3/1993 Aoyama ................. B32B 27/28 524/436
(Continued)

FOREIGN PATENT DOCUMENTS

| | | |
|---|---|---|
| CN | 1287051 A | 3/2001 |
| CN | 1290209 A | 4/2001 |

(Continued)

OTHER PUBLICATIONS

Ketels, Eindhoven University of Technology, Sep. 1989 . . . .*
(Continued)

*Primary Examiner* — Michael C. Romanowski
(74) *Attorney, Agent, or Firm* — Oblon, McClelland, Maier & Neustadt, L.L.P.

(57) ABSTRACT

Provided are an ethylene-vinyl alcohol copolymer, a resin composition and a molded product thereof being superior in long-run stability of melt molding, with inhibited coloring and generation of film forming defects such as flaws in formed film and streaks, and also being superior in appearance characteristics. An ethylene-vinyl alcohol copolymer (A) obtained by saponifying a copolymer of ethylene and a vinyl ester, in which molecular weights determined by using gel permeation chromatography with a differential refractive
(Continued)

index detector and an ultraviolet and visible absorbance detector after a heat treatment in a nitrogen atmosphere at 220° C. for 50 hrs satisfy the inequality (1):

$$(Ma-Mb)/Ma<0.45 \quad (1)$$

wherein: Ma represents a molecular weight in terms of polymethyl methacrylate equivalent on a maximum value of a peak measured by the differential refractive index detector; and Mb represents a molecular weight in terms of polymethyl methacrylate equivalent on a maximum value of an absorption peak at a wavelength of 220 nm measured by the ultraviolet and visible absorbance detector.

17 Claims, 7 Drawing Sheets

(30) Foreign Application Priority Data

Jul. 11, 2014 (JP) ................................ 2014-143745
Jul. 11, 2014 (JP) ................................ 2014-143746
Jul. 11, 2014 (JP) ................................ 2014-143747
Jul. 11, 2014 (JP) ................................ 2014-143748
Jul. 11, 2014 (JP) ................................ 2014-143749
Jul. 11, 2014 (JP) ................................ 2014-143750

(51) Int. Cl.

| | |
|---|---|
| ***B29C 49/22*** | (2006.01) |
| ***B29C 51/14*** | (2006.01) |
| ***B29K 23/00*** | (2006.01) |
| ***B32B 7/12*** | (2006.01) |
| ***B32B 15/085*** | (2006.01) |
| ***B32B 15/09*** | (2006.01) |
| ***B32B 15/20*** | (2006.01) |
| ***B32B 27/08*** | (2006.01) |
| ***B32B 27/10*** | (2006.01) |
| ***B32B 27/20*** | (2006.01) |
| ***B32B 27/28*** | (2006.01) |
| ***B32B 27/30*** | (2006.01) |
| ***B32B 27/32*** | (2006.01) |
| ***B32B 27/34*** | (2006.01) |
| ***B32B 27/36*** | (2006.01) |
| ***B32B 27/40*** | (2006.01) |
| ***B65D 1/40*** | (2006.01) |
| ***B65D 65/38*** | (2006.01) |
| ***C08F 8/12*** | (2006.01) |
| ***C08F 216/06*** | (2006.01) |
| ***C08J 3/20*** | (2006.01) |
| ***C08J 3/205*** | (2006.01) |
| ***C08J 5/18*** | (2006.01) |
| ***C08K 3/36*** | (2006.01) |
| ***C08K 5/098*** | (2006.01) |
| ***C08L 23/06*** | (2006.01) |
| ***C08L 23/0861*** | (2025.01) |
| ***C08L 29/04*** | (2006.01) |
| ***C23C 14/20*** | (2006.01) |
| ***C23C 14/24*** | (2006.01) |
| *B29B 9/06* | (2006.01) |
| *B29C 51/00* | (2006.01) |
| *B29K 105/00* | (2006.01) |

(52) U.S. Cl.

CPC ................ *B29C 49/22* (2013.01); *B32B 7/12* (2013.01); *B32B 15/085* (2013.01); *B32B 15/09* (2013.01); *B32B 15/20* (2013.01); *B32B 27/08* (2013.01); *B32B 27/10* (2013.01); *B32B 27/20* (2013.01); *B32B 27/28* (2013.01); *B32B 27/302* (2013.01); *B32B 27/304* (2013.01); *B32B 27/306* (2013.01); *B32B 27/308* (2013.01); *B32B 27/32* (2013.01); *B32B 27/322* (2013.01); *B32B 27/34* (2013.01); *B32B 27/36* (2013.01); *B32B 27/365* (2013.01); *B32B 27/40* (2013.01); *B65D 1/40* (2013.01); *B65D 65/38* (2013.01); *C08F 216/06* (2013.01); *C08J 3/203* (2013.01); *C08J 3/2053* (2013.01); *C08J 5/18* (2013.01); *C08K 3/36* (2013.01); *C08K 5/098* (2013.01); *C08L 23/06* (2013.01); *C08L 23/0861* (2013.01); *C08L 29/04* (2013.01); *C23C 14/20* (2013.01); *C23C 14/24* (2013.01); *B29B 9/06* (2013.01); *B29C 51/002* (2013.01); *B29C 51/14* (2013.01); *B29K 2023/083* (2013.01); *B29K 2105/253* (2013.01); *B32B 2250/24* (2013.01); *B32B 2255/10* (2013.01); *B32B 2255/205* (2013.01); *B32B 2255/26* (2013.01); *B32B 2255/28* (2013.01); *B32B 2262/101* (2013.01); *B32B 2264/102* (2013.01); *B32B 2270/00* (2013.01); *B32B 2307/31* (2013.01); *B32B 2307/518* (2013.01); *B32B 2307/538* (2013.01); *B32B 2307/54* (2013.01); *B32B 2307/558* (2013.01); *B32B 2307/7242* (2013.01); *B32B 2307/7244* (2013.01); *B32B 2307/738* (2013.01); *B32B 2307/746* (2013.01); *B32B 2307/748* (2013.01); *B32B 2439/40* (2013.01); *B32B 2439/46* (2013.01); *B32B 2439/70* (2013.01); *B32B 2439/80* (2013.01); *C08J 3/205* (2013.01); *C08J 2323/08* (2013.01); *C08K 2201/005* (2013.01); *C08L 2205/02* (2013.01); *C08L 2205/025* (2013.01); *C08L 2205/03* (2013.01); *C08L 2207/066* (2013.01)

(58) Field of Classification Search

CPC ..... Y10T 428/31725; Y10T 428/31855; C08F 216/06; C08J 3/2053; C08J 3/20-215; C08J 3/205-21

USPC ......... 428/35.9, 35.7, 36.7, 474.4, 500, 480; 522/113

See application file for complete search history.

(56) References Cited

U.S. PATENT DOCUMENTS

| | | | | |
|---|---|---|---|---|
| 5,286,575 | A * | 2/1994 | Chou ...................... | B29C 51/14 428/474.4 |
| 5,399,619 | A * | 3/1995 | Torradas ................. | C08L 29/00 525/227 |
| 6,242,087 | B1 | 6/2001 | Kawai | |
| 6,638,871 | B2 * | 10/2003 | Wang ................ | H01L 21/76811 438/700 |
| 6,686,405 | B1 * | 2/2004 | Kawahara ................. | B29B 9/06 524/127 |
| 7,691,485 | B2 * | 4/2010 | Moriyama .............. | C08L 29/04 428/515 |
| 7,811,646 | B2 * | 10/2010 | Ikeda ........................ | C08F 8/00 428/34.1 |
| 7,915,341 | B2 * | 3/2011 | Shibutani .................. | C08F 8/12 428/34.1 |
| 9,162,431 | B2 * | 10/2015 | Matsumoto ............. | B32B 27/00 |
| 2001/0025087 | A1 | 9/2001 | Kazeto et al. | |
| 2001/0056160 | A1 * | 12/2001 | Ninomiya ............... | C08F 18/08 525/330.6 |
| 2002/0068806 | A1 * | 6/2002 | Yoshimi .................. | B32B 27/32 526/330 |

(56) References Cited

U.S. PATENT DOCUMENTS

| | | | | |
|---|---|---|---|---|
| 2004/0019151 | A1* | 1/2004 | Kawahara | C08F 8/12 525/62 |
| 2005/0038163 | A1* | 2/2005 | Shindome | B29C 49/0005 524/424 |
| 2005/0107507 | A1* | 5/2005 | Ikeda | C08K 3/38 524/424 |
| 2006/0258803 | A1* | 11/2006 | Stark | C08J 3/14 525/56 |
| 2009/0274917 | A1* | 11/2009 | Kazeto | C08K 5/09 524/556 |
| 2009/0311524 | A1 | 12/2009 | Noma et al. | |
| 2010/0196730 | A1* | 8/2010 | Bekele | B29C 47/0021 428/474.7 |
| 2010/0243097 | A1* | 9/2010 | Jani | B29C 63/10 138/137 |
| 2012/0041118 | A1 | 2/2012 | Shibutani et al. | 524/284 |
| 2012/0237742 | A1 | 9/2012 | Tai et al. | |
| 2013/0065001 | A1 | 3/2013 | Kani et al. | |
| 2014/0018462 | A1* | 1/2014 | Tsuboi | C08F 8/12 522/113 |
| 2014/0213701 | A1 | 7/2014 | Nonaka et al. | |
| 2015/0041462 | A1 | 2/2015 | Nakazawa et al. | |
| 2015/0152256 | A1 | 6/2015 | Nakazawa et al. | |
| 2015/0159005 | A1 | 6/2015 | Nakazawa et al. | |
| 2016/0108193 | A1 | 4/2016 | Kawai et al. | |

FOREIGN PATENT DOCUMENTS

| | | | | |
|---|---|---|---|---|
| CN | 102712181 | A | | 10/2012 |
| CN | 103635526 | A | | 3/2014 |
| EP | 2 730 614 | A1 | | 5/2014 |
| EP | 2 832 653 | A1 | | 2/2015 |
| EP | 2 862 897 | A1 | | 4/2015 |
| EP | 2 862 898 | A1 | | 4/2015 |
| EP | 3 006 501 | A1 | | 4/2016 |
| JP | 55-49339 | A | | 4/1980 |
| JP | 59-20345 | A | | 2/1984 |
| JP | 3-72542 | A | | 3/1991 |
| JP | 4-227744 | A | | 8/1992 |
| JP | 5-255554 | A | | 10/1993 |
| JP | 7-97491 | A | | 4/1995 |
| JP | 9-71620 | A | | 3/1997 |
| JP | 10-80981 | A | | 3/1998 |
| JP | 10-204229 | A | | 8/1998 |
| JP | 11-60874 | A | | 3/1999 |
| JP | 2000-143736 | A | | 5/2000 |
| JP | 2000-177068 | | | 6/2000 |
| JP | 2000-212369 | A | | 8/2000 |
| JP | 2000-265024 | A | | 9/2000 |
| JP | 2000-309643 | A | | 11/2000 |
| JP | 2001-96529 | | | 4/2001 |
| JP | 2001-146539 | A | | 5/2001 |
| JP | 2001-200123 | A | | 7/2001 |
| JP | 2002-194009 | A | | 7/2002 |
| JP | 2002-310385 | A | | 10/2002 |
| JP | 2004-359965 | | | 12/2004 |
| JP | 2005029701 | A | * | 2/2005 |
| JP | 2005146062 | A | * | 6/2005 |
| JP | 2005-290108 | A | | 10/2005 |
| JP | 2006-95748 | | | 4/2006 |
| JP | 2006-272569 | A | | 10/2006 |
| JP | 2006-526050 | | | 11/2006 |
| JP | 2007-1283 | A | | 1/2007 |
| JP | 2009-242645 | A | | 10/2009 |
| JP | 4674004 | B2 | | 4/2011 |
| JP | 2011-241234 | A | | 12/2011 |
| JP | 2012-21168 | A | | 2/2012 |
| JP | 2012-153815 | A | | 8/2012 |
| JP | 2013-177646 | A | | 9/2013 |
| TW | 201208884 | A1 | | 3/2012 |
| WO | WO 03/072653 | A1 | | 9/2003 |
| WO | WO 2005/105437 | A1 | | 11/2005 |
| WO | WO 2006/022256 | A1 | | 3/2006 |
| WO | WO 2011/118762 | A1 | | 9/2011 |
| WO | WO 2013/005807 | A1 | | 1/2013 |
| WO | WO 2013/125564 | A1 | | 8/2013 |
| WO | WO 2013/146962 | A1 | | 10/2013 |
| WO | WO 2013/187454 | A1 | | 12/2013 |
| WO | WO 2013/187455 | A1 | | 12/2013 |
| WO | 2014/104160 | A1 | | 7/2014 |

OTHER PUBLICATIONS

International Search Report issued Sep. 29, 2015 in PCT/JP2015/069930 filed Jul. 10, 2015.

Office Action issued Dec. 13, 2018 in corresponding European Patent Application No. 15 819 595.8, 7 pages.

Extended European Search Report issued Feb. 7, 2018 in corresponding European Patent Application No. 15819595.8, 7 pages.

European Search Report issued Nov. 28, 2019, in European Patent Application No. 19180921.9.

* cited by examiner

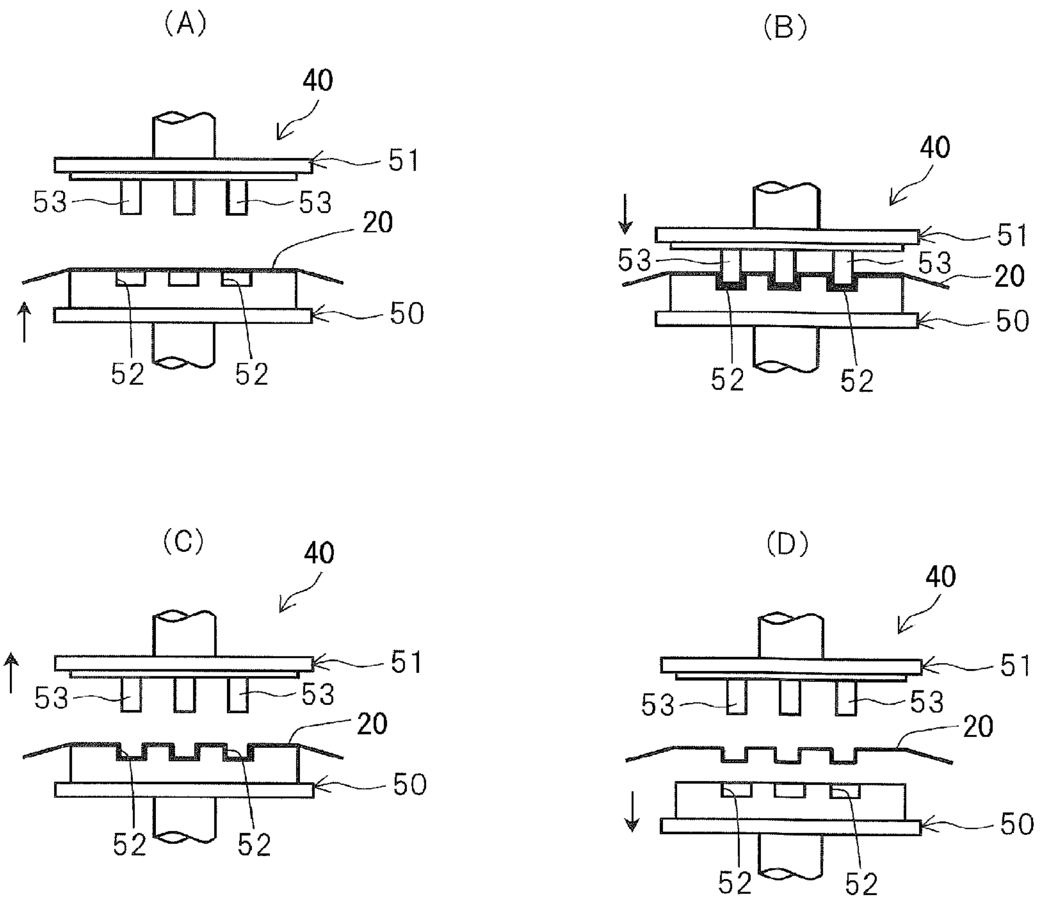
F I G. 6

ETHYLENE-VINYL ALCOHOL COPOLYMER AND RESIN COMPOSITION, AND MOLDED PRODUCT OBTAINED USING THE SAME

TECHNICAL FIELD

The present invention relates to an ethylene-vinyl alcohol copolymer, a resin composition, a film, vapor-deposited film, multilayer structure, thermoformed container, blow-molded product and fuel container.

BACKGROUND ART

For forming containers, films, sheets and the like, melt molding by using a resin composition is generally employed. Such a resin composition is required to be capable of forming molded articles having less defects such as streaks and fish eyes and having superior appearance characteristics, and to be superior in properties for operation over a long time period (long-run stability), i.e., properties that the defects are less likely to be generated even in melt molding over a long time period, and the like. In particular, such defects not only deteriorate the appearance characteristics of the molded articles but also cause deterioration of performance; therefore, inhibition of the generation of defects is important.

On the other hand, ethylene-vinyl alcohol copolymers (hereinafter, may be also referred to as "EVOH(s)") are polymeric materials that are superior in gas barrier properties against oxygen and the like, oil resistance, antistatic properties, mechanical strength, and the like. Thus, EVOH-containing resin compositions have been widely used as molding materials of molded articles such as containers.

However, since EVOH has a comparatively active hydroxyl group in its molecule, an oxidizing and crosslinking reaction is caused in a molten state at high temperatures even in the interior of an extrusion molding machine in a state being almost free from oxygen, and thus thermal deterioration products may be generated. In particular, when a continuous operation is carried out over a long time period, the thermal deterioration products are likely to be deposited in the molding machine, leading to occurrence of gelation that accounts for fish eyes. Thus, insufficient long-run stability tends to be caused in the melt molding using the EVOH-containing resin composition.

In order to overcome such disadvantages, a variety of EVOH-containing resin compositions have been developed. For example, an EVOH-containing resin composition that exhibits improved long-run stability during the melt molding due to containing a boron compound, sodium acetate and magnesium acetate (see Japanese Unexamined Patent Application, Publication No. H11-60874), an EVOH-containing resin composition that inhibits the occurrence of gelation on melt molding due to containing a conjugated polyene compound (see Japanese Unexamined Patent Application, Publication No. H9-71620), an EVOH-containing resin composition that is superior in thermal stability and exhibits inhibited oxidative gel formation at elevated temperatures due to containing a specific carboxylic acid metal salt and a hindered phenol antioxidant (see Japanese Unexamined Patent Application, Publication No. H4-227744), and the like have been developed.

However, according to these conventional EVOH-containing resin compositions, the improvement of the long-run stability is unsatisfactory, and additionally, when a large amount of the metal salt is contained in the resin composition, the molded article tends to be yellowed, leading to an unfavorable appearance. Moreover, in consideration of the environment, for example, in light of a reduction in amounts of basic materials and waste of molded articles such as packagings, a reduction in thickness of the molded articles has been desired. Such a reduction in thickness is likely to be accompanied by generation of film forming defects such as streaks and flaws in formed film as well as occurrence of unfavorable appearance such as coloring, and therefore a further improvement of the appearance characteristics has been needed.

In addition, the EVOH-containing resin composition may be required to more inhibit coloring such as yellowing in melt molding. In order to meet this demand, a method has been proposed in which a certain amount of a metal salt is contained in the EVOH resin composition (see Japanese Unexamined Patent Application, Publication No. 2001-146539). Moreover, the EVOH resin composition may be desired to have a performance (film breakage resistance) capable of inhibiting film breakage due to the tension between rolls in processing and film unwinding, after film molding, in laminating processing with other thermoplastic resin as well as vapor deposition processing of aluminum etc. Furthermore, the EVOH resin composition may be also desired to be superior in slipping properties between films during the storage as a film roll after film molding (blocking resistance) and in slipping properties with rolls for production in lamination processing, and thus blending an oxide and boron compound has been proposed to meet such demands (see Japanese Unexamined Patent Application, Publication No. 2000-265024). Furthermore, possible inhibition of generation of pinholes in carrying out a vapor deposition processing (inhibitory ability of vapor deposition flaw) of the film obtained by molding of the EVOH resin composition may be also desired, and a resin film for a surface treatment in which a molar ratio of the oxygen atom to the carbon atom on the film surface falls within a specific range has been proposed in an attempt to meet this demand (see Japanese Unexamined Patent Application, Publication No. 2005-290108). However, it is impossible to satisfy the demands by the conventional resin composition and film.

Moreover, the EVOH resin composition may be used as a molded product such as a packaging through laminating a thermoplastic resin containing a polyolefin-derived resin, etc., as a principal component. This molded product may be reused as at least one layer of a multilayer structure that includes a polyolefin layer and an EVOH layer by recovering end portions, defective products and the like generated in molding, followed by melt molding. Thus, there may be a case in which the EVOH resin composition is desired to maintain superior appearance characteristics and impact resistance when subjected to repeated recovery and recycling. Taking into consideration these demands, an EVOH resin composition suited for recycling was proposed (for example, see Japanese Unexamined Patent Application, Publication No. H3-72542); however, it is still impossible to satisfy the demands described above.

Additionally, laminates which include an EVOH layer formed from an EVOH resin composition, and other thermoplastic resin layer has been known to be useful as a packaging material for boiling sterilization or for retort sterilization of food. When used in this intended usage, the laminate is required to have "retort resistance", i.e., being capable of inhibiting penetration of water into the EVOH layer during a boiling and retorting process with a hot water system. To meet this demand, a method in which a polyamide having superior hot water resistance (hereinafter, may be also referred to as "PA") is blended in the EVOH resin composition has been proposed (for example, see Japanese Unexamined Patent Application, Publication No. H10-80981). However, since the conventional EVOH resin composition containing PA result in an increase of generation of burnt deposits in an extruder, screw and die during melt molding over a long time period, etc., whereby it is difficult to both achieve an inhibitory ability of generation of burnt deposits during a long-run operation and an improvement of retort resistance.

Furthermore, the EVOH resin composition may be required to achieve a secondary processing applicability in molding into packagings of food, etc., in particular, improvements of heat stretching properties and transparency. To meet these demands, an EVOH resin composition containing two or more types of EVOHs having each different degree of saponification or the like has been proposed (see Japanese Unexamined Patent Application, Publication No. 2000-212369). However, since the conventional EVOH resin composition is likely to be accompanied by coloring and generation of flow marks during a long-run operation, it is difficult to achieve inhibition of both the coloring and generation of flow marks during a long-run operation, and improvement of heat stretching properties.

Moreover, as a heat insulating material, a gas barrier film may be used which includes a base film which is formed from an EVOH resin composition, and a metal vapor-deposition layer of aluminum, etc., provided by vapor deposition on the base film. This gas barrier film is required to be accompanied by inhibited defects of the metal vapor-deposition layer, and to have improved adhesiveness between the film and the metal vapor-deposition layer. To meet such demands, for example, a method in which an inorganic filler is contained in the base film (see Japanese Unexamined Patent Application, Publication No. 2002-310385), and a method in which the base film is subjected to a surface treatment (see Japanese Unexamined Patent Application, Publication No. 2005-290108) have been proposed; however, satisfying the aforementioned demands has failed.

Further, the packaging that includes the EVOH layer formed from the EVOH resin composition may be used as a packing container that is superior in oxygen barrier properties by way of thermoforming. The packing container is required to be accompanied by inhibited generation of defects in thermoforming, and improved appearance characteristics and strength, and to meet such demand, for example, an EVOH resin composition to which plasticizer, polyamide or the like is added has been proposed (for example, see Japanese Unexamined Patent Application, Publication No. S59-020345). However, since a thermoformed container formed from the conventional EVOH resin composition may have deteriorated gas barrier properties, it is impossible to satisfy the demands while maintaining characteristics of the EVOH of itself.

Still further, as a blow-molded container, a multilayer structure may be used which includes an EVOH layer formed from an EVOH resin composition, and a layer of other thermoplastic resin. In a production step of the blow-molded container, an operation of the melt molding apparatus may be stopped once and thereafter restart for changing the resin or the like. In this case, for preventing deterioration of the quality of the molded article due to any deteriorated resin composition remained in the melt molding apparatus, the EVOH resin composition is required to have a feature that is capable of being rapidly discharged from the melt molding apparatus (self-purge feature). To meet this demand, an EVOH resin composition containing an alkaline earth metal salt, etc., has been proposed (for example, see Japanese Unexamined Patent Application, Publication No. H5-255554); however, the self-purge feature of the conventional EVOH-containing resin composition is not considered to be favorable.

PRIOR ART DOCUMENTS

Patent Documents

Patent Document 1: Japanese Unexamined Patent Application, Publication No. H11-60874
Patent Document 2: Japanese Unexamined Patent Application, Publication No. H9-71620
Patent Document 3: Japanese Unexamined Patent Application, Publication No. H4-227744
Patent Document 4: Japanese Unexamined Patent Application, Publication No. 2001-146539
Patent Document 5: Japanese Unexamined Patent Application, Publication No. 2000-265024
Patent Document 6: Japanese Unexamined Patent Application, Publication No. 2005-290108
Patent Document 7: Japanese Unexamined Patent Application, Publication No. H3-72542
Patent Document 8: Japanese Unexamined Patent Application, Publication No. H10-80981
Patent Document 9: Japanese Unexamined Patent Application, Publication No. 2000-212369
Patent Document 10: Japanese Unexamined Patent Application, Publication No. 2002-310385
Patent Document 11: Japanese Unexamined Patent Application, Publication No. S59-020345
Patent Document 12: Japanese Unexamined Patent Application, Publication No. H5-255554

SUMMARY OF THE INVENTION

Problems to be Solved by the Invention

The present invention was made in view of the foregoing circumstances, and an objective of the present invention to provide an ethylene-vinyl alcohol copolymer, a resin composition, and a molded product obtained using the same which result in superior long-run stability in melt molding, as well as inhibited generation of film forming defects such as streaks and flaws in formed film and inhibited coloring, while providing superior appearance characteristics.

Means for Solving the Problems

According to an aspect of the present invention, an ethylene-vinyl alcohol copolymer (A) is obtained by saponifying a copolymer of ethylene and a vinyl ester, and after subjecting the ethylene-vinyl alcohol copolymer (A) to a heat treatment in a nitrogen atmosphere at 220° C. for 50 hrs, molecular weights thereof determined by using gel permeation chromatography with a differential refractive index detector and an ultraviolet and visible absorbance detector satisfy the following inequality (1):

$$(Ma-Mb)/Ma<0.45 \quad (1)$$

wherein: Ma represents a molecular weight in terms of polymethyl methacrylate equivalent on a maximum value of a peak measured by the differential refractive index detector; and Mb represents a molecular weight in terms of polymethyl methacrylate equivalent on a maximum value of an absorption peak at a wavelength of 220 nm measured by the ultraviolet and visible absorbance detector.

Due to the feature that the inequality (1) is satisfied, the ethylene-vinyl alcohol copolymer results in superior long-run stability in melt molding, and enables the generation of film forming defects such as streaks and flaws in formed film, and coloring to be inhibited. Therefore, the ethylene-vinyl alcohol copolymer can provide a molded article such as a multilayer structure and the like having superior appearance characteristics.

It is preferred that after subjecting the ethylene-vinyl alcohol copolymer (A) to a heat treatment in a nitrogen atmosphere at 220° C. for 50 hrs, molecular weights thereof determined by using gel permeation chromatography with a differential refractive index detector and an ultraviolet and visible absorbance detector further satisfy the following inequality (2):

$$(Ma-Mc)/Ma<0.45 \quad (2)$$

wherein, Ma represents a molecular weight in terms of polymethyl methacrylate equivalent on a maximum value of a peak measured by the differential refractive index detector; and Mc represents a molecular weight in terms of polymethyl methacrylate equivalent on a maximum value of an absorption peak at a wavelength of 280 nm measured by the ultraviolet and visible absorbance detector.

When the inequality (2) is satisfied according to the ethylene-vinyl alcohol copolymer (A), the long-run stability and appearance characteristics in melt molding can be more improved.

The vinyl ester is preferably vinyl acetate. In addition, the content of acetaldehyde in vinyl acetate is preferably less than 100 ppm. Thus, when the vinyl ester is vinyl acetate, and the content of acetaldehyde in vinyl acetate is less than 100 ppm, the ethylene-vinyl alcohol copolymer (A) can be prepared easily such that the above inequality (1) is satisfied.

According to another aspect of the present invention, a resin composition contains the ethylene-vinyl alcohol copolymer of the aspect of the present invention. Due to containing the ethylene-vinyl alcohol copolymer, the resin composition results in superior long-run stability in melt molding, as well as inhibited generation of film forming defects such as streaks and flaws in formed film and inhibited coloring, while providing superior appearance characteristics.

It is preferred that the resin composition further contains an alkali metal salt (B1) of an organic acid. The content of the alkali metal salt (B1) in terms of metal equivalent is preferably 1 ppm or greater and 1,000 ppm or less. When the alkali metal salt (B1) is contained in the specific amount, coloring can be inhibited, and as a result, the appearance characteristics can be more improved. In addition, long-run stability and the interlayer adhesive force when formed into a multilayer structure can be improved.

It is preferred that the resin composition further contains a multivalent metal salt (B2) of an organic acid. The content of the multivalent metal salt (B2) in terms of metal equivalent is preferably 1 ppm or greater and 500 ppm or less. When the multivalent metal salt (B2) is contained in the specific amount, generation of gels and seeds (dirt under paint) during a long-run operation can be inhibited, and as a result, the inhibitory ability of generation of burnt deposits during a long-run operation can be improved.

It is preferred that the resin composition further contains an inorganic particle (C). The content of the inorganic particle (C) is preferably 50 ppm or greater and 5,000 ppm or less. The resin composition thus containing the inorganic particles (C) in a specific amount enables: appearance characteristics after melt molding such as a color of the film edge portion (roll edge portion); film breakage resistance; inhibitory ability of vapor deposition flaw; and adhesion strength of the vapor-deposition layer to be more improved. In addition, the arithmetic average roughness (Ra) of the surface of the film formed from the resin composition becomes adequate, and blocking resistance and slipping properties can be improved.

It is preferred that the resin composition further contains a polyolefin (D). Accordingly, when the resin composition further contains the polyolefin (D), even in a case in which recovery and recycling are repeated, superior appearance characteristics and impact resistance can be maintained.

It is preferred that the resin composition further contains a polyamide (E). The mass ratio (A/E) of the ethylene-vinyl alcohol copolymer (A) to the polyamide (E) is preferably 60/40 or greater and 95/5 or less. When the resin composition thus contains the polyamide (E) in a specific amount, inhibitory ability of generation of burnt deposits in a molding machine during a long-run operation, and retort resistance can be both improved. As a result, a molded article that is superior in the appearance characteristics and mechanical strength can be produced.

According to the resin composition, it is preferred that the ethylene content of the ethylene-vinyl alcohol copolymer (A) is 10 mol % or greater and 50 mol % or less, and an ethylene-vinyl alcohol copolymer (F) having an ethylene content of 30 mol % or greater and 60 mol % or less is further contained. The value obtained by subtracting the ethylene content of the ethylene-vinyl alcohol copolymer (A) from the ethylene content of the ethylene-vinyl alcohol copolymer (F) is preferably 8 mol % or greater. The mass ratio (A/F) of the ethylene-vinyl alcohol copolymer (A) to the ethylene-vinyl alcohol copolymer (F) is preferably 60/40 or greater and 95/5 or less. When the resin composition thus contains the ethylene-vinyl alcohol copolymer (A) and the ethylene-vinyl alcohol copolymer (F) having the ethylene content falling within the above range in the specific amount, generation of flow marks and coloring during a long-run operation can be inhibited, and superior heat stretching properties can be attained. As a result, a multilayer sheet that is superior in appearance characteristics and heat stretching properties can be formed. In addition, a packaging and a container having superior appearance characteristics with inhibited generation of flow marks can be obtained from the multilayer sheet.

The difference between the melting points of the ethylene-vinyl alcohol copolymer (A) and the melting point of the ethylene-vinyl alcohol copolymer (F) is preferably 15° C. or greater. When the difference between the melting points of the two types of EVOHs thus falls within the above range, heat stretching properties can be further improved.

The ethylene-vinyl alcohol copolymer (F) preferably has a structural unit represented by the following formula (3). In addition, the percentage content of this structural unit with respect to total vinyl alcohol units in the ethylene-vinyl alcohol copolymer (F) is preferably 0.3 mol % or greater and 40 mol % or less. When the ethylene-vinyl alcohol copolymer (F) has the above-specified structural unit at the specific percentage content, heat stretching properties are further improved.

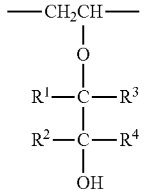

(3)

wherein, in the formula (3), $R^1$, $R^2$, $R^3$ and $R^4$ each independently represent a hydrogen atom, a hydrocarbon group having 1 to 10 carbon atoms or an alkoxy group having 1 to 10 carbon atoms; a part or all of hydrogen atoms included in the hydrocarbon group may be substituted with a hydroxyl group, an alkoxy group, a carboxy group or a halogen atom; and $R^1$ and $R^2$ may bind with each other to form a ring structure.

According to still another aspect of the present invention, a film comprises the resin composition of the above aspect of the present invention. In addition, according to other aspect of the present invention, a vapor-deposited film comprises the film of the above aspect of the present invention, and a metal vapor-deposition layer laminated on the film. Since the vapor-deposited film is accompanied by inhibited generation of vapor deposition flaws and cracks in the metal vapor-deposition layer, and is superior in adhesiveness of the metal vapor-deposition layer to the film as a substrate, deterioration of the gas barrier properties can be inhibited. Therefore, the vapor-deposited film can be suitably used for packagings and vacuum insulators.

According to yet another aspect of the present invention, a multilayer structure has a first layer comprising the resin composition of the above aspect of the present invention. Moreover, according to a further aspect of the present invention, a thermoformed container comprises the multilayer structure of the yet another aspect of the present invention. In addition to having sufficient gas barrier properties and oil resistance as a characteristic of EVOH, the thermoformed container enables generation of defects in thermoforming to be inhibited, and has excellent appearance characteristics as well as sufficient strength, due to the first layer containing the ethylene-vinyl alcohol copolymer (A) having the above-specified features. In addition, the thermoformed container enables the manufacturing cost to be reduced by virtue of the first layer containing the ethylene-vinyl alcohol copolymer (A) having the above-specified features, since a self-purge feature in the production step is also superior. Therefore, the thermoformed container can be used in various intended usage.

According to still other aspect of the present invention, a blow-molded product comprises the multilayer structure of the yet another aspect of the present invention. In addition to having sufficient gas barrier properties and oil resistance as a characteristic of EVOH, the blow-molded product is superior in appearance characteristics since generation of defects such as gelatinous seeds (dirt under paint) and streaks resulting from melt molding, and coloring can be inhibited, due to the first layer containing the ethylene-vinyl alcohol copolymer (A) having the above-specified features. In addition, the blow-molded product enables the manufacturing cost to be reduced by virtue of the first layer containing the ethylene-vinyl alcohol copolymer (A) having the above-specified features, since a self-purge feature in the production step is also superior. Therefore, the blow-molded product can be used in various intended usage as well as blow-molded containers.

The blow-molded product can be suitably used as a fuel container.

In a case where the content of each component is shown by "ppm", The "ppm" as referred to herein means a mass proportion of the content of each component, and 1 ppm indicates 0.0001% by mass.

Effects of the Invention

The ethylene-vinyl alcohol copolymer and the resin composition of the aspects of the present invention result in superior long-run stability in melt molding, and enable generation of film forming defects such as streaks and flaws in formed film, and coloring to be inhibited. Thus, the ethylene-vinyl alcohol copolymer and the resin composition can provide molded articles of a multilayer structure, etc., that are superior in appearance characteristics.

BRIEF DESCRIPTION OF THE DRAWINGS

FIG. 6 shows a schematic view for illustrating the production method of the cup-shaped container shown in FIG. 2.

DESCRIPTION OF EMBODIMENTS

Figure 1:
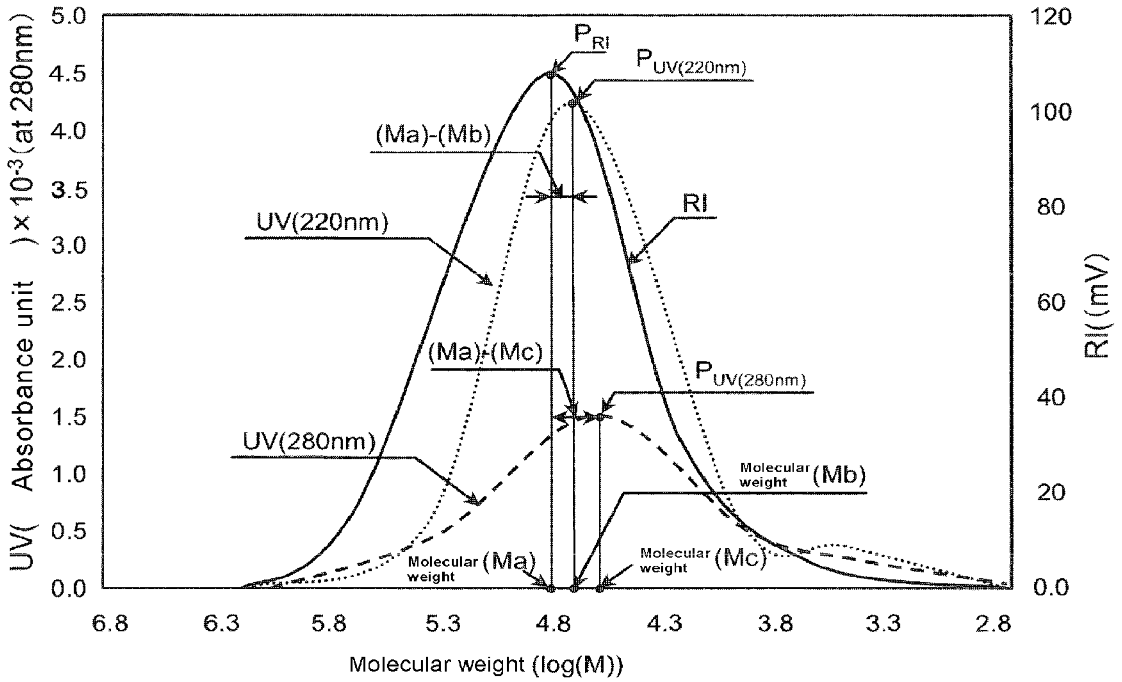
FIG. 1 shows a graph schematically illustrating a relationship between the molecular weight (logarithmic value) of EVOH with the signal value (RI) measured with a differential refractive index detector, and the absorbance (UV) measured with an absorbance detector (measurement wavelength: 220 nm and 280 nm)

The present invention is directed to an ethylene-vinyl alcohol copolymer, a resin composition, film, a vapor-deposited film, a multilayer structure, a thermoformed container, a blow-molded product, and a fuel container. Hereinafter, embodiments of the present invention will be described. However, the present invention is by no means limited to the following embodiments. In addition, with respect to materials exemplified in the following, one type of the materials may be used alone, or two or more types thereof may be used in combination, unless otherwise specified particularly.

Ethylene-Vinyl Alcohol Copolymer

The ethylene-vinyl alcohol copolymer (A) (hereinafter, may be also referred to as "EVOH (A)") of an embodiment of the present invention is obtained by saponifying a copolymer of ethylene and a vinyl ester.

Although a copolymerization process of ethylene with the vinyl ester is not particularly limited, a well-known process such as e.g., any of solution polymerization, suspension polymerization, emulsion polymerization, bulk polymerization and the like may be employed. In addition, the copolymerization process may be any of a continuous system and a batch-type system.

The lower limit of the ethylene content of the EVOH (A) is preferably 10 mol %, more preferably 20 mol %, and still more preferably 25 mol %. On the other hand, the upper limit of the ethylene content of the EVOH (A) is preferably 60 mol %, more preferably 55 mol %, still more preferably 50 mol %, and particularly preferably 40 mol %. When the ethylene content is less than the lower limit, thermal stability in the melt extrusion may be deteriorated, leading to ease of gelation, and consequently film forming defects such as streaks and fish eyes are likely to be generated. In particular, when an operation is made over a long time period under conditions involving a higher temperature or a higher speed than those for general melt extrusion, the gelation is highly likely to occur. On the other hand, when the ethylene content is greater than the upper limit, the gas barrier properties, and the like may be deteriorated, and the advantageous characteristics of the EVOH may not be sufficiently exhibited.

In light of industrial availability and the like, vinyl acetate is suitably used as the vinyl ester. In general, vinyl acetate contains a small amount of acetaldehyde as an inevitable impurity. The content of acetaldehyde in vinyl acetate is preferably less than 100 ppm. The upper limit of the content of acetaldehyde in vinyl acetate is more preferably 60 ppm, still more preferably 25 ppm, and particularly preferably 15 ppm. When the content of acetaldehyde in vinyl acetate falls within the above range, EVOH (A) having a feature to satisfy the inequality (1) as described later may be more readily prepared.

The EVOH (A) may include other structural unit derived from a monomer other than ethylene and vinyl ester. The monomer that gives such other structural unit is exemplified by a vinylsilane compound, other polymerizable compound, and the like. The content of the other structural unit is preferably 0.0002 mol % or greater and 0.2 mol % or less with respect to the total structural units of EVOH (A).

Degree of Saponification

The lower limit of the degree of saponification of the structural unit derived from the vinyl ester in the EVOH (A) is typically 85 mol %, preferably 90 mol %, more preferably 98 mol %, and still more preferably 98.9 mol %. When the degree of saponification is less than the lower limit, insufficient thermal stability may be caused.

Peak Top Molecular Weight (Ma)

A peak top molecular weight (Ma) is determined by subjecting EVOH (A) to a heat treatment in a nitrogen atmosphere at 220° C. for 50 hrs, thereafter separating the same on gel permeation chromatography (hereinafter, may be also referred to as "GPC"), and while separating, detecting the signal of EVOH (A) eluted from the column by using a differential refractive index detector as schematically shown in FIG. 1. The peak top molecular weight (Ma) is a value corresponding to a maximum value of a main peak of the signal ("RI" in FIG. 1). The peak top molecular weight (Ma) in the present invention is a value in terms of polymethyl methacrylate equivalent (hereinafter, may be also referred to as "PMMA equivalent") as determined by using a calibration curve produced according to a process described later.

The lower limit of the peak top molecular weight (Ma) is preferably 30,000, more preferably 35,000, still more preferably 40,000, and particularly preferably 50,000. On the other hand, the upper limit of the peak top molecular weight (Ma) is preferably 100,000, more preferably 80,000, still more preferably 65,000, and particularly preferably 60,000.

Absorption Peak Molecular Weights (Mb) and (Mc)

Absorption peak molecular weights (Mb) and (Mc) are determined by separating EVOH (A) on GPC under the same conditions as those of the determination of the peak top molecular weight (Ma), while detecting the signal by using ultraviolet and visible absorbance detectors at specific wavelengths, as schematically shown in FIG. 1. The absorption peak molecular weights (Mb) and (Mc) are each a value corresponding to a maximum value of the absorption peak of the signal ("UV" in FIG. 1). The absorption peak molecular weights (Mb) and (Mc) are molecular weights in terms of polymethyl methacrylate equivalent. It is to be noted that the molecular weight for the absorption peak at the wavelength of 220 nm is denoted as "Mb", and the molecular weight for the absorption peak at the wavelength of 280 nm is denoted as "Mc".

The lower limit of the absorption peak molecular weight (Mb) is preferably 30,000, more preferably 35,000, still more preferably 40,000, and particularly preferably 50,000. On the other hand, the upper limit of the absorption peak molecular weight (Mb) is preferably 75,000, more preferably 60,000, and still more preferably 55,000.

The lower limit of the absorption peak molecular weight (Mc) is preferably 35,000, more preferably 40,000, still more preferably 45,000, and particularly preferably 48,000. On the other hand, the upper limit of the absorption peak molecular weight (Mc) is preferably 75,000, more preferably 55,000, and still more preferably 50,000.

Production of Calibration Curve

The calibration curve is produced by measuring as an authentic sample, for example, mono-dispersed PMMA (peak top molecular weights: 1,944,000; 790,000; 467,400; 271,400; 144,000; 79,250; 35,300; 13,300; 7,100; 1,960; 1,020; and 690) available from Agilent Technologies, each with an differential refractive index detector and an absorbance detector. For the production of the calibration curve, an analysis soft is preferably used. It is to be noted that in the measurement of PMMA herein, for example, a column enabling separation of the standard sample peaks of both molecular weights of 1,944,000 and 271,400 is used.

Molecular Weight Correlation of EVOH (A)

According to EVOH (A), the following inequality (1) is satisfied.

$$(Ma-Mb)/Ma<0.45 \tag{1}$$

The value represented by (Ma-Mb)/Ma, i.e., the left part of the inequality (1) is preferably less than 0.40, more preferably less than 0.30, and still more preferably less than 0.10. In this regard, a smaller difference (Ma-Mb) between Ma and Mb indicates that in FIG. 1, the main peak ($P_{RI}$) obtained by the differential refractive index detector is close to the absorption peak ($P_{UV}$ (220 nm)) obtained by the ultraviolet and visible absorbance detector. To the contrary, a greater difference (Ma-Mb) between the molecular weights Ma and Mb indicates that the two peaks ($P_{RI}$, $P_{UV}$ (220 nm)) are away from one another. In other words, a greater value of the difference (Ma-Mb) between the molecular weights for two peaks ($P_{RI}$, $P_{UV}$ (220 nm)) indicates that many of components that absorb the ultraviolet ray having a wavelength of 220 nm are components having a comparatively low molecular weight. Thus, a failure to satisfy the above inequality (1) according to the EVOH (A) indicates that many of components that absorb the ultraviolet ray having a wavelength of 220 nm are components having a comparatively low molecular weight. Moreover, in this case, when melt molding is carried out by using the resin composition containing EVOH (A), thermal deterioration of the EVOH (A) occurs, leading to a failure to attain stable processing moldability for a long period of time resulting from coloring and/or an increase in viscosity through gelation, whereby defective molding tends to be prominent under molding conditions at high temperatures.

The effects achieved by the feature of satisfying the inequality (1) are considered to be brought for the following reasons. Occurrence of thermal deterioration such as dewatering of EVOH results in generation of carbonyl groups and/or carbon-carbon double bonds that absorb an ultraviolet ray having a wavelength of 220 nm in the molecules, and such groups accelerate gelation of the resin composition. The accelerating action of gelation depends on the molecular weight of thermally deteriorated EVOH, i.e., when the molecular weight of the thermally deteriorated EVOH is greater, the accelerating action is weaker, whereas the smaller molecular weight results in enhanced accelerating action. Therefore, in the case where the inequality (1) is satisfied, in other words, in the case where comparatively higher molecular weight can be maintained even if thermal deterioration occurs, the EVOH is expected to enable inhibition of defective molding.

According to the EVOH (A), it is preferred that the following inequality (2) is satisfied.

$$(Ma-Mc)/Ma<0.45 \quad (2)$$

The value represented by (Ma−Mc)/Ma, i.e., the left part of the inequality (2) is more preferably less than 0.40, still more preferably less than 0.30, and particularly preferably less than 0.15. In this regard, a greater value of (Ma−Mc)/Ma, i.e., the left part of the inequality (2) indicates the main peak ($P_{RI}$) obtained by the differential refractive index detector is away from the absorption peak ($P_{UV}$ (280 nm)) obtained by the ultraviolet and visible absorbance detector. Thus, components that absorb the ultraviolet ray having a wavelength of 280 nm increase in the components having a comparatively low molecular weight. In this case, thermal deterioration of the EVOH occurs during melt molding, which may lead to a failure to attain stable processing moldability for a long period of time resulting from coloring and/or an increase in viscosity through gelation, whereby defective molding tends to be prominent under molding conditions at high temperatures.

The effects achieved by the feature of satisfying the inequality (2) are considered to be brought for the following reasons. After generation of carbon-carbon double bonds and/or carbonyl groups within the molecules of EVOH through the thermal deterioration, a conjugated double bond that absorbs an ultraviolet ray having a wavelength of 280 nm is generated in the molecule through further proceeding thermal deterioration, and the conjugated double bond leads to accelerated yellowing of the resin composition. Similarly to the accelerating action of gelation described above, the accelerating action of yellowing depends on the molecular weight of thermally deteriorated EVOH, i.e., when the molecular weight of the thermally deteriorated EVOH is greater, the accelerating action is weaker, whereas the smaller molecular weight results in enhanced accelerating action. Therefore, in the case where the inequality (2) is satisfied, in other words, in the case where comparatively higher molecular weight can be maintained even if thermal deterioration proceeds, the EVOH is expected to enable further inhibition of defective molding.

Preparation Method of EVOH (A) Such that Inequality (1) is Satisfied

A preparation method of EVOH (A) such that the inequality (1) is satisfied is exemplified by the followings in conventional EVOH preparation:

(A) a process in which a radical polymerization inhibitor included in a vinyl ester is removed beforehand, in preparation of a copolymer of ethylene and the vinyl ester being a raw material;

(B) a process of adjusting to give a specific amount of the impurity included in a vinyl ester used in radical polymerization, in preparation of a copolymer of ethylene and the vinyl ester being a raw material;

(C) a process of adjusting the polymerization temperature to fall within a specific range in preparation of a copolymer of ethylene and a vinyl ester being a raw material;

(D) a process of adding an organic acid in the polymerization step, or the step of recovering and recycling unreacted vinyl ester after the polymerization step in preparation of a copolymer of ethylene and a vinyl ester being a raw material;

(E) a process of adjusting to give a specific amount of the impurity in a solvent used in the polymerization in preparation of a copolymer of ethylene and a vinyl ester being a raw material;

(F) a process of increasing a mass ratio of the solvent to the vinyl ester (solvent/vinyl ester) used in the polymerization, in preparation of a copolymer of ethylene and a vinyl ester being a raw material;

(G) a process of using an azonitrile initiator or an organic peroxide initiator as a radical polymerization initiator used in radical polymerization of ethylene and a vinyl ester monomer, (H) a process of adjusting the amount of addition of a radical polymerization inhibitor to give a specific amount with respect to remaining undegraded radical polymerization initiator in the case where the radical polymerization inhibitor is added after the radical polymerization, in preparation of a copolymer of ethylene and a vinyl ester being a raw material;

(I) a process of using for the saponification reaction, an alcohol solution of a copolymer of ethylene and a vinyl ester in which the remaining vinyl ester is removed to the minimum, (J) a process of adding an antioxidant to the copolymer of ethylene and the vinyl ester used in the saponification; and the like.

The processes (A) to (J) may be combined ad libitum. Also, EVOH (A) may be prepared such that the inequality (2) is satisfied by the processes (A) to (J). The processes (A) to (J) are described in more detail below.

(A) Process in which Radical Polymerization Inhibitor Included in the Vinyl Ester is Removed Beforehand, in Preparation of Copolymer of Ethylene and Vinyl Ester being Raw Material The radical polymerization inhibitor is exemplified by similar ones to those exemplified as the radical polymerization inhibitor added after the radical polymerization in the process (H) described later (H). In addition, a procedure of removing the radical polymerization inhibitor is exemplified by a column chromatography technique, a reprecipitation technique, a distillation technique and the like, and the distillation technique is usually employed. In the case where the radical polymerization inhibitor is removed by the distillation technique, since the boiling point of the vinyl ester is lower than the boiling point of the radical polymerization inhibitor, the vinyl ester from which the polymerization inhibitor has been removed can be obtained from the top of the distillation tower.

(B) Process of Adjusting to Give a Specific Amount of Impurity Included in Vinyl Ester Used in Radical Polymerization, in Preparation of Copolymer of Ethylene and Vinyl Ester being Raw Material The lower limit of the total content of impurities included in the vinyl ester used in the radical polymerization is preferably 1 ppm, more preferably 3 ppm, and still more preferably 5 ppm. In addition, the upper limit of the content of the impurity is preferably 1,200 ppm, more preferably 1,100 ppm, and still more preferably 1,000 ppm.

Examples of the impurity include aldehydes such as acetaldehyde, crotonaldehyde and acrolein; acetals obtained by acetalization of the aldehyde with an alcohol being a solvent, such as acetaldehyde dimethylacetal, crotonaldehyde dimethylacetal and acrolein dimethylacetal; ketones such as acetone; esters such as methyl acetate and ethyl acetate; and the like.

It is to be noted that among the impurities, acetaldehyde is likely to be generated during the production, etc., of vinyl acetate, and is likely to prevent the EVOH (A) to be produced such that the inequality (1) is satisfied. Thus, in this process, it is preferred that the content of acetaldehyde is particularly reduced.

(C) Process of Adjusting Polymerization Temperature to Fall within Specific Range, in Preparation of Copolymer of Ethylene and Vinyl Ester being Raw Material The lower limit of the polymerization temperature of the copolymer of ethylene and the vinyl ester is preferably 20° C., and more preferably 40° C. On the other hand, the upper limit of the polymerization temperature is preferably 90° C., and more preferably 70° C.

(D) Process of Using Alcohol Solvent, and Adding Organic Acid in Polymerization Step, or Step of Recovering and Recycling Unreacted Vinyl Ester after Polymerization Step, in Preparation of Copolymer of Ethylene and Vinyl Ester being Raw Material In this process, by adding the organic acid to the polymerization system, alcoholysis resulting from the alcohol of the vinyl ester as well as hydrolysis resulting from a slight amount of moisture can be inhibited, whereby production of aldehydes such as acetaldehyde can be inhibited. Examples of the organic acid include: hydroxycarboxylic acids such as glycolic acid, glyceric acid, malic acid, citric acid, lactic acid, tartaric acid and salicylic acid; polyhydric carboxylic acids such as malonic acid, succinic acid, maleic acid, phthalic acid, oxalic acid and glutaric acid; and the like.

The lower limit of the amount of the organic acid added is preferably 1 ppm, more preferably 3 ppm, and still more preferably 5 ppm. The upper limit of the amount of the organic acid added is preferably 500 ppm, more preferably 300 ppm, and still more preferably 100 ppm.

(E) Process of Adjusting to Give Specific Amount of Impurity in Solvent Used in the Polymerization, in Preparation of Copolymer of Ethylene and Vinyl Ester being Raw Material The lower limit of the total content of the impurities in the solvent used in the polymerization is preferably 1 ppm, more preferably 3 ppm, and still more preferably 5 ppm. The upper limit of the total content of the impurities is preferably 1,200 ppm, more preferably 1,100 ppm, and still more preferably 1,000 ppm. The impurity in the solvent used in the polymerization may include, for example, those exemplified as the impurity which may be included in the vinyl ester described above, described above.

(F) Process of Increasing Mass Ratio of Solvent to Vinyl Ester (Solvent/Vinyl Ester) Used in Polymerization, in Preparation of Copolymer of Ethylene and Vinyl Ester being Raw Material The lower limit of the mass ratio (solvent/vinyl ester) of the solvent to the vinyl ester used in the polymerization is preferably 0.03. On the other hand, the upper limit of the mass ratio (solvent/vinyl ester) is, for example, 0.4.

(G) Process of Using Azonitrile Initiator or Organic Peroxide Initiator as Radical Polymerization Initiator Used in Radical Polymerization of Ethylene and Vinyl Ester Monomer Examples of the azonitrile initiator include 2,2-azobisisobutyronitrile, 2,2-azobis-(2,4-dimethyl valeronitrile), 2,2-azobis-(4-methoxy-2,4-dimethyl valeronitrile), 2,2-azobis-(2-cyclopropyl propionitrile), and the like. Examples of the organic peroxide include acetyl peroxide, isobutyl peroxide, diisopropyl peroxycarbonate, diallyl peroxydicarbonate, di-n-propyl peroxydicarbonate, dimyristyl peroxydicarbonate, di(2-ethoxyethyl) peroxydicarbonate, di(2-ethylhexyl) peroxydicarbonate, di(methoxyisopropyl) peroxydicarbonate, di(4-tert-butylcyclohexyl) peroxydicarbonate, and the like.

(H) Process of Adjusting Amount of Addition of Radical Polymerization Inhibitor to Give Specific Amount with Respect to Remaining Undegraded Radical Polymerization Initiator in Case where Radical Polymerization Inhibitor is Added after Radical Polymerization, in Preparation of Copolymer of Ethylene and Vinyl Ester being Raw Material In the case where a radical polymerization inhibitor is added after the radical polymerization, the amount of the radical polymerization inhibitor added with respect to the remaining undegraded radical polymerization initiator is preferably 5 molar equivalent or less. The radical polymerization inhibitor is exemplified by compounds having a conjugated double bond and having a molecular weight of 1,000 or less, which stabilize a radical to inhibit the polymerization reaction, and the like. Specific examples of the radical polymerization inhibitor include polyenes, for example: conjugated dienes that include a conjugated structure having two carbon-carbon double bonds such as isoprene, 2,3-dimethyl-1,3-butadiene, 2,3-diethyl-1,3-butadiene, 2-t-butyl-1,3-butadiene, 1,3-pentadiene, 2,3-dimethyl-1,3-pentadiene, 2,4-dimethyl-1,3-pentadiene, 3,4-dimethyl-1,3-pentadiene, 3-ethyl-1,3-pentadiene, 2-methyl-1,3-pentadiene, 3-methyl-1,3-pentadiene, 4-methyl-1,3-pentadiene, 1,3-hexadiene, 2,4-hexadiene, 2,5-dimethyl-2,4-hexadiene, 1,3-octadiene, 1,3-cyclopentadiene, 1,3-cyclohexadiene, 1-methoxy-1,3-butadiene, 2-methoxy-1,3-butadiene, 1-ethoxy-1,3-butadiene, 2-ethoxy-1,3-butadiene, 2-nitro-1,3-butadiene, chloroprene, 1-chloro-1,3-butadiene, 1-bromo-1,3-butadiene, 2-bromo-1,3-butadiene, fulvene, tropone, ocimene, phellandrene, myrcene, farnesene, cembrene, sorbic acid, sorbic acid ester, sorbic acid salt and abietic acid; conjugated trienes that include a conjugated structure having three carbon-carbon double bonds such as 1,3,5-hexatriene, 2,4,6-octatriene-1-carboxylic acid, eleostearic acid, tung oil and cholecalciferol; conjugated polyenes that include a conjugated structure having four or more carbon-carbon double bonds such as cyclooctatetraene, 2,4,6,8-decatetraene-1-carboxylic acid, retinol and retinoic acid. It is to be noted that in the case of the radical polymerization inhibitor having a plurality of stereoisomers such as 1,3-pentadiene, myrcene and farnesene, any of them may be used. Examples of the radical polymerization inhibitor also include aromatic compounds such as p-benzoquinone, hydroquinone, hydroquinone monomethyl ether, 2-phenyl-1-propene, 2-phenyl-1-butene, 2,4-diphenyl-4-methyl-1-pentene, 3,5-diphenyl-5-methyl-2-heptene, 2,4,6-triphenyl-4,6-dimethyl-1-heptene, 3,5,7-triphenyl-5-ethyl-7-methyl-2-nonene, 1,3-diphenyl-1-butene, 2,4-diphenyl-4-methyl-2-pentene, 3,5-diphenyl-5-methyl-3-heptene, 1,3,5-triphenyl-1-hexene, 2,4,6-triphenyl-4,6-dimethyl-2-heptene, 3,5,7-triphenyl-5-ethyl-7-methyl-3-nonene, 1-phenyl-1,3-butadiene and 1,4-diphenyl-1,3-butadiene.

(I) Process of Using for Saponification Reaction, Alcohol Solution of Copolymer of Ethylene and Vinyl Ester in which Remaining Vinyl Ester is Removed to the Minimum The lower limit of the percentage of removal of the residual monomer is preferably 99 mol %, more preferably 99.5 mol %, and still more preferably 99.8 mol %. A procedure of removing the residual monomer is exemplified by a column chromatography technique, a reprecipitation technique, a distillation technique and the like, and the distillation technique is preferred. In the case where the residual monomer is removed by the distillation technique, a solution of the copolymer of ethylene and the vinyl ester is continuously fed at a constant rate from the top of the distillation tower packed with Raschig ring, and the vapor of the organic solvent such as methanol is blown therein from the bottom of the distillation tower. Accordingly, a vapor mixture of the organic solvent and the unreacted vinyl ester can be distilled away from the top of the distillation tower, and the solution of the copolymer of ethylene and the vinyl ester from which unreacted vinyl ester has been removed can be taken out from the bottom of the distillation tower. The term "percentage of removal of the residual monomer" as referred to herein means a value obtained by measuring monomer contents in an alcohol solution of a copolymer of ethylene and a vinyl ester before and after a removing treatment, and is calculated by the following formula:

$$\text{percentage of removal of residual monomer (mol \%)}=\{1-(\text{residual monomer content after removal}/\text{residual monomer content before removal})\}\times 100$$

(J) Process of Adding Antioxidant to Copolymer of Ethylene and Vinyl Ester Used in Saponification The antioxidant is not particularly limited, and is exemplified by a phenol antioxidant, a phosphorus antioxidant, a sulfur antioxidant, and the like. Of these, the antioxidant is preferably a phenol antioxidant, and more preferably an alkyl-substituted phenol antioxidant.

Examples of the phenol antioxidant include: acrylate compounds such as 2-t-butyl-6-(3-t-butyl-2-hydroxy-5-methylbenzyl)-4-methylphenyl acrylate and 2,4-di-t-amyl-6-(1-(3,5-di-t-amyl-2-hydroxyphenyl)ethyl)phenyl acrylate; alkyl-substituted phenol compounds such as 2,6-di-t-butyl-4-methylphenol, 2,6-di-t-butyl-4-ethylphenol, octadecyl-3-(3,5-)di-t-butyl-4-hydroxyphenyl)propionate, 2,2'-m ethylene-bis(4-methyl-6-t-butylphenol), 4,4'-butylidene-bis(4-methyl-6-t-butylphenol), 4,4'-butylidene-bis(6-t-butyl-m-cresol), 4,4'-thiobis(3-methyl-6-t-butylphenol), bis(3-cyclohexyl-2-hydroxy-5-methylphenyl)methane, 3,9-bis(2-(3-(3-t-butyl-4-hydroxy-5-methylphenyl)propionyloxy)-1,1-dimethyl ethyl)-2,4,8,10-tetraoxaspiro[5.5]undecane, 1,1,3-tris(2-methyl-4-hydroxy-5-t-butylphenyl)butane, 1,3,5-trimethyl-2,4,6-tris(3,5-di-t-butyl-4-hydroxybenzyl) benzene, tetrakis(methylene-3-(3',5'-di-t-butyl-4'-hydroxyphenyl)propionate)methane and triethylene glycolbis(3-(3-t-butyl-4-hydroxy-5-methylphenyl)propionate); triazine group-containing phenol compounds such as 6-(4-hydroxy-3,5-di-t-butylanilino)-2,4-bis-octylthio-1,3,5-triazine, 6-(4-hydroxy-3,5-dimethyl anilino)-2,4-bis-octylthio-1,3,5-triazine, 6-(4-hydroxy-3-methyl-5-t-butylanilino)-2,4-bis-octylthio-1,3,5-triazine and 2-octylthio-4,6-bis-(3,5-di-t-butyl-4-oxyanilino)-1,3,5-triazine; and the like.

Examples of the phosphorus antioxidant include: monophosphite compounds such as triphenylphosphite, diphenylisodecylphosphite, phenyldiisodecylphosphite, tris(nonylphenyl)phosphite, tris(dinonylphenyl)phosphite, tris(2-t-butyl-4-methylphenyl)phosphite, tris(cyclohexylphenyl) phosphite, 2,2-methylenebis(4,6-di-t-butylphenyl) octylphosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide and 10-decyloxy-9,10-dihydro-9-oxa-10-phosphaphenanthrene; diphosphite compounds such as 4,4'-butylidene-bis(3-methyl-6-t-butylphenyl-ditridecylphosphite), 4,4'-isopropylidene-bis(phenyl-dialkyl($C_{12-15}$)phosphite), 4,4'-isopropylidene-bis(diphenylmonoalkyl($C_{12-15}$)phosphite), 1,1,3-tris(2-methyl-4-ditridecylphosphite-5-t-butylphenyl)butane and tetrakis(2,4-di-t-butylphenyl)-4,4'-biphenylene phosphite; and the like. Of these, the phosphorus antioxidant is preferably a monophosphite compound.

Examples of the sulfur antioxidant include dilauryl 3,3'-thiodipropionate, distearyl 3,3'-thiodipropionate, lauryl-stearyl 3,3'-thiodipropionate, pentaerythritol-tetrakis-(β-lauryl-thiopropionate), 3,9-bis(2-dodecylthioethyl)-2,4,8,10-tetraoxaspiro[5.5]undecane, and the like.

In the case where the antioxidant is added to the copolymer of ethylene and the vinyl ester, the lower limit of the content of the antioxidant is not particularly limited, and is preferably 0.001 parts by mass and more preferably 0.01 parts by mass, with respect to 100 parts by mass of the copolymer. On the other hand, the upper limit of the content of the antioxidant is not particularly limited, and preferably 5 parts by mass and more preferably 1 part by mass, with respect to 100 parts by mass of the copolymer. When the content of the antioxidant is less than the lower limit, preparation of the EVOH (A) having a feature to satisfy the inequality (1) may be difficult. To the contrary, when content of the antioxidant is greater than the upper limit, effects appropriately corresponding to an increase in cost, etc., resulting from the increase in the content may not be achieved.

In the case where the EVOH (A) is prepared through the processes (A), (C) to (J), the content of acetaldehyde included in the vinyl ester (vinyl acetate) may not fall within the above range. In this case, the lower limit of the content of acetaldehyde is preferably 150 ppm, more preferably 250 ppm, and still more preferably 350 ppm. Thus, it becomes possible to omit the step of removing acetaldehyde from vinyl acetate by virtue of the content of acetaldehyde falling within the above range, the manufacturing cost can be reduced. It is to be noted that the upper limit of the content of acetaldehyde in this case is not particularly limited, but may be, for example, 1,000 ppm.

Melt Viscosity (Melt Flow Rate) of EVOH (A)

The lower limit of the melt flow rate of the EVOH (A) is preferably 0.5 g/10 min, more preferably 1.0 g/10 min, and still more preferably 1.4 g/10 min. On the other hand, the upper limit of the melt flow rate of the EVOH (A) is preferably 30 g/10 min, more preferably 25 g/10 min, still more preferably 20 g/10 min, particularly preferably 15 g/10 min, more particularly preferably 10 g/10 min, and most particularly preferably 1.6 g/10 min. When the melt flow rate of the EVOH (A) is less than the above lower limit, or greater than the upper limit, moldability and appearance characteristics may be deteriorated. It is to be noted that the melt flow rate is a value measured in accordance with JIS-K7210 (1999), at a temperature of 190° C. with a load of 2,160 g.

Resin Composition

The resin composition of the embodiment of the present invention contains the EVOH (A). It is preferred that the resin composition contains an alkali metal salt (B1) of an organic acid in addition to the EVOH (A). Moreover, it is preferred that the resin composition further contains a multivalent metal salt (B2), inorganic particles (C), a polyolefin (D), a polyamide (E), an EVOH (F) or a combination thereof. Furthermore, the resin composition may also contain other optional component.

The lower limit of the resin content in the resin composition is preferably 70% by mass, more preferably 90% by mass, and still more preferably 95% by mass. The "resin content" as referred to herein means the content of the total resin components including all the EVOH (A), the polyolefin (D), the polyamide (E) and the EVOH (F), as well as other resin.

(B1) Alkali Metal Salt of Organic Acid

When the resin composition contains the alkali metal salt (B1) of an organic acid, coloring can be inhibited, and as a result, the appearance characteristics can be more improved. In addition, long-run stability and the interlayer adhesive force when formed into a multilayer structure can be improved.

An alkali metal constituting the alkali metal salt (B1) may be either of a single metal species, or of a plurality of metal species. Examples of the alkali metal include lithium, sodium, potassium, rubidium, cesium and the like, and in light of industrial availability, sodium and potassium are more preferred.

Examples of the organic acid include: aliphatic carboxylic acids such as formic acid, acetic acid, propionic acid, butyric acid, valeric acid, caproic acid, heptanoic acid, octanoic acid, nonanoic acid, decanoic acid, undecane acid, palmitic acid, stearic acid, succinic acid, linoleic acid and oleic acid; aromatic carboxylic acids such as benzoic acid, salicylic acid and phthalic acid; hydroxycarboxylic acids such as lactic acid, tartaric acid, citric acid and malic acid; carboxylic acids such as ethylenediaminetetraacetic acid; sulfonic acids such as p-toluenesulfonic acid; and the like. Of these, the organic acid is preferably the carboxylic acid, more preferably the aliphatic carboxylic acid, and still more preferably acetic acid.

The alkali metal salt (B1) is exemplified by an aliphatic carboxylic acid salt, an aromatic carboxylic acid salt and the like of lithium, sodium, potassium or the like. Specific examples of the alkali metal salt (B1) include sodium acetate, potassium acetate, sodium stearate, potassium stearate, a sodium salt of ethylenediaminetetraacetic acid, and the like. Of these, the alkali metal salt (B1) is preferably sodium acetate and potassium acetate.

In the case where the resin composition contains the alkali metal salt (B1), the lower limit of the content of the alkali metal salt (B1) (content in dry resin composition) in terms of metal equivalent is preferably 1 ppm, more preferably 5 ppm, still more preferably 10 ppm, and particularly preferably 80 ppm. On the other hand, the upper limit of the content of the alkali metal salt (B1) in terms of metal equivalent is preferably 1,000 ppm, more preferably 800 ppm, still more preferably 550 ppm, particularly preferably 250 ppm, and further particularly preferably 150 ppm. When the content of the alkali metal salt (B1) is less than the lower limit, the interlayer adhesiveness may be lowered. When the content of the alkali metal salt (B1) is greater than the upper limit, inhibition of coloring of the resin composition may be difficult, whereby deterioration of the appearance characteristics may be caused.

(B2) Multivalent Metal Salt of Organic Acid

In the case where the resin composition contains the multivalent metal salt (B2) in a specific amount, generation of gels and seeds during a long-run operation can be inhibited, and as a result, the inhibitory ability of generation of burnt deposits during a long-run operation can be improved. In particular, in the case where the resin composition contains the polyamide (E) as described later, by virtue of containing the multivalent metal salt (B2), particularly preferably containing a carboxylic acid salt, generation of gels and seeds during a long-run operation can be more effectively inhibited, and consequently, the inhibitory ability of generation of burnt deposits during a long-run operation and the retort resistance can be more improved.

The metal element constituting the multivalent metal salt (B2) is not particularly limited, but in light of effects of inhibiting generation of gels and seeds during a long-run operation, a metal element that forms a divalent metal salt, such as magnesium, calcium, barium, beryllium, zinc, copper or the like is preferred, and of these, magnesium, calcium and zinc are more preferred.

The anion constituting the multivalent metal salt (B2) is exemplified by anions of the organic acid exemplified above as the organic acid of the alkali metal salt (B1), and the like. Of these, the anion is preferably a carboxylic acid anion, and particularly preferably an acetate anion.

In the case where the resin composition contains the multivalent metal salt (B2), the lower limit of the content of the multivalent metal salt (B2) (content in dry resin composition) in terms of metal element equivalent is preferably 1 ppm, more preferably 3 ppm, still more preferably 5 ppm, particularly preferably 10 ppm, further particularly preferably 50 ppm, and most particularly preferably 100 ppm. The upper limit of the content of the multivalent metal salt (B2) in terms of metal element equivalent is preferably 500 ppm, more preferably 350 ppm, still more preferably 300 ppm, and particularly preferably 250 ppm. When the content is less than the lower limit, the effects of inhibiting gels and seeds in the resin composition during a long-run operation may be insufficient. To the contrary, when the content is greater than the upper limit, coloring of the resin composition may be marked, and a deterioration reaction resulting from a degradation reaction is accelerated, which may lead to a failure in obtaining EVOH having an adequate melt viscosity. As a result, appearance characteristics of the molded product obtained may be deteriorated, and thus it may be difficult to obtain a desired molded product.

In the case where the resin composition contains a resin other than EVOH, such as the polyolefin (D) and the polyamide (E), it is preferred that a fatty acid metal salt is contained as the alkali metal salt (B1) or the multivalent metal salt (B2). By virtue of the resin composition thus containing a fatty acid metal salt together with the resin other than EVOH, appearance characteristics and impact resistance can be more improved. The fatty acid metal salt is preferably a metal salt of a higher aliphatic acid having 10 to 26 carbon atoms such as lauric acid, stearic acid, myristic acid, behenic acid or montanic acid. In addition, the fatty acid metal salt may be also exemplified by metal salts with a metal in group 2 or 3 in periodic table, as well as zinc salts, and of these, the salt of the metal in group 2 in periodic table, such as the calcium salt and the magnesium salt is preferred.

In the case where the resin composition contains the fatty acid metal salt, the lower limit of the content of the fatty acid metal salt in terms of the amount of the salt with respect to the resin content is preferably 50 ppm, more preferably 100 ppm, still more preferably 150 ppm, particularly preferably 200 ppm, further particularly preferably 500 ppm, and most preferably 1,200 ppm. On the other hand, the upper limit of the content of the fatty acid metal salt in terms of the amount of the salt with respect to the resin content is preferably 10,000 ppm, more preferably 8,000 ppm, still more preferably 5,000 ppm, particularly preferably 4,000 ppm, and further particularly preferably 2,000 ppm. The content of the fatty acid metal salt in the resin composition as referred to herein means a proportion with respect to the resin content in the resin composition, i.e., a mass proportion of the salt with respect to the total mass of the resin component, and specifically, a proportion with respect to the resin content in the dried resin composition.

Inorganic Particles (C)

The inorganic particles (C) render the arithmetic average roughness (Ra) of the surface of the film formed from the resin composition adequate, and improves the blocking resistance and slipping property. The inorganic particles (C) as referred to mean particles containing an inorganic substance as a principal component. The principal component as referred to means a component of which content is the greatest, and for example, a component of which content is 50% by mass or greater.

The metal element constituting the inorganic particle (C) is preferably silicon, aluminum, magnesium, zirconium, cerium, tungsten, molybdenum or a combination thereof. Of these, the metal element is more preferably silicon, aluminum, magnesium or a combination thereof in light of favorable availability.

The inorganic substance as the principal component of the inorganic particle (C) may be an oxide, nitride, oxynitride or the like of the metal element as exemplified, and an oxide is preferred.

The lower limit of the mean particle size of the inorganic particles (C) is preferably 0.5 μm, more preferably 1.5 μm, and still more preferably 2.5 μm. On the other hand, the upper limit of the mean particle size of the inorganic particles (C) is preferably 10 μm, more preferably 8 μm, still more preferably 5 μm, and particularly preferably 3 μm. When the mean particle size of the inorganic particles (C) falls within the above range, the arithmetic average roughness (Ra) of the surface of the film formed from the resin composition becomes adequate, and thus the blocking resistance and slipping properties can be improved. As a result, the resin composition enables the film breakage resistance, inhibitory ability of vapor deposition flaw and adhesion strength of the vapor-deposition layer to be improved, and also the adhesion strength of the film can be more improved. The "mean particle size of the inorganic particles (C)" as referred to herein means a value obtained with particle size distribution (particle size and relative amount of particles) calculated from light strength distribution data of the diffraction/scattering light, as measured by using a laser diffraction particle size distribution analyzer, through a calculation from an integrated value obtained by multiplying the particle size and the relative amount of the particles, divided by a total of the relative amount of particles.

In the case where the resin composition contains the inorganic particles (C), the lower limit of the content of the inorganic particles (C) is preferably 50 ppm, more preferably 100 ppm, and still more preferably 150 ppm. On the other hand, the upper limit of the content of the inorganic particle (C) is preferably 5,000 ppm, more preferably 4,000 ppm, still more preferably 3,000 ppm, particularly preferably 1,000 ppm, and further particularly preferably 200 ppm. When the content of the inorganic particles (C) fall within the above range, the arithmetic average roughness (Ra) of the surface of the film formed from the resin composition becomes adequate, and thus the blocking resistance and slipping properties can be improved. As a result, the film breakage resistance and the inhibitory ability of vapor deposition flaw of the resin composition can be more improved, and further, the adhesion strength of the resultant film can be improved. It is to be noted that one particle of the inorganic particles (C) may be formed from either one type of an inorganic substance, or two or more types of inorganic substances.

Polyolefin (D)

Examples of the polyolefin (D) include: polyethylenes (low-density, linear low-density, medium-density, high-density and the like); ethylene-based copolymers obtained by copolymerizing ethylene with α-olefins such as 1-butene, 1-hexene or 4-methyl-1-pentene, or with an acrylic acid ester; polypropylenes; propylene-based copolymers obtained by copolymerizing propylene with α-olefins such as ethylene, 1-butene, 1-hexene or 4-methyl-1-pentene; acid-modified polyolefins obtained by reacting poly(1-butene), poly(4-methyl-1-pentene), the aforementioned polyethylenes, ethylene-based copolymers, polypropylenes, propylene-based copolymers, poly(l-butene) or poly(4-methyl-1-pentene) with maleic anhydride; ionomer resins; and the like. Of these, polypropylene-based resins such as polypropylenes and propylene-based copolymers, or polyethylene-based resins such as polyethylenes and ethylene-based copolymers are preferred as the polyolefin (D). In particular, in the case where the multilayer structure including a layer formed of the resin composition according to the embodiment of the present invention is used as a food packaging, a polyethylene-based resin is preferably used in light of superior secondary processability.

In the case where the resin composition contains the polyolefin (D), the lower limit of the mass ratio (A/D) of the EVOH (A) to the polyolefin (D) in the resin composition is preferably 0.1/99.9, more preferably 1/99, still more preferably 2/98, and particularly preferably 4/96. The upper limit of the mass ratio (A/D) is preferably 99.9/0.1, more preferably 99/1, still more preferably 50/50, particularly preferably 30/70, and further particularly preferably 10/90. In addition, the lower limit of the total content of the EVOH (A) and the polyolefin (D) in the resin content of the resin composition is preferably 50% by mass, more preferably 80% by mass, and still more preferably 90% by mass. In the resin composition, when the ratio of each resin component contained falls within the above range, the impact resistance can be more improved.

In the case where the resin composition contains the polyolefin (D), the lower limit of the content of the polyolefin (D) in the resin content of the resin composition is preferably 0.1% by mass, more preferably 0.5% by mass, still more preferably 25% by mass, particularly preferably 35% by mass, and further particularly preferably 45% by mass. On the other hand, the upper limit of the content of the polyolefin (D) is preferably 99.9% by mass, more preferably 99% by mass, still more preferably 98% by mass, and particularly preferably 96% by mass. When the content of the polyolefin (D) falls within the above range, the impact resistance of the resin composition can be more improved.

As described above, the polyolefin (D) is preferably an acid-modified polyolefin. When the resin composition contains the acid-modified polyolefin, aggregation of the EVOH (A) in a micro region in the resin composition can be inhibited, and consequently, the inhibitory ability of generation of defects in thermoforming, and the appearance characteristics and strength can be more improved. In the case where the resin composition contains the acid-modified polyolefin as the polyolefin (D), contained may be either the acid-modified polyolefin alone, or both the acid-modified polyolefin and an unmodified polyolefin.

The acid-modified polyolefin is exemplified by an olefin-derived polymer having an unsaturated carboxylic acid or derivatives thereof introduced thereinto through a chemical bond, and the like. The unsaturated carboxylic acid and a derivative thereof are exemplified by an ethylenic unsaturated carboxylic acid, an ester thereof and an anhydride of the same, and the like. Specifically, exemplified are an ethylenic unsaturated monocarboxylic acid and an ester thereof, an ethylenic unsaturated dicarboxylic acid and a mono or diester thereof, an ethylenic unsaturated dicarboxylic anhydride and the like, and of these, the ethylenic unsaturated dicarboxylic acid anhydride is preferred. Specific examples of the ethylenic unsaturated dicarboxylic acid include maleic acid, fumaric acid, itaconic acid, maleic anhydride, itaconic anhydride, maleic acid monomethyl ester, maleic acid monoethyl ester, maleic acid diethyl ester, fumaric acid monomethyl ester and the like, and of these, maleic anhydride is preferred.

The olefin-derived polymer as referred to herein means polyolefins such as polyethylene (low pressure, middle pressure, high pressure, etc.), linear low density polyethylene, polypropylene and polybutene, or copolymers (for example, ethylene-vinyl acetate copolymers, ethylene-ethyl acrylate copolymers, etc.) of olefin and other monomer (vinyl ester, unsaturated carboxylate ester, etc.). Of these, linear low density polyethylene, ethylene-vinyl acetate copolymers (content of vinyl acetate being 5% by mass or greater and 55% by mass or less) and ethylene-ethyl acrylate copolymers (content of ethyl acrylate being 8% by mass or greater and 35% by mass or less) are preferred, and linear low density polyethylene and ethylene-vinyl acetate copolymers are more preferred.

Specific examples of the acid-modified polyolefin include: maleic anhydride graft-modified polyolefins such as maleic anhydride graft-modified polyethylenes and maleic anhydride graft-modified polypropylenes; maleic anhydride graft-modified copolymers of an olefin with a vinyl monomer, such as maleic anhydride graft-modified ethylene-propylene (block or random) copolymers, maleic anhydride graft-modified ethylene-ethyl acrylate copolymers, and maleic anhydride graft-modified ethylene-vinyl acetate copolymers; and the like.

The lower limit of the amount of addition or grafting (degree of modification) to the olefin-derived polymer of the ethylenic unsaturated carboxylic acid or the anhydride thereof with respect to the olefin-derived polymer is preferably 0.0001% by mass, and more preferably 0.001% by mass. The upper limit of the amount of addition or grafting is preferably 15% by mass, and more preferably 10% by mass. A procedure for the addition reaction or graft reaction to the olefin-derived polymer of the ethylenic unsaturated carboxylic acid or the anhydride thereof may be carried out by, for example, a radical polymerization process or the like in the presence of a solvent (xylene, etc.) and a catalyst (peroxide, etc.). The lower limit of the melt flow rate measured at 210° C. of carboxylic acid-modified polyolefin obtained in this manner is preferably 0.2 g/10 min, and more preferably 0.5 g/10 min. On the other hand, the upper limit of the melt flow rate is preferably 30 g/10 min, and more preferably 10 g/10 min.

In the case where the resin composition contains the acid-modified polyolefin, the lower limit of the content of the acid-modified polyolefin in the resin content is preferably 1% by mass, more preferably 3% by mass, and still more preferably 5% by mass. The upper limit of the content of the acid-modified polyolefin is preferably 20% by mass, more preferably 15% by mass, and still more preferably 10% by mass.

Polyamide (E)

The polyamide (E) is a resin that includes an amide linkage. The polyamide (E) is obtained by: ring-opening polymerization of a lactam having a 3 or more-membered ring; polycondensation of polymerizable ω-amino acids; polycondensation of a dibasic acid and a diamine; and the like. Examples of the polyamide (E) include polycaproamide (nylon 6), poly-ω-aminoheptanoic acid (nylon 7), poly-ω-aminononanoic acid (nylon 9), polyundecanamide (nylon 11), polylauryllactam (nylon 12), polyethylenediamine adipamide (nylon 26), polytetramethylene adipamide (nylon 46), polyhexamethylene adipamide (nylon 66), polyhexamethylene sebacamide (nylon 610), polyhexamethylene dodecamide (nylon 612), polyoctamethylene adipamide (nylon 86), polydecamethylene adipamide (nylon 108), caprolactam/lauryllactam copolymers (nylon 6/12), caprolactam/ω-aminononanoic acid copolymers (nylon 6/9), caprolactam/hexamethylenediammonium adipate copolymers (nylon 6/66), lauryllactam/hexamethylenediammonium adipate copolymers (nylon 12/66), hexamethylenediammonium adipate/hexamethylenediammonium sebacate copolymers (nylon 66/610), ethylene diammonium adipate/hexamethylenediammonium adipate copolymers (nylon 26/66), caprolactam/hexamethylenediammonium adipate/hexamethylenediammonium sebacate copolymers (nylon 6/66/610), polyhexamethylene isophthalamide (nylon 6I), polyhexamethylene terephthalamide (nylon 6T), hexamethylene isophthalamide/terephthalamide copolymers (nylon 6I/6T), and the like.

Furthermore, as a diamine, an aliphatic diamine into which a substituent such as 2,2,4-trimethylhexamethylenediamine or 2,4,4-trimethyl hexamethylenediamine has been introduced; an aromatic amine such as methylbenzylamine or m-xylylenediamine, or the like may be used in the polyamide (E), and these may be used for modification of the polyamide. Furthermore, as the dicarboxylic acid, an aliphatic carboxylic acid into which a substituent such as 2,2,4-trimethyl adipic acid or 2,4,4-trimethyl adipic acid has been introduced; an alicyclic dicarboxylic acid such as 1,4-cyclohexanedicarboxylic acid; an aromatic dicarboxylic acid such as phthalic acid, a xylylenedicarboxylic acid, an alkyl-substituted terephthalic acid, an alkyl-substituted isophthalic acid or a naphthalenedicarboxylic acid, or the like may be used, and these may be used for modification of the polyamide.

Of these, polycaproamide (nylon 6) is preferred as the polyamide (E). Alternatively, a caprolactam/lauryllactam copolymer (nylon 6/12) is also preferred. In this case, the ratio of 6 unit to 12 unit contained is not particularly limited, and the lower limit of the content of the 12 unit is preferably 5% by mass. On the other hand, the upper limit of the content of the 12 unit is preferably 60% by mass, and more preferably 50% by mass.

The lower limit of the mass ratio (A/E) of EVOH (A) to the polyamide (E) in the resin composition is preferably 60/40, more preferably 65/35, still more preferably 70/30, and particularly preferably 75/25. In addition, the upper limit of the mass ratio (A/E) is preferably 95/5, more preferably 90/10, and still more preferably 85/15. When the mass ratio (A/E) is less than the lower limit, characteristics such as gas barrier properties and oil resistance of the EVOH (A) itself are likely to be deteriorated. To the contrary, when the mass ratio (A/E) is greater than the upper limit, the retort resistance of the resin composition may be deteriorated.

In the case where the resin composition contains the polyamide (E), the lower limit of the total content of the EVOH (A) and polyamide (E) in the resin content of the resin composition is preferably 80% by mass, more preferably 90% by mass, and still more preferably 95% by mass. In addition, the total content of the EVOH (A) and polyamide (E) in the resin content of the resin composition is particularly preferably 100% by mass.

In the case where the resin composition contains the polyamide (E), the lower limit of the content of the polyamide (E) in the resin content of the resin composition is preferably 4% by mass, more preferably 8% by mass, and still more preferably 12% by mass. On the other hand, the upper limit of the content of the polyamide (E) is preferably 40% by mass, more preferably 35% by mass, still more preferably 30% by mass, and particularly preferably 25% by mass. When the content of the polyamide (E) is less than the lower limit, retort resistance of the resin composition may be deteriorated. To the contrary, when the content of the polyamide (E) is greater than the upper limit, the content of the EVOH (A) is decreased, and thus characteristics such as gas barrier properties and oil resistance are likely to be deteriorated.

In the case where the resin composition contains the polyamide (E), the ethylene content of the EVOH (A) is typically 10 mol % or greater and 60 mol % or less.

EVOH (F)

The EVOH (F) is an ethylene-vinyl alcohol copolymer that is different from the EVOH (A) in terms of the ethylene content. The EVOH (F) is, similarly to the EVOH (A), obtained by saponifying a copolymer of ethylene and a vinyl ester. In the case where the resin composition contains the EVOH (F), the ethylene content of the EVOH (A) is typically 10 mol % or greater and 50 mol % or less.

The lower limit of the ethylene content of the EVOH (F) is typically 30 mol %, preferably 34 mol %, and more preferably 38 mol %. On the other hand, the upper limit of the ethylene content of the EVOH (F) is typically 60 mol %, preferably 55 mol %, and more preferably 52 mol %. When the ethylene content of the EVOH (F) is less than the lower limit, satisfactory advantageous effects the flexibility, secondary processability, heat stretching properties of the resin composition may not be attained. On the other hand, when the ethylene content of the EVOH (F) is greater than the upper limit, the gas barrier properties of the resin composition may be deteriorated.

The lower limit of the degree of saponification of the structural unit derived from the vinyl ester in the EVOH (F) is preferably 85 mol %, more preferably 90 mol %, still more preferably 98 mol %, and particularly preferably 98.9 mol %. In addition, the upper limit of the degree of saponification is preferably 99.99 mol %, more preferably 99.98 mol %, and still more preferably 99.95 mol %. When the degree of saponification of the EVOH (F) falls within the above range, heat stretching properties of the resin composition can be more improved, without inhibiting thermal stability and gas barrier properties. When the degree of saponification is less than the lower limit, the thermal stability of the resin composition may be insufficient. When the degree of saponification is greater than the upper limit, a time period required for the saponification increases, whereby productivity of the EVOH (F) may be impaired.

In addition, vinyl ester species, as well as copolymer components and using amounts thereof falling within the applicable range for use in the production of the EVOH (F) may be similar to those for the EVOH (A).

The EVOH (F) may be a modified ethylene-vinyl alcohol copolymer (hereinafter, may be also referred to as "modified EVOH") in light of improvements of flexibility, secondary processing characteristics and heat stretching properties of the resin composition. The modified EVOH is exemplified by EVOH having a structural unit represented by the following formula (3) (hereinafter, may be also referred to as "structural unit (I)"), and the like.

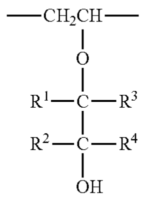

(3)

In the above formula (3), $R^1$, $R^2$, $R^3$ and $R^4$ each independently represent a hydrogen atom, a hydrocarbon group having 1 to 10 carbon atoms, or an alkoxy group having 1 to 10 carbon atoms; a part or all of hydrogen atoms included in the hydrocarbon group may be substituted with a hydroxyl group, an alkoxy group, a carboxy group or a halogen atom, and $R^1$ and $R^2$ may bind with each other to form a ring structure.

The lower limit of the percentage content of the structural unit (I) with respect to total vinyl alcohol units constituting the EVOH (F) is preferably 0.3 mol %, more preferably 0.5 mol %, still more preferably 1 mol %, particularly preferably 1.5 mol %, and further particularly preferably 6 mol %. On the other hand, the upper limit of the percentage content of the structural unit (I) is preferably 40 mol %, more preferably 20 mol %, still more preferably 15 mol %, and particularly preferably 10 mol %. It is to be noted that the vinyl alcohol unit constituting the EVOH as referred to means a structural unit represented by —$CH_2CH(OH)$—, and a structural unit obtained by substituting a hydrogen atom of a hydroxyl group in this structural unit for other group.

The production method of the modified EVOH is not particularly limited, and a method of reacting EVOH with a monovalent epoxy compound having a molecular weight of 500 or less to obtain the modified EVOH, and the like may be exemplified. The EVOH which may be used as a raw material of the modified EVOH may be similar ones for the EVOH (A) and EVOH (F) described above, and the like.

The monovalent epoxy compound having a molecular weight of 500 or less preferably has 2 to 8 carbon atoms. In light of ease in handling of the compound, and reactivity with the EVOH, an epoxy compound having 2 to 6 carbon atoms is more preferred, and an epoxy compound having 2 to 4 carbon atoms is still more preferred. Of these, in light of reactivity with the EVOH, and gas barrier properties of the EVOH (F) obtained, the monovalent epoxy compound having a molecular weight of 500 or less is preferably 1,2-epoxybutane, 2,3-epoxybutane, epoxypropane, epoxyethane and glycidol, and more preferably epoxypropane and glycidol.

The lower limit of the value obtained by subtracting the ethylene content of the EVOH (A) from the ethylene content of the EVOH (F) is typically 8 mol %, preferably 12 mol %, more preferably 15 mol %, and still more preferably 18 mol %. On the other hand, the upper limit of the value is preferably 40 mol %, more preferably 30 mol %, and still more preferably 20 mol %. When the difference between the ethylene content of the EVOH (F) and the ethylene content of the EVOH (A) is less than the lower limit, the heat stretching properties of the resin composition may be insufficient. To the contrary, when the difference of the ethylene contents is greater than the upper limit, inhibitory ability of the generation of flow marks during long-run operation of the resin composition may be insufficient.

The lower limit of the melting point of the EVOH (A) and the melting point of the EVOH (F) is preferably 12° C., more preferably 14° C., still more preferably 15° C., and particularly preferably 17° C. The upper limit of the melting point of the EVOH (A) and the melting point of the EVOH (F) is preferably 80° C., more preferably 40° C., still more preferably 34° C., and particularly preferably 20° C. When the difference of the melting points is less than the lower limit, the heat stretching properties of the resin composition may be insufficient. To the contrary, when the difference of the melting points is greater than the upper limit, the inhibitory ability of the generation of flow marks during long-run operation of the resin composition may be insufficient.

In the case where the resin composition contains the EVOH (F), the lower limit of the mass ratio (A/F) of the EVOH (A) to the EVOH (F) is typically 60/40, preferably 65/35, more preferably 70/30, and still more preferably 85/15. In addition, the upper limit of the mass ratio (A/F) is typically 95/5, preferably 93/7, and more preferably 91/9. When the mass ratio (A/F) is less than the lower limit, the gas barrier properties and oil resistance of the resin composition may be deteriorated. On the other hand, when the mass ratio (A/F) is greater than the upper limit, flexibility, heat stretching properties and secondary processability of the resin composition may be impaired.

In the case where the resin composition contains the EVOH (F), the lower limit of the total content of the EVOH (A) and EVOH (F) is preferably 80% by mass, more preferably 90% by mass, still more preferably 95% by mass, and particularly preferably 99.9% by mass.

In the case where the resin composition contains the EVOH (F), the lower limit of the content of the EVOH (F) in the resin content of the resin composition is preferably 4% by mass, more preferably 6% by mass, and still more preferably 7% by mass. On the other hand, the upper limit of the content of the EVOH (F) is preferably 40% by mass, more preferably 35% by mass, still more preferably 30% by mass, and particularly preferably 15% by mass. When the content of the EVOH (F) is less than the lower limit, flexibility, heat stretching properties and secondary processability of the resin composition may be impaired. To the contrary, when the content of the EVOH (F) is greater than the upper limit, the content of the EVOH (A) would be so low that the gas barrier properties and oil resistance of the resin composition may be deteriorated.

Other Optional Component

The other optional component is exemplified by an antioxidant, an UV absorbent, a plasticizer, an antistatic agent, a lubricant, a colorant, a filler, a heat stabilizer such as a hindered phenol compound or a hindered amine compound, other resin such as polyamide or polyolefin, a hydrotalcite compound, and the like. The total content of the other optional component(s) of the resin composition is typically 1% by mass or less.

Examples of the filler include glass fiber, ballastonite, calcium silicate, talc, montmorillonite, and the like.

It is to be noted that in order to inhibit the gelation, for example, a hindered phenol compound or a hindered amine compound, a hydrotalcite compound or the like exemplified as the heat stabilizer above may be added to the resin composition. In the case where the compound for inhibiting the gelation is added to the resin composition, the amount of addition is typically 0.01% by mass or greater and 1% by mass or less.

Melt Viscosity (Melt Flow Rate) of Resin Composition

The lower limit of the melt flow rate of the resin composition is preferably 0.5 g/10 min, more preferably 1.0 g/10 min, and still more preferably 1.4 g/10 min. On the other hand, the upper limit of the melt flow rate of the resin composition is preferably 30 g/10 min, more preferably 25 g/10 min, still more preferably 20 g/10 min, particularly preferably 15 g/10 min, further particularly preferably 10 g/10 min, and most preferably 1.6 g/10 min. When the melt flow rate of the resin composition is less than the lower limit, or greater than the upper limit, the moldability and appearance characteristics may be deteriorated.

Production Method of Resin Composition

The production method of the resin composition may involve, for example: a procedure in which pellets of the EVOH (A) are mixed with, as needed, the alkali metal salt (B1), other optional component, etc., followed by melt-kneading; a procedure in which the pellets of the EVOH (A) are immersed in a solution containing each component; and the like. It is to be noted that, for example, a ribbon blender, a high speed mixer, a cokneader, a mixing roll, an extruder, an intensive mixer and the like may be employed for mixing the pellets and other component(s). Alternatively, the resin composition may be also obtained by melt molding using EVOH (A) pellets to which the alkali metal salt (B1) and optionally other component were adhered on their surface by dry blending.

It is to be noted that as the production method of the resin composition containing the inorganic particles (C) or the polyolefin (D), the following each method may be suitably used.

Production Method of Resin Composition Containing Inorganic Particles (C)

As the production method of the resin composition containing the inorganic particles (C), the following method may be suitably used. More specifically, in the production method of the ethylene-vinyl alcohol copolymer, with respect to a step (1) of copolymerizing ethylene with a vinyl ester, and a step (2) of saponifying the copolymer obtained by the step (1), as the procedure of homogenously blending the inorganic particles (C) in the resin composition:

- adding the inorganic particles (C), etc., in the step (1);
- adding the inorganic particles (C), etc., in the step (2);
- adding the inorganic particles (C), etc., to the EVOH obtained by the step (2);
- adding the inorganic particles (C), etc., in melt molding the EVOH obtained by the step (2);
- any combination of the same; and the like may be exemplified.

It is to be noted that in the case of employing the procedure of adding the inorganic particles (C), etc., in the step (1), or the of adding the inorganic particles (C), etc., in the step (2), it is necessary to conduct the addition so as not to inhibit the polymerization reaction in the step (1), or the saponification reaction in the step (2).

Among these procedures, in light of ease of adjusting the content of the inorganic particles (C), etc., in the resin composition, the procedures of: adding the inorganic particles (C), etc., to the EVOH obtained by the step (2); and adding the inorganic particles (C), etc., in melt molding the EVOH obtained by the step (2) are preferred, and the procedures of adding the inorganic particles (C), etc., to the EVOH obtained by the step (2) is more preferred.

As the procedure of adding the inorganic particles (C), etc., to the resin composition: a procedure of blending the inorganic particles (C), etc., in the EVOH beforehand, followed by pelletizing the blend; a procedure of adding the inorganic particles (C), etc., to redissolved chips of the dry resin composition; a procedure of melt-kneading a blend of the EVOH (A) with the inorganic particles (C), etc.; a procedure of adding the inorganic particles (C), etc., to molten EVOH (A) halfway the extruder; a procedure of making a masterbatch by blending the inorganic particles (C), etc., into a part of the EVOH (A) at a high concentration and pelletizing the blend, followed by dry blending of the masterbatch with the EVOH (A) and then melt-kneading; and the like are exemplified.

Of these, in light of enabling the inorganic particles (C), etc., to be more uniformly dispersed in the EVOH (A), the procedure of blending the inorganic particles (C), etc., in the EVOH beforehand, followed by pelletizing the blend procedure of blending the inorganic particles (C), etc., in EVOH beforehand, followed by pelletizing the blend is preferred. Specifically, pellets in which the inorganic particles (C), etc., are homogenously mixed with the EVOH (A) can be obtained by: preparing a solution by dissolving the EVOH (A) in a good solvent such as a mixed solvent of water/methanol; adding the inorganic particles (C) to the solution; extruding the mixed solution from a nozzle, etc., into a poor solvent to allow for deposition and/or coagulation; and washing and/or drying the same.

Production Method of Resin Composition Containing Polyolefin (D)

In the production method of the resin composition containing the polyolefin (D), a single- or twin-screw screw extruder employed in melt blending a resin can be suitably used. The order of addition is not particularly limited, and a procedure in which a resin component containing the EVOH (A), the polyolefin (D) and other optional component such as a fatty acid metal salt are charged simultaneously or in an appropriate order into the extruder, and then the mixture is subjected to melt-kneading may be suitably adopted. Alternatively, the optional component may be added during the melt-kneading.

Molded Article

The resin composition of the above embodiment of the present invention is formed into a variety of resin molded products such as a film, a sheet, a container, a pipe, a hose, a fiber and a packaging material by melt molding or the like. The “film” as referred to herein means a molded product typically having an average thickness of about less than 300 μm, whereas the “sheet” as referred to means a molded product typically having an average thickness of about 300 μm or greater. Examples of the procedure for the melt molding include extrusion-molding, cast-molding, inflation extrusion-molding, blow-molding, melt spinning, injection molding, injection blow molding, and the like. The melt molding temperature may vary depending on the melting point of the EVOH (A) and the like, and is preferably about 150° C. or greater and 270° C. or less. Examples of the secondary forming processing include bending processing, vacuum molding, blow-molding, press molding, and the like. It is possible to subject these molded products to remolding for the purpose of reuse of the same after grinding. Alternatively, the film, sheet, fiber or the like can also be monoaxially or biaxially stretched. The molded product obtained by the melt molding, etc., may be subjected to, as needed, a secondary processing molding such as, bending processing, vacuum molding, blow molding or press molding to give an intended molded product.

Film

The film according to still another embodiment of the present invention is formed from the resin composition of the above embodiment, and may include a monolayer film and a multilayer film. By virtue of being formed from the resin composition, the film is superior in appearance characteristics, and in the case where the resin composition contains the inorganic particles (C), superior film breakage resistance is also attained. Moreover, in the case where the resin composition contains the polyamide (E), a molded product having the film can be suitably used for boiling sterilization or for retort sterilization.

The lower limit of the arithmetic average roughness (Ra) of at least one surface of the film measured in accordance with JIS-B0601 is preferably 0.05 μm, more preferably 0.10 μm, still more preferably 0.15 μm, and particularly preferably 0.20 μm. On the other hand, the upper limit of the arithmetic average roughness (Ra) of at least one surface of the film is preferably 1.0 μm, more preferably 0.8 μm, still more preferably 0.6 μm, and particularly preferably 0.4 μm. When the arithmetic average roughness (Ra) of at least one surface of the film falls within the above range, film breakage resistance can be more improved.

The lower limit of the average length of contour curve element (RSm) of at least one surface of the film measured in accordance with JIS-B0601 is preferably 50 μm, more preferably 100 μm, still more preferably 150 μm, and particularly preferably 200 μm. The upper limit of the average length of contour curve element (RSm) of at least one surface of the film is preferably 1,000 μm, more preferably 800 μm, still more preferably 600 μm, and particularly preferably 400 μm. When the average length of contour curve element (RSm) of at least one surface the film falls within the above range, film breakage resistance can be more improved. It is to be noted that JIS-B0601 may be, for example, JIS-B0601 (2001).

Production Method of Film

An exemplary production method of the film includes, for example: a cast molding step of melt extruding the resin composition on casting rolls; and a step of stretching unstretched film obtained from the resin composition obtained by this cast molding step (monoaxially stretching step, sequential twin-screw step, simultaneously biaxially stretching step, inflation molding step, etc.). In the case where the resin composition contains the inorganic particles (C), production of the film by the method described above enables film breakage resistance to be more improved.

Multilayer Structure

The multilayer structure according to still another embodiment of the present invention has a first layer formed from the resin composition of the above embodiment (hereinafter, may be also referred to as “the resin composition layer”). More specifically, the multilayer structure includes a first layer, and other layer laminated on at least one face of the first layer. The multilayer structure can be molded into, an arbitrary molded article such as, for example, a film, a sheet, a tape, a cup, a tray, a tube, a bottle, a pipe, etc.

It is to be noted that, the multilayer structure includes a vapor-deposited film obtained by vapor deposition of a metal on the film of the above embodiment, and the vapor-deposited film will be described later.

The multilayer structure is exemplified by a multilayer sheet, a multilayer pipe, a multilayer fiber, and the like. In addition, the other layer included in the multilayer structure is preferably a thermoplastic resin layer formed from a thermoplastic resin. By virtue of including the first layer and the thermoplastic resin layer, the multilayer structure has improved appearance characteristics and heat stretching properties.

In addition, the other layer is preferably a layer formed from an ethylene-vinyl alcohol copolymer, and a layer formed from a polyolefin. The polyolefin may involve those exemplified in connection with the polyolefin (D) and the like, and a polypropylene based resin such as polypropylene and a propylene copolymer, and a polyethylene based resin such as polyethylene and an ethylene copolymer are preferred.

Examples of the resin which may be used for forming the thermoplastic resin layer include:

- high-density, medium-density or low-density polyethylene;
- polyethylene obtained by copolymerizing vinyl acetate, an acrylic acid ester, or an α-olefin such as butene and hexene;
- ionomer resins;
- polypropylene homopolymers;
- polypropylene obtained by copolymerizing an α-olefin (particularly α-olefin having 4 to 20 carbon atoms) such as ethylene, butene and hexene;
- homopolymers of an olefin or copolymers thereof such as polybutene and polypentene;
- polyolefins blended with a rubber polymer, such as modified polypropylene;
- resins obtained by addition or grafting of maleic anhydride to these resins;
- polyesters such as polyethylene terephthalate; polyester elastomers; polyamides such as nylon-6 and nylon-6,6; polystyrene, polyvinyl chloride, acrylic resin, vinyl ester resin, polyurethane, polyurethane elastomer, polycarbonate, polyvinyl acetate, chlorinated polyethylene, chlorinated polypropylene; and the like. Of these, the resin for forming the thermoplastic resin layer is preferably polyethylene, polypropylene, an ethylene-propylene copolymer, an ethylene-vinyl acetate copolymer, polystyrene, polyamide and polyester. In addition, in the case where the thermoplastic resin layer is formed with the resin film, the resin film is preferably an unstretched polypropylene film and a nylon-6 film.

Adhesive Resin

The multilayer structure may be laminated via an adhesive resin between layers. The adhesive resin for use in forming the adhesive resin layer is preferably the aforementioned acid-modified polyolefin, and more preferably a carboxylic acid-modified polyolefin.

As the carboxylic acid modified polyolefin, a carboxyl group-containing modified olefin-derived polymer can be suitably used which is obtained by allowing an ethylenic unsaturated carboxylic acid, or an ester or an anhydride thereof to be chemically bonded to an olefin-derived polymer through an addition reaction, a grafting reaction or the like.

Production Method of Multilayer Structure

The production method of the multilayer structure is not particularly limited, and examples thereof include an extrusion lamination process, a dry lamination process, an extrusion blow molding process, a coextrusion lamination process, a coextrusion sheet molding process, a coextrusion pipe molding process, a coextrusion blow molding process, a coinjection molding process, a solution coating process, and the like. In addition, a thermoplastic resin, an adhesive resin or the like may be melt extruded to the molded product (film, sheet, etc.) obtained from the resin composition of the above embodiment. Furthermore, the film or the multilayer structure that includes the film may be laminated with other base film, sheet, etc., by using a well-known adhesive such as an organic titanium compound, an isocyanate compound or a polyester compound. Of these, the production method of the multilayer structure involves preferably a coextrusion lamination process and a coextrusion molding process, and more preferably a coextrusion molding process. By virtue of laminating the resin composition layer with the thermoplastic resin layer by the aforementioned process, easy and accurate production is enabled, and consequently, the multilayer structure has superior appearance characteristics and heat stretching properties. In addition, in the case where the resin composition contains the polyamide (E), retort resistance can be effectively achieved. It is to be noted that the laminate having a multilayer structure obtained in such a method may be further subjected to a secondary processing after heating again at the melting point of the EVOH (A) or lower, by vacuum/pressure deep drawing molding, blow molding, or the like.

Although the procedure for coextrusion of the resin composition of the embodiment of the present invention and the thermoplastic resin, etc., is not particularly limited, for example, a multimanifold-merging T die process, a feed block-merging T die process, an inflation process, and the like may be exemplified.

In carrying out coextrusion molding or coinjection molding, it is more preferred that the resins such as EVOH (A), polyolefin, other thermoplastic resin and adhesive resin are each separately fed into a thermoforming apparatus.

In the case where the melt molding of the resin composition of the above embodiment is carried out in the production of the multilayer structure, the melt molding temperature may vary depending on the melting point and the like of the EVOH (A) contained in the resin composition, and is preferably 150° C. or greater and 250° C. or less. When the melt molding temperature is less than the lower limit, the melt molding may be difficult. When the melt molding temperature is greater than the upper limit, thermal deterioration of the EVOH (A) may be accelerated, and in particular, unfavorable appearance and impairment of the impact resistance may be brought about in repeated recovery and recycling due to thermal deterioration.

The extrusion molding of each layer is carried out by operating an extruder equipped with a single screw at a certain temperature. The temperature of an extruder for forming the resin composition layer is adjusted to, for example, 170° C. or greater and 240° C. or less. The temperature of the extruder for forming the layer formed of other component is adjusted to, for example, 200° C. or greater and 240° C. or less, whereas the temperature of the extruder for forming the adhesive layer is adjusted to, for example, 160° C. or greater and 220° C. or less. Furthermore, in the case where a layer is formed from a resin composition that was recovered and recycled from the resin composition containing the polyolefin (D), the temperature of an extruder is adjusted to, for example, 200° C. or greater and 240° C. or less.

Although a layered structural constitution of the multilayer structure is not particularly limited, in light of moldability cost and the like, the layered structural constitution typically exemplified includes: a thermoplastic resin layer/the resin composition layer/a thermoplastic resin layer, the resin composition layer/an adhesive resin layer/a thermoplastic resin layer, a thermoplastic resin layer/an adhesive resin layer/the resin composition layer/an adhesive resin layer/a thermoplastic resin layer. Of these, a layered structural constitution including a thermoplastic resin layer/the resin composition layer/a thermoplastic resin layer is preferred. More specifically, a structure including a layer of the resin composition both two sides of which are directly laminated with a thermoplastic polyester layer is more preferred. when the thermoplastic resin layer is provided on both outer sides of the resin composition layer, the thermoplastic resin layers as both outer layers may be formed from either different resins or the same resin.

A procedure of molding to give a molded article by using the multilayer structure of the above embodiment may involve, for example, a heat stretching process, a vacuum molding process, a pressure molding process, a vacuum/pressure molding process, and the like. These molding processes may be typically carried out at a temperature within the range of the melting point of the EVOH or lower. Of these, the heat stretching process and the vacuum/pressure molding process are preferred. In the heat stretching process, molding is carried out by heating the multilayer structure, and stretching in one direction or in multiple directions. In the vacuum/pressure molding, molding is carried out by heating the multilayer structure, with combined use of vacuum and compressed air. Since the multilayer structure of the above embodiment is used in the molded article, easy and accurate production is enabled by molding with the heat stretching process or vacuum/pressure molding process, and thus superior appearance characteristics, as well as inhibited generation of flow marks can be provided. Moreover, in the case where the resin composition contains the polyamide (E), the retort resistance can be more improved. The molded article that is particularly suitable may be exemplified by a packaging obtained by molding with the heat stretching process, and a container obtained by molding with the vacuum/pressure molding process.

In addition, another procedure of molding to give a molded article by using the multilayer structure of the above embodiment may involve stretching, thermoforming, blow molding, and the like. Examples of the stretching process include a roll stretching process, a tenter stretching process, a tubular stretching process, a stretching blow process, and the like. In the case where biaxially stretching is carried out, any of simultaneous biaxial stretching and sequential biaxial stretching may be employed. Examples of the thermoforming include a process that involves molding the multilayer structure in a film or sheet form into a cup or tray form by vacuum molding, pressure molding, vacuum/pressure molding or the like. Moreover, examples of the blow-molding process include a process that involves blowing the multilayer structure in the form of a parison to form a bottle, a tube or the like.

In the case where the heat stretching process is carried out, the thermoplastic resin used is preferably a stretchable resin in a heat stretching temperature range represented by the following formula (4):

$$X-110 \leq Y \leq X-10 \quad (4)$$

In the above formula (4), X represents a melting point (° C.) of the EVOH (A); and Y represents a heat stretching temperature (° C.). When produced from the multilayer structure of the above embodiment by using the heat stretching process, the molded product can have more superior appearance characteristics through the use of the aforementioned resin as the thermoplastic resin, and defects such as cracks can be more inhibited.

In addition, the molded product may be also formed by coinjection stretch-blow molding using the resin composition of the above embodiment and the other resin composition. The coinjection stretch-blow molding is a procedure of: carrying out coinjection molding using two or more types of resin compositions to obtain a premolded article having a multilayer structure; and thereafter subjecting the premolded article to heat stretch-blow molding. Due to molding from the resin composition having the aforementioned characteristics by way of the coinjection stretch-blow molding, the molded article can be easily and accurately produced, and have superior appearance characteristics, with inhibited generation of flow marks. The other resin composition is exemplified by the thermoplastic resin described above, and the like.

It is to be noted that scraps generated through carrying out the thermoforming such as extrusion molding and blow molding may be either recycled through blending with the thermoplastic resin layer, or used separately as a regrind layer.

The molded product may be further subjected to a secondary forming processing such as bending processing, vacuum molding, blow molding and press molding as needed, to obtain an intended molded article.

Since the molded product includes the layer formed from the resin composition having the aforementioned properties, the molded article can be suitably used for thermoformed containers, for example, food packaging containers or fuel containers.

The thermoformed container including the multilayer structure according to the above embodiment can be formed as a container by molding the multilayer structure according to a purpose, followed by heat sealing as needed, and used for transportation and/or storage after filling the container with contents. The contents may be any of foods and non-foods, and may be any of dry, wet and oily ones. In addition, the container including the multilayer structure may be subjected to a boiling treatment or a retort treatment. In a case where the container is subjected to such a treatment, a container having the layer formed from as the outermost layer on both sides, or a container having a thick EVOH layer is suitably used.

Packaging Material

A packaging material provided with the multilayer structure of the above embodiment will be described. By virtue of including the multilayer structure, the packaging material is superior in gas barrier properties, and the gas barrier properties can be maintained even if subjected to physical stress such as impact or deformation.

The packaging material is formed by laminating the film of the above embodiment having at least one layer, with other layer having at least one layer. Examples of the other layer include a polyester layer, a polyamide layer, a polyolefin layer, a paper layer, an inorganic vapor-deposited film layer, an EVOH layer, an adhesion layer, and the like. Although the number of layers and the order of lamination in the packaging material are not particularly limited, when subjected to heat sealing at least outermost layer should be a heat sealable layer. It is to be noted that the polyolefin layer may contain a pigment in the case where the packaging material is provided as a laminate tube container and the like described later.

The packaging material is used for wrapping, e.g., foods, beverages, chemicals such as pesticide and medicines, as well as industrial materials such as medical equipments, machine parts and precision materials, clothes, and the like. In particular, the packaging material is preferably used in intended usage for which barrier properties against oxygen would be necessary, and in intended usage in which the interior of the packaging material will be substituted by various types of functional gas.

The packaging material is formed into a variety of shapes according to the intended usage, for example, into a vertically-manufactured bag packaging-and-sealing pouch, a vacuum wrapping bag, a spout-attached pouch, a laminate tube container, a lid member for container, and the like.

Vapor-Deposited Film

The vapor-deposited film of an embodiment of the present invention includes a film formed from the resin composition of the above embodiment (hereinafter, may be also referred to as "base film"), and a metal vapor-deposition layer laminated on the base film. The vapor-deposited film may include in addition to the aforementioned layers, a resin coating layer laminated on the metal vapor-deposition layer, and other layer.

The upper limit of the oxygen transmission rate of the vapor-deposited film measured at 40° C., with a humidity of 90% RH on the vapor-deposition layer side, and with a humidity of 0% RH on the base film side is preferably 5 $mL/m^2$·day·atm, more preferably 3 $mL/m^2$·day·atm, still more preferably 2 $mL/m^2$·day·atm, particularly preferably 1 $mL/m^2$·day·atm, and further particularly preferably 0.1 $mL/m^2$·day·atm. When the oxygen transmission rate is less than the upper limit, a time period during which a degree of vacuum can be maintained in the internal space of the container, etc., formed from the packaging that includes the vapor-deposited film of the above embodiment can be prolonged. The term oxygen transmission rate ($mL/m^2$·day·atm) as referred to herein means a value obtained by dividing the amount of oxygen (ml) that transmits the vapor-deposited film, by: the vapor-deposited film area ($m^2$); the transmission time (day); and the difference (atm) between the oxygen gas pressure on one face side, and the oxygen gas pressure on another face side of the vapor-deposited film. Specifically, the oxygen transmission rate being, for example, "5 $mL/m^2$·day·atm or less" indicates that under the difference in pressure of the oxygen gas of 1 atmospheric pressure, 5 mL of oxygen transmits per 1 $m^2$ of the film per day. In addition, in the case where the metal vapor-deposition layer is laminated on both two faces of the base film, the oxygen transmission rate is to be measured at 40° C., with a humidity of 90% RH on one metal vapor-deposition layer side, and a humidity of 0% RH on other metal vapor-deposition layer side.

The lower limit of the content of volatiles included in the vapor-deposited film is not particularly limited, and preferably 0.01% by mass, more preferably 0.03% by mass, and still more preferably 0.05% by mass. The upper limit of the content of the volatiles is preferably 1.1% by mass, more preferably 0.5% by mass, and still more preferably 0.3% by mass.

However, in the case where the vapor-deposited film is applied to a vacuum insulator, the content of the volatiles in the vapor-deposited film is preferably as low as possible. The reason for such a feature is that volatiles generated from the vapor-deposited film penetrate into a vacuum area of the vacuum insulator, and consequently, the degree of vacuum inside the vacuum insulator decreases, whereby a thermal insulation performance may be impaired.

Herein, the content of the volatiles may be determined from a change of the mass before and after drying at 105° C. for 3 hrs, according to the following formula.

Content of volatiles (% by mass)=[((mass before drying)−(mass after drying)/(mass after drying)]×100

Base Film

The base film formed from the resin composition of the above embodiment. The production method of a base film may involve a similar method to those exemplified in connection with the production method of a film, and the like.

The upper limit of the oxygen transmission rate of the base film is preferably 50 mL·20 μm/$m^2$·day·atm, more preferably 10 mL·20 μm/$m^2$·day·atm, still more preferably 5 mL·20 μm/$m^2$·day·atm, and particularly preferably 1 mL·20 μm/$m^2$·day·atm. As referred to herein, the value of the oxygen transmission rate is measured at 20° C. and 65% RH. In addition, provided that the average thickness of the base film is 20 μm, the oxygen transmission rate (mL·20 μm/$m^2$·day·atm) of the base film as referred to means a value obtained by dividing the amount of oxygen (ml) that transmits the base film, by: the base film area ($m^2$); the transmission time (day); and the difference (atm) between the oxygen gas pressure on one face side, and the oxygen gas pressure on another face side of the base film. Specifically, provided that the average thickness of the base film is, for example, 20 μm, the oxygen transmission rate being, for example, "50 mL·20 μm/$m^2$·day·atm" indicates that under the difference in pressure of the oxygen gas of 1 atmospheric pressure, 50 mL of oxygen transmits per 1 $m^2$ of the film per day.

The upper limit of the average thickness of the base film is not particularly limited, and is preferably 30 μm, more preferably 25 μm, and still more preferably 20 μm. On the other hand, the lower limit of the average thickness of the base film is preferably 5 μm, more preferably 7 μm, and still more preferably 10 μm.

Forming Procedure of Base Film

A procedure for forming of the base film is not particularly limited, and for example, a melting process, a solution process, a calendar process and the like are involved, and of these, a melting process is preferred. The melting process is exemplified by a casting process and an inflation process, and of these, a casting process is preferred.

In the case of the film formation by the casting process, stretching may be carried out. The stretching procedure is not particularly limited, and may be any of monoaxial stretching, simultaneous biaxial stretching, and sequential biaxial stretching. The lower limit of the draw ratio on area basis is preferably 8 times, and more preferably 9 times. The upper limit of the draw ratio is preferably 12 times, and more preferably 11 times. When the draw ratio falls within the above range, uniformity of the thickness, gas barrier properties and mechanical strength of the fill can be improved. In contrast, when the draw ratio is less than the lower limit, patches on stretching may be likely to remain, whereas when the draw ratio is greater than the upper limit, film breakage may be likely to occur during the stretching.

When the stretching is carried out, it is preferred that an original piece is hydrated beforehand. Accordingly, continuous stretching is facilitated. The lower limit of the moisture content of the original piece before stretching is preferably 2% by mass, more preferably 5% by mass, and still more preferably 10% by mass. The upper limit of the moisture content of the original piece before stretching is preferably 30% by mass, more preferably 25% by mass, and still more preferably 20% by mass. When the moisture content is less than the lower limit, patches on stretching are likely to remain, and particularly in a case where the stretching is carried out with a tenter, the draw ratio in the area close to the grip may become so great that the film may be easily torn in the vicinity of the grip. On the other hand, when the moisture content is greater than the upper limit, the modulus of elasticity at the stretched portion becomes so low to result in insufficient difference from unstretched portion, whereby patches on stretching may be likely to remain.

Although the stretching temperature may somewhat vary depending on the moisture content of the original piece before the stretching, and on the stretching procedure, the stretching temperature may be typically 50° C. or greater and 130° C. or less. In order to obtain a biaxially stretched film accompanied by fewer patches on stretching, the stretching temperature is: preferably 70° C. or greater and 100° C. or less in simultaneous biaxial stretching; preferably 70° C. or greater and 100° C. or less in stretching along a longitudinal direction with rolls in sequential biaxial stretching; and preferably 80° C. or greater and 120° C. or less in stretching along a width direction with a tenter.

Metal Vapor-Deposition Layer

The metal vapor-deposition layer is provided for principally ensuring the gas barrier properties of the vapor-deposited film. The metal vapor-deposition layer is laminated on the base film. The metal vapor-deposition layer may be laminated either on both two faces of the base film, or on only one face of the base film, but is preferably laminated on both two faces of the base film. By laminating the metal vapor-deposition layer on both two faces of the base film, the gas barrier properties are more improved, stability of the gas barrier can be attained. More specifically, even if a defect is generated on one metal vapor-deposition layer resulting from physical impact or the like, gas barrier properties as a vapor-deposited film would be suitably maintained due to another metal vapor-deposition layer maintaining the barrier properties.

Examples of the material for forming the metal vapor-deposition layer include aluminum, silicon, magnesium, zinc, tin, nickel and titanium, as well as oxides, carbides and nitrides of one type or two or more types of the same, and the like. It is preferred that aluminum is used alone or in combination. When aluminum is thus used, a vapor-deposited film that is light and has favorable flexibility and glossiness can be obtained.

The lower limit of the average thickness of the metal vapor-deposition layer is preferably 15 nm, more preferably 20 nm, still more preferably 30 nm, and particularly preferably 60 nm. The upper limit of the average thickness of the metal vapor-deposition layer is preferably 200 nm, more preferably 130 nm, and still more preferably 80 nm. When the average thickness of the metal vapor-deposition layer is less than the lower limit, the gas barrier properties may be insufficient. On the other hand, when the average thickness of the metal vapor-deposition layer is greater than the upper limit, thermal bridge is likely to be generated, and a heat insulation effect may be impaired. It is to be noted that in the case where the metal vapor-deposition layer is constituted from a plurality of layers, the average thickness of each layer preferably falls within the above range, and it is more preferred that the total of the average thicknesses of a plurality of layers falls within the above range. The average thickness of the metal vapor-deposition layer as referred to herein means an averaged value of thicknesses at arbitrary ten points on a cross section of the metal vapor-deposition layer measured by an electron microscope.

The lower limit of the mean particle size of vapor deposition particles such as aluminum particles in the metal vapor-deposition layer is not particularly limited, and preferably 10 nm, more preferably 15 nm, and still more preferably 20 nm. On the other hand, the upper limit of the mean particle size of the vapor deposition particles is preferably 150 nm, more preferably 125 nm, still more preferably 100 nm, particularly preferably 75 nm, and most preferably 50 nm. The mean particle size of the vapor deposition particles as herein referred to means an averaged value obtained by observing the surface of the metal vapor-deposition layer with a scanning electron microscope, determining maximum diameters of a plurality of vapor deposition particles present along an identical direction (maximum diameter in a certain direction), and dividing the sum of the maximum diameters by the number of particles measured. In addition, in the case where the vapor deposition particles form particle aggregates, the mean particle size means the particle size of the vapor deposition particles forming the particle aggregates (primary particle size).

In the case where the metal vapor-deposition layer is formed on the base film, it becomes possible to form the metal vapor-deposition layer having the mean particle size of the vapor deposition particles of 150 nm or less by satisfying any one of the following requirements.

(1) The surface temperature of the base film in vapor deposition is kept at 60° C. or less.

(2) The content of volatiles included in the base film before the vapor deposition is regulated to 1.1% by mass or less.

(3) The surface of the base film before the vapor deposition is modified by subjecting to a plasma treatment.

Of these, it is preferred that the requirement (1) is satisfied, and is more preferred that in addition to the requirement (1), at least one of the requirement (2) and the requirement (3) is satisfied.

The upper limit of the surface temperature of the base film in carrying out the vapor deposition is, as described above, preferably 60° C., more preferably 55° C., and still more preferably 50° C. In addition, the lower limit of the surface temperature of the base film in the vapor deposition is not particularly limited, but is preferably 0° C., more preferably 10° C., and still more preferably 20° C.

The lower limit of the content of the volatiles included in the base film before the vapor deposition is not particularly limited, and is preferably 0.01% by mass, more preferably 0.03% by mass, and still more preferably 0.05% by mass. The upper limit of the content of the volatiles is preferably 1.1% by mass, more preferably 0.5% by mass, and still more preferably 0.3% by mass. The content of the volatiles may be determined in a similar manner to the content of the volatiles in the vapor-deposited film described above, from the change before and after drying at 105° C. for 3 hrs.

As the procedure for the plasma treatment of the surface of the base film before the vapor deposition, a well-known procedure can be used, and an atmospheric-pressure plasma treatment is preferred. In this atmospheric-pressure plasma treatment, examples of the discharge gas include a nitrogen gas, helium, neon, argon, krypton, xenon, radon, and the like. Of these, nitrogen, helium and argon are preferred, and in light of the cost reduction, nitrogen is more preferred.

Resin Coating Layer

The resin coating layer is provided for inhibiting the damage of the metal vapor-deposition layer resulting from flexion and the like in the film processing such as lamination, for example, in the step following the production of the vapor-deposited film. According to the vapor-deposited film provided with such a resin coating layer, deterioration of the gas barrier properties can be inhibited. The resin coating layer may contain, for example, a vinyl alcohol polymer (an ethylene-vinyl alcohol copolymer, polyvinyl alcohol, etc.), and as needed, a swellable inorganic layered silicate may be also contained.

The swellable inorganic layered silicate improves the strength of the resin coating layer. Examples of the swellable inorganic layered silicate include swellable montmorillonite, swellable synthetic smectite, swellable fluorinemica minerals, and the like. The lower limit of the content of the swellable inorganic layered silicate with respect to the vinyl alcohol polymer in the resin coating layer is not particularly limited, and in terms of the solid content equivalent, the lower limit of the content is preferably 0.5% by mass, more preferably 1% by mass, still more preferably 3% by mass, and particularly preferably 5% by mass. On the other hand, the upper limit of the content of the swellable inorganic layered silicate with respect to the vinyl alcohol polymer in the resin coating layer is not particularly limited, and in terms of the solid content equivalent, the upper limit of the content is preferably 55% by mass, more preferably 40% by mass, still more preferably 30% by mass, and particularly preferably 20% by mass. When the content of the swellable inorganic layered silicate is less than the lower limit, the strength of the resin coating layer may not be sufficiently improved. On the other hand, when the content of the swellable inorganic layered silicate is greater than the upper limit, flexibility of the resin coating layer is impaired, and thus defects such as cracks may be likely to be generated.

The lower limit of the average thickness of the resin coating layer is not particularly limited, but is preferably 0.001 μm in order to obtain effective gas barrier properties. On the other hand, the upper limit of the average thickness of the resin coating layer is not particularly limited, but is preferably 10 μm, and more preferably 2 μm.

Although the procedure for laminating the resin coating layer on the metal vapor-deposition layer is not particularly limited, a coating process, and a laminating process are preferred. Examples of the coating process include: a direct gravure process; a reverse gravure process; a micro gravure process; roll coating processes such as a two-roll bead coating process and a bottom feed three-roll reverse coating process; a doctor knife process; a die coating process; a dipping coating process; a bar coating process; a combination thereof; and the like. In addition, an interface between the metal vapor-deposition layer and the resin coating layer may have undergone a corona treatment or a treatment with an anchor coating agent or the like.

Other Layer

The other layer is exemplified by a layer containing a thermoplastic resin as a principal component (hereinafter, referred to as "thermoplastic resin layer"), a paper layer, and the like.

The thermoplastic resin layer may be laminated on any one of the base film, the metal vapor-deposition layer and the resin coating layer, or may be a layer that serves as an adhesion layer. The thermoplastic resin layer may be formed from a stretched film or from an unstretched film, or may be formed by coating.

Examples of the thermoplastic resin which may form the other layer include: polyolefins such as polyethylene and polypropylene; polyesters such as polyethylene terephthalate; polyamides; ethylene-vinyl alcohol copolymers; and the like.

Intended Usage of Vapor-Deposited Film

Since the vapor-deposited film of the above embodiment is produced by laminating the metal vapor-deposition layer on the base film containing the EVOH (A), occurrence of failure in vapor deposition, generation of cracks on vapor-deposited film processing in laminating can be inhibited, and superior adhesion strength of the metal vapor-deposition layer can be provided. Thus, the vapor-deposited film can be applied to various intended usage. Examples of the intended usage of the vapor-deposited film include packagings, vacuum insulators, and the like.

Packaging

In the following, a packaging that includes the vapor-deposited film of the above embodiment will be described. The packaging is formed by, for example, subjecting the vapor-deposited film, a laminated film that includes the vapor-deposited film or the like to a secondary processing. By virtue of including the vapor-deposited film, the packaging is superior in gas barrier properties, and the gas barrier properties can be maintained even if subjected to physical stress such as impact and deformation.

The packaging is formed by laminating a vapor-deposited film having at least one layer, with other layer having at least one layer. Examples of the other layer include a polyester layer, a polyamide layer, a polyolefin layer, a paper layer, an inorganic vapor-deposited film layer, an EVOH layer, an adhesion layer, and the like. Although the number of layers and the order of lamination in the packaging are not particularly limited, when subjected to heat sealing at least outermost layer should be a heat sealable layer. It is to be noted that the polyolefin layer may contain a pigment in the case where the packaging is provided as a laminate tube container and the like described later.

The packaging is used for wrapping, e.g., foods, beverages, chemicals such as pesticides and medicines, as well as industrial materials such as medical equipments, machine parts and precision materials, and the like. In particular, the packaging is preferably used in intended usage for which barrier properties against oxygen would be necessary, and in intended usage in which the interior of the packaging will be substituted by various types of functional gas.

The packaging is formed into a variety of shapes according to the intended usage, for example, into a vertically-manufactured bag packaging-and-sealing pouch, a vacuum wrapping bag, a spout-attached pouch, a laminate tube container, a lid member for container, and the like.

Vertically-Manufactured Bag Packaging-and-Sealing Pouch

The vertically-manufactured bag packaging-and-sealing pouch is used for wrapping foods, beverages and the like in the form of, for example, liquid, viscous matter, powder, solid grains, or a combination thereof. The vertically-manufactured bag packaging-and-sealing pouch is formed by heat sealing the vapor-deposited film of the above embodiment. When heat sealing is carried out, in general, it is necessary to provide a heat sealable layer as a layer situated inside the vertically-manufactured bag packaging-and-sealing pouch, or as two layers situated both inside and outside the vertically-manufactured bag packaging-and-sealing pouch, of the vapor-deposited film. In a case where the heat sealable layer is situated only inside the vertically-manufactured bag packaging-and-sealing pouch, a body portion is typically sealed by butt-seaming. In a case where the heat sealable layer is situated both inside and outside of the vertically-manufactured bag packaging-and-sealing pouch, the body portion is typically sealed by wrap-sealing. The heat sealable layer is preferably a polyolefin layer (hereinafter, may be also referred to as "PO layer"). The layered structural constitution of the vertically-manufactured bag packaging-and-sealing pouch is preferably: the vapor-deposited film/polyamide layer/PO layer, the vapor-deposited film/PO layer, PO layer/the vapor-deposited film/PO layer, and an adhesion layer may be provided between layers. In addition, in a case where the vapor-deposited film that includes the metal vapor-deposition layer formed only on one face of the base film is applied, the vapor-deposited film may be either laminated such that the metal vapor-deposition layer is provided on outer side with respect to the base film, or may be laminated such that the metal vapor-deposition layer is provided on inner side with respect to the base film. The packaging is, as described above, superior in gas barrier properties, and the gas barrier properties can be maintained even if subjected to physical stress such as impact and deformation. Therefore, according to the vertically-manufactured bag packaging-and-sealing pouch as one example of the packaging, deterioration of quality of the contents can be inhibited for a long period of time.

Vacuum Wrapping Bag

The vacuum wrapping bag is used for intended usage in which vacuum wrapping is desired, for example, storage of foods, beverages and the like. The layered structural constitution of the vacuum wrapping bag preferably includes: the vapor-deposited film/polyamide layer/PO layer, polyamide layer/the vapor-deposited film/PO layer, and an adhesion layer may be provided between layers. By virtue of including the vapor-deposited film, such a vacuum wrapping bag is particularly preferably in gas barrier properties after the heat sterilization carried out following the vacuum wrapping.

Spout-Attached Pouch

The spout-attached pouch is used for wrapping liquid substances, for example, liquid beverages such as cooling beverages, jelly beverages, yogurt, fruit sources, seasonings, functional water, liquid foods, and the like. The layered structural constitution of the spout-attached pouch preferably includes: the vapor-deposited film/polyamide layer/PO layer, polyamide layer/the vapor-deposited film/PO layer, and an adhesion layer may be provided between layers. By virtue of including the vapor-deposited film, such a spout-attached pouch is superior in gas barrier properties, and the gas barrier properties can be maintained even if subjected to physical stress such as impact and deformation. Thus, the spout-attached pouch can prevent the contents from deterioration after transportation and even after storage for a long period of time.

Laminate Tube Container

The laminate tube container is used for wrapping, for example, cosmetics, chemicals, medical drugs, foods, toothpastes, and the like. The layered structural constitution of the laminate tube container preferably includes: PO layer/the vapor-deposited film/PO layer, PO layer/pigment-containing PO layer/PO layer/the vapor-deposited film/PO layer, and an adhesion layer may be provided between layers. By virtue of including the vapor-deposited film, such a laminate tube container is superior in gas barrier properties, and the gas barrier properties can be maintained even if subjected to physical stress such as impact and deformation.

Lid Member for Container

The lid member for container is a lid member for a container in which food such as processed meat, processed vegetable, processed seafood, fruit, or the like is packed therein. The layered structural constitution of the lid member for container preferably includes: the vapor-deposited film/polyamide layer/PO layer, the vapor-deposited film/PO layer, and an adhesion layer may be provided between layers. By virtue of including the vapor-deposited film, such a lid member for container is superior in gas barrier properties, and the gas barrier properties can be maintained even if subjected to physical stress such as impact and deformation, and therefore, deterioration of quality of the food as a content can be inhibited for a long period of time.

Vacuum Insulator

The vacuum insulator is used for intended usage in which cold storage or cold keeping or warmth keeping is necessary. In an exemplary vacuum insulator, a core material such as polyurethane foam is vacuum included in an external packing material. The external packing material is formed by, for example; laminating the vapor-deposited film having at least one layer, with other layer having and at least one layer to form pair of laminated films, which are then heat sealed. Examples of the other layer include a polyester layer, a polyamide layer, a polyolefin layer, an adhesion layer and the like, and a polyolefin layer that is a heat sealable layer is preferably included. Although the number of layers and the order of lamination in the external packing material are not particularly limited, it is preferred that the heat sealable layer (for example, polyolefin layer) is provided as an outermost layer. The layered structural constitution of the external packing material preferably includes: the vapor-deposited film/polyamide layer/PO layer, polyamide layer/the vapor-deposited film/PO layer, and an adhesion layer may be provided between layers. In addition, in a case where the vapor-deposited film that includes the metal vapor-deposition layer formed only on one face of the base film is applied, the vapor-deposited film may be either laminated such that the metal vapor-deposition layer is provided on outer side with respect to the base film, or may be laminated such that the metal vapor-deposition layer is provided on inner side with respect to the base film. By virtue of including the external packing material having the vapor-deposited film, the vacuum insulator is superior in gas barrier properties. Accordingly, the vacuum insulator can retain a heat insulation effect for a long period of time, and therefore, can be used in: heat insulating materials for household electric appliances such as refrigerators, hot-water supply equipments and rice cookers; heat insulating materials for housing used in wall portions, ceiling portions, loft portions, floor portions, etc.; vehicle roofs; thermal insulation panels of vending machines, etc., and the like.

Thermoformed Container

The thermoformed container of the embodiment of the invention that includes the multilayer structure of the above embodiment is described below. The thermoformed container can be used in intended usages for which oxygen barrier properties are demanded in a variety of fields of, for example, foods, cosmetics, medicinal chemicals, and toiletries. The thermoformed container is formed to have a retaining portion through, for example, subjecting to thermoforming the multilayer structure.

Retaining Portion

The retaining portion is for retaining contents such as foods. The shape of the retaining portion is decided in accordance with the shape of the contents. Specifically, the heat-molded container is formed to give, for example, a cup-shaped container, a tray-shaped container, a bag-shaped container, a bottle-shaped container, a pouch-shaped container, and the like.

The specification of the retaining portion may be expressed by a draw ratio (S) as one indicator. The draw ratio (S) as referred to herein means a value obtained by dividing the depth of the bottom of the container by the diameter of an inscribed circle having the maximum diameter in the opening of the container. Thus, a greater value of the draw ratio (S) indicates a deeper container, whereas a smaller value of the draw ratio (S) indicates a shallower container. For example, in the case of the thermoformed container of this embodiment having a cup shape, the draw ratio (S) thereof would be larger, whereas in the case of the thermoformed container having a tray shape, the draw ratio (S) thereof would be smaller. It is to be noted that the value of the diameter of a circle being inscribed in an opening of the container having the maximum diameter corresponds to, for example: a diameter of a circular shape when the opening of the retaining portion is circular; a shortest diameter (minor axis) of an elliptical shape when the opening of the retaining portion is elliptical; and a length of the shorter side of a rectangular shape when the opening of the retaining portion is rectangular.

A suitable draw ratio (S) varies in accordance with whether the multilayer structure of this embodiment used for forming the thermoformed container is a film or a sheet, in other words, the thickness of the multilayer structure of this embodiment. In a case where the thermoformed container is formed by the thermoforming of a film, the lower limit of the draw ratio (S) is preferably 0.2, more preferably 0.3, and still more preferably 0.4. On the other hand, when the thermoformed container is formed by molding of a sheet, the lower limit of the draw ratio (S) is preferably 0.3, more preferably 0.5, and still more preferably 0.8. It is to be noted that in the thermoformed container, the film as referred to means a soft substance having an average thickness of less than 0.2 mm, and the sheet as referred to means a soft substance having a greater average thickness than that of the film, for example, a thickness of 0.2 mm or greater.

The multilayer structure used in the thermoformed container includes other layer(s) laminated on at least any of one face side and other face side of the first layer. The term "one face side" in the thermoformed container as referred to herein means the inner surface side of the retaining portion, provided that the thermoformed container is formed from the multilayer structure, whereas the term "other face side" means the outer surface side of the retaining portion.

The lower limit of the thickness ratio (I/O) of the total average thickness (I) of the other layer(s) laminated on the one face side of the first layer to the total average thickness (O) of the other layer(s) laminated on the other face side of the first layer is preferably 1/99, and more preferably 30/70. Moreover, the upper limit of the ratio (I/O) is preferably 70/30, and more preferably 55/45. It is to be noted that the average thickness of the total layer or a single layer of the multilayer structure is an average value of the thicknesses measured by optical microscopic inspection of samples obtained from a plurality of portions of the multilayer structure by cutting away with a microtome, and that the thickness of the total layer or a single layer of the multilayer structure is substantially the same as the thickness of the total layer or a single layer of the thermoformed container.

The lower limit of the overall average thickness of the thermoformed container of this embodiment is preferably 300 μm, more preferably 500 μm, and still more preferably 700 μm. On the other hand, the upper limit of the overall average thickness of the thermoformed container is preferably 10,000 μm, more preferably 8,500 μm, and still more preferably 7,000 μm. It is to be noted that the overall average thickness of the thermoformed container as referred to means the average thickness of the total layer in the retaining portion of the thermoformed container, and the measuring method thereof is similar to that for the measurement of the average thickness of the total layer of the multilayer structure described above. When the overall average thickness of the thermoformed container is greater than the upper limit, a production cost of the thermoformed container may increase. On the other hand, when the overall average thickness of the thermoformed container is less than the lower limit, the rigidity of the thermoformed container may not be maintained, leading to easy breakage of the thermoformed container. Therefore, it is important to select the overall average thickness of the thermoformed container in accordance with the volume and intended usages thereof.

The other layers which may be laminated on the first layer (hereinafter, may be also referred to as "layer (1)") are exemplified by: a layer containing a thermoplastic resin as a principal component (hereinafter, may be also referred to as "layer (2)"); a layer that is provided between the layer (1) and the layer (2), and contains carboxylic acid-modified polyolefin as a principal component (hereinafter, may be also referred to as "layer (3)"); a regrind layer (hereinafter, may be also referred to as "layer (4)"); and the like. Hereinafter, the layer (1), layer (2), layer (3) and layer (4) will be described in more detail.

(1) Layer

The layer (1) contains as a principal component, EVOH (A) in the resin composition. The lower limit of the average thickness of the layer (1) is not particularly limited, and in light of barrier properties, mechanical strength and the like, the lower limit of the average thickness of the layer (1) with respect to the average thickness of the total layer is preferably 0.5%, more preferably 1.0%, and still more preferably 1.5%. On the other hand, the upper limit of the average thickness of the layer (1) with respect to the average thickness of the total layer is preferably 5.0%, more preferably 4.5%, and still more preferably 4.1%.

Layer (2)

The layer (2) is provided on the inner face side and the outer face side of the layer (1), and is a layer containing as a principal component a thermoplastic resin having a solubility parameter calculated using the Fedors equation of 11 $(cal/cm^3)^{1/2}$ or less. The thermoplastic resin having the solubility parameter calculated using the equation of 11 $(cal/cm^3)^{1/2}$ or less is superior in moisture resistance. It is to be noted that the "solubility parameter calculated using the Fedors equation" as referred to means a value represented by $(E/V)^{1/2}$. Wherein, E represents a molecular cohesive energy (cal/mol), which is denoted by $E=\Sigma ei$, wherein ei represents an evaporation energy; V represents a molecular volume $(cm^3/mol)$, which is denoted by $V=\Sigma vi$, wherein vi represents a molar volume.

The thermoplastic resin contained as a principal component of the layer (2) is not particularly limited as long as the solubility parameter of the thermoplastic resin is 11 $(cal/cm^3)^{1/2}$ or less, and examples thereof include: homopolymers or copolymers of an olefin, such as polyethylenes (linear low density polyethylene, low density polyethylene, medium-density polyethylene, high-density polyethylene, and the like), ethylene-vinyl acetate copolymers, ethylene-propylene copolymers, polypropylenes, copolymers of propylene with an α-olefin having 4 to 20 carbon atoms, polybutenes and polypentenes; polystyrenes, polyvinyl chlorides; polyvinylidene chlorides; acrylic resins; vinyl ester-based resins; polyurethane elastomers; polycarbonates; chlorinated polyethylenes and chlorinated polypropylenes; and the like. Of these, the polyethylenes, the ethylene-propylene copolymers, the ethylene-vinyl acetate copolymers, the polypropylenes and the polystyrenes are preferred, and the high-density polyethylene is more preferred.

In light of rigidity, impact resistance, moldability, draw-down resistance, gasoline resistance and the like, the lower limit of the density of the high-density polyethylene is preferably 0.93 $g/cm^3$, more preferably 0.95 $g/cm^3$, and still more preferably 0.96 g/cm. Moreover, the upper limit of the density of the high-density polyethylene is preferably 0.98 g/cm$^3$. Furthermore, the lower limit of the melt flow rate of the high-density polyethylene under a load of 2,160 g at 190° C. is preferably 0.01 g/10 min. Moreover, the upper limit of the melt flow rate is preferably 0.5 g/10 min, and more preferably 0.1 g/10 min.

It is to be noted that the high-density polyethylene used may be appropriately selected, in general, from among commercially available products. In addition, the layer (2) may contain other optional component similar to those which may be contained in the layer (1), within a range not leading to impairment of the effects of the present invention.

The lower limit of the average thickness of the layer (2) with respect to the average thickness of the total layer is not particularly limited, but is preferably 5%, more preferably 8%, and still more preferably 10%. On the other hand, the upper limit of the average thickness of the layer (2) with respect to the average thickness of the total layer is not particularly limited, but is preferably 70%, more preferably 60%, and still more preferably 50%.

Layer (3)

The layer (3) is provided between the layer (1) and the layer (2), and contains a carboxylic acid-modified polyolefin as a principal component. The layer (3) may serve as an adhesion layer between other layers such as between the layer (1) and the layer (2). It is to be noted that the carboxylic acid-modified polyolefin as referred to means an olefin-derived polymer having a carboxy group or an anhydride group therefrom, which may be obtained by chemically binding an ethylenic unsaturated carboxylic acid or an anhydride therefrom to an olefin-derived polymer through an addition reaction, a graft reaction, or the like.

The ethylenic unsaturated carboxylic acid and the anhydride therefrom are exemplified by a monocarboxylic acid, a monocarboxylic acid ester, a dicarboxylic acid, a dicarboxylic acid monoester, a dicarboxylic acid diester, a dicarboxylic acid anhydride, and the like. Specific examples of the ethylenic unsaturated carboxylic acid and the anhydride therefrom include maleic acid, fumaric acid, itaconic acid, maleic anhydride, itaconic anhydride, maleic acid monomethyl ester, maleic acid monoethyl ester, maleic acid diethyl ester, fumaric acid monomethyl ester, and the like. Of these, dicarboxylic acid anhydrides such as maleic anhydride and itaconic anhydride are preferred, and maleic anhydride is more preferred.

Examples of the olefin-derived polymer that serves as a base polymer include:

polyolefins such as low-density, medium-density or high-density polyethylene, linear low density polyethylene, polypropylenes and polybutenes;

copolymers of an olefin with a comonomer such as ethylene-vinyl acetate copolymers and ethylene-ethyl acrylate copolymers; and the like. The comonomer is not particularly limited as long as it can be copolymerized with an olefin, and is exemplified by a vinyl ester, an unsaturated carboxylic acid ester and the like. The olefin-derived polymer is preferably a linear low density polyethylene, an ethylene-vinyl acetate copolymer having a vinyl acetate content of 5% by mass or greater and 55% by mass or less, and an ethylene-ethyl acrylate copolymer having an ethyl acrylate content of 8% by mass or greater and 35% by mass or less, and more preferably a linear low density polyethylene and an ethylene-vinyl acetate copolymer having a vinyl acetate content of 5% by mass or greater and 55% by mass or less.

The carboxylic acid-modified polyolefin is obtained by introducing the ethylenic unsaturated carboxylic acid or the anhydride therefrom into the olefin-derived polymer in the presence of, for example, a solvent such as xylene and a catalyst such as a peroxide through an addition reaction or a graft reaction. In this procedure, the lower limit of the amount of addition or grafting of the carboxylic acid or the anhydride therefrom to the olefin-derived polymer (i.e., degree of modification) is preferably 0.01% by mass, and more preferably 0.02% by mass with respect to the olefin-derived polymer. Whereas, the upper limit of the amount of addition or grafting to the olefin-derived polymer (i.e., degree of modification) is preferably 15% by mass, and more preferably 10% by mass.

It is to be noted that the layer (3) may contain in addition to the carboxylic acid-modified polyolefin, other optional component similar to those which may be contained in the layer (1), within a range not leading to impairment of the effects of the present invention.

The lower limit of the average thickness of the layer (3) with respect to the average thickness of the total layer is not particularly limited, but is preferably 0.3%, more preferably 0.6%, and still more preferably 1.2%. The upper limit of the average thickness of the layer (3) with respect to the average thickness of the total layer is preferably 12%, more preferably 9%, and still more preferably 6%. When the average thickness of the layer (3) as the adhesive resin layer is less than the lower limit, the adhesiveness may be impaired. Further, when the average thickness of the layer (3) is greater than the upper limit, the cost may be increased.

Layer (4)

The layer (4) contains the EVOH (A), the thermoplastic resin and the carboxylic acid-modified polyolefin. In addition, the layer (4) is preferably formed by using a recovered material of the layer (1), layer (2) and layer (3) in the production process of the thermoformed container of the embodiment. Examples of the recovered material include burrs generated in the production process of the thermoformed containers, products failed an inspection, and the like. When the thermoformed container further includes the layer (4) as the regrind layer, a loss of the resin used in the production of the thermoformed container can be reduced through recycling of such burrs and/or products failed an inspection.

The layer (4) may be used as a substitute for the layer (2) described above. However, in general, the layer (4) is preferably used after being laminated with the layer (2) since the layer (4) usually has lower mechanical strength than the layer (2). Taking it into consideration that when the thermoformed container is subjected to an external impact, concentration of stress would occur in the container, and in the stress concentration area, a compression stress in response to the impact would be generated on the inner layer side of the container, which may lead to breakage, the layer (4) which is inferior in strength is preferably provided so as to be situated on the outer layer side with respect to the layer (1). Moreover, in a case where a large amount of the resin needs to be recycled, e.g., in the case of the generation of a large amount of the burr, the regrind layer as the layer (4) may be provided on both sides of the layer (1).

The upper limit of the content of the EVOH (A) in the layer (4) is preferably 9.0% by mass. When the content of the EVOH (A) in the layer (4) is greater than the upper limit, a crack is likely to be generated at the interface with the layer (2), and then the breakage of the entire thermoformed container, starting from the crack, may occur. It is to be noted that the lower limit of the content of the EVOH (A) in the layer (4) is, for example, 3.0% by mass.

The lower limit of the average thickness of the layer (4) with respect to the average thickness of the total layer is not particularly limited, but is preferably 10%, more preferably 20%, and still more preferably 30%. The upper limit of the average thickness of the layer (4) with respect to the average thickness of the total layer is preferably 60%, more preferably 55%, and still more preferably 50%.

Production Method of Multilayer Structure Used in Thermoformed Container

The multilayer structure used in the thermoformed container may be formed by using a molding apparatus. The multilayer structure may be formed so as to have a predetermined layer structural constitution by, for example, charging a resin composition for forming the layer (1), a resin composition for forming the layer (2), a resin composition for forming the layer (3), a resin composition for forming the layer (4) into separate extruders, and carrying out coextrusion using these extruders.

The extrusion molding of each layer is carried out by operating an extruder equipped with a single screw at a certain temperature. The temperature of an extruder for forming the layer (1) is adjusted to, for example, 170° C. or greater and 240° C. or less. In addition, the temperature of an extruder for forming the layer (2) is adjusted to, for example, 200° C. or greater and 240° C. or less. Furthermore, the temperature of an extruder for forming the layer (3) is adjusted to, for example, 160° C. or greater and 220° C. or less. Moreover, the temperature of an extruder for forming the layer (4) is adjusted to, for example, 200° C. or greater and 240° C. or less.

Thermoforming

The thermoformed container of this embodiment can be formed by heating the multilayer structure of the above embodiment in the form of a film, a sheet or the like to be softened, and thereafter subjecting the multilayer structure to molding so as to fit a die shape. The thermoforming procedure is exemplified by: a procedure involving carrying out the molding so as to fit a die shape by means of vacuum or compressed air, which may be used in combination with a plug as needed (a straight process, a drape process, an air slip process, a snap-back process, a plug-assist process, and the like); a procedure involving press molding; and the like. Various molding conditions such as the molding temperature, the degree of vacuum, the pressure of the compressed air, and the molding speed are appropriately selected in accordance with the shape of the plug and/or the die, as well as properties of a film and/or a sheet as a base material, and the like.

The molding temperature is not particularly limited as long as the resin is softened sufficiently to be molded at the temperature, and a suitable range of the temperature may vary in accordance with the construction of the multilayer structure such as the film and the sheet.

In a case where the film is subjected to thermoforming, it is desired that the temperature of heating is not: too high where melting of the film by heating occurs or the roughness of a metal surface of a heater plate is transferred to the film; or too low where shaping cannot be sufficiently attained. Specifically, the lower limit of the film temperature is typically 50° C., preferably 60° C., and more preferably 70° C. Moreover, the upper limit of the film temperature is typically 120° C., preferably 110° C., and more preferably 100° C.

On the other hand, in a case where the sheet is subjected to thermoforming, molding may be carried out at a higher temperature than that for the film. The heating temperature of the sheet is, for example, 130° C. or greater and 180° C. or less.

The production method of the thermoformed container of this embodiment is preferably a method including: the step of forming the first layer using a resin composition containing EVOH (A); and the step of thermoforming the multilayer structure that includes the layer (1).

In the layered structural constitution of the thermoformed container, the layer (2) is preferably provided as the outermost layer. In other words, providing in an order of: layer (2)/layer (3)/layer (1)/layer (3)/layer (2) from the inner surface of the retaining portion to the outer surface of the retaining portion (hereinafter, represented by, e.g., "(2)/(3)/(1)/(3)/(2) from the inner surface to the outer surface") is preferred in light of the impact resistance. Furthermore, in a case where the layer (4) that is a regrind layer is included, examples of the layered structural constitution include:

(2)/(3)/(1)/(3)/(4)/(2) from the inner surface to the outer surface;

(2)/(4)/(3)/(1)/(3)/(4)/(2) from the inner surface to the outer surface;

(4)/(3)/(1)/(3)/(4) from the inner surface to the outer surface; and the like.

It is to be noted that in these layered structural constitutions, the layer (4) may be provided in place of the layer (2). Of these, the layered structural constitution is preferably (2)/(3)/(1)/(3)/(4)/(2) from the inner surface to the outer surface, and (2)/(4)/(3)/(1)/(3)/(4)/(2) from the inner surface to the outer surface. It is to be noted that in the case of a construction in which the layer (1) to the layer (4) are each used in a plurality of number, the resin constituting each layer may be the same or different.

Cup-Shaped Container

Figure 2:
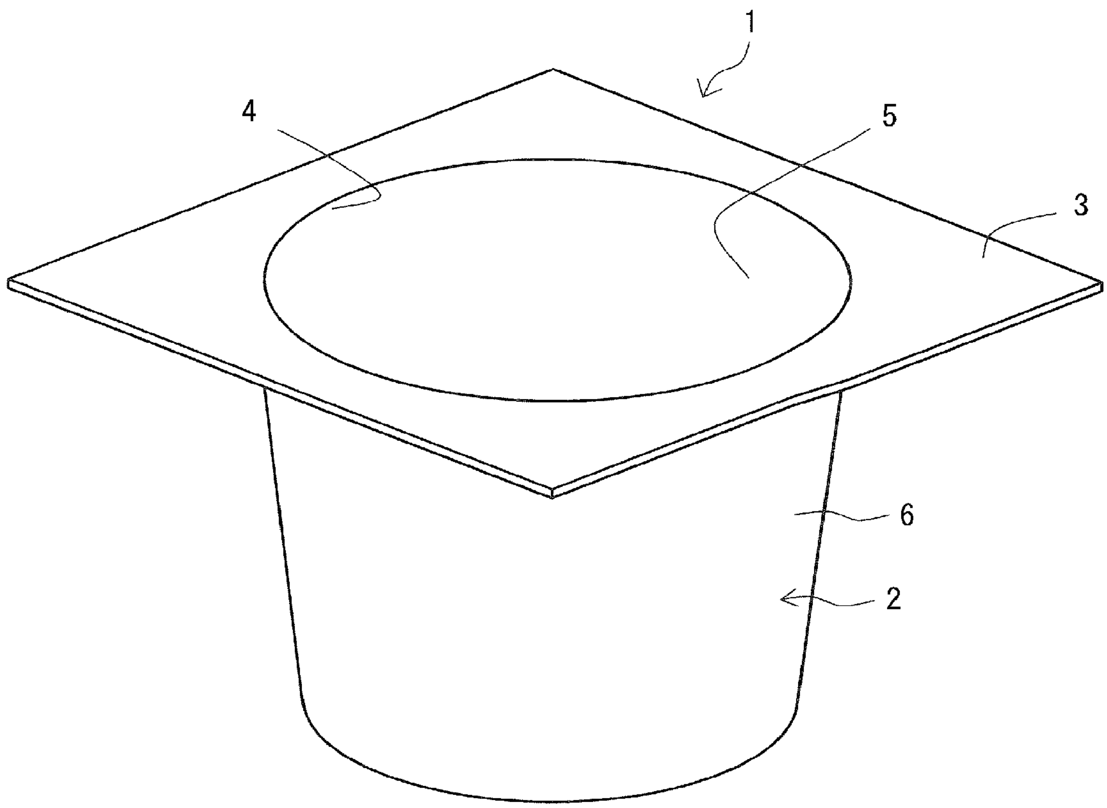
FIG. 2 shows a schematic perspective view illustrating a cup-shaped container which is one embodiment of the thermoformed container according to the present invention.
Figure 3:
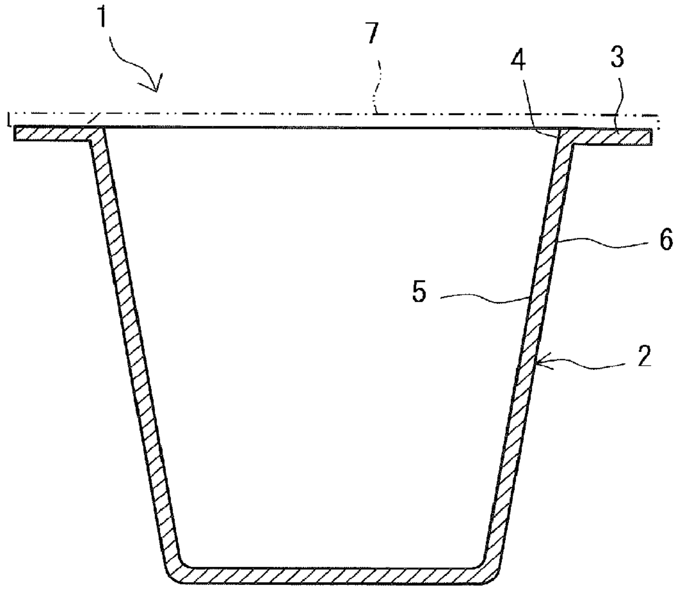
FIG. 3 shows a schematic cross sectional view illustrating the cup-shaped container shown in FIG. 2.

Next, a cup-shaped container shown in FIGS. 2 and 3 will be specifically described by way of an example of the thermoformed container according to the embodiment of the present invention. However, the cup-shaped container is merely an example of the thermoformed container of the above embodiment, and the following explanation of the cup-shaped container does not limit the scope of the present invention.

The cup-shaped container 1 shown in FIGS. 2 and 3 includes a cup main body 2 as the retaining portion, and a flange portion 3. The cup-shaped container 1 is used such that contents are retained in the cup main body 2 and thereafter a lid 7 as a sealer is attached to the flange portion 3 so as to seal an opening 4 of the cup main body 2. The sealer is exemplified by a resin film, a metal foil, a metal-resin composite film, and the like, and among these, a metal-resin composite film in which a metal layer is laminated on a resin film is preferred. Examples of the resin film include polyethylene films, polyethylene terephthalate films, and the like. The metal layer is not particularly limited, and is preferably a metal foil or a metal vapor-deposition layer, and is more preferably an aluminum foil in light of gas barrier properties and productivity.

The cup-shaped container 1 may be obtained by, for example, subjecting the multilayer structure of the above embodiment in a film form, a sheet form or the like to thermoforming. It is preferred that the multilayer structure includes at least the layer (1), and other layer is laminated on the layer (1). The other layer is exemplified by the layer (2), the layer (3), the layer (4), and the like.

Figure 4:
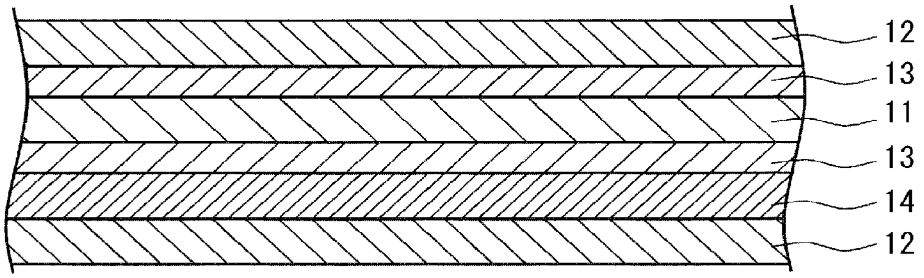
FIG. 4 shows a schematic cross sectional view illustrating a detail of the cup-shaped container shown in FIG. 2.

The layered structural constitution of the cup-shaped container 1 is preferably a structure shown in FIG. 4. In the layered structural constitution shown in FIG. 4, the layer (2)

12 is laminated on one face side (inner surface 5 side of the cup main body 2 of the cup-shaped container 1) of the layer (1) 11 via the layer (3) 13, and the layer (4) 14 and the layer (2) 12 are laminated on the other face side (outer surface 6 side of the cup main body 2 of the cup-shaped container 1) via the layer (3) 13.

Production Method of Cup-Shaped Container

Figure 5:
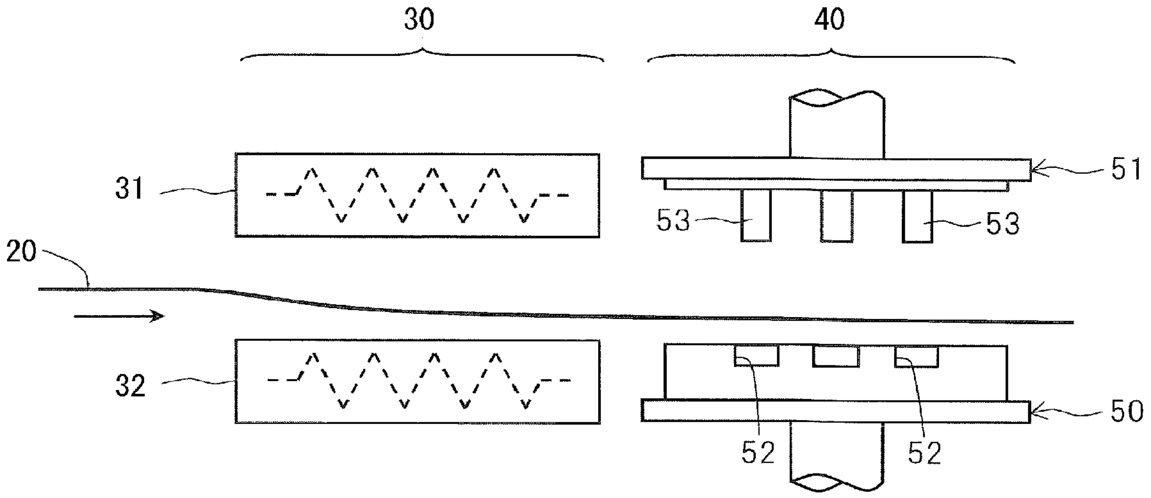
FIG. 5 shows a schematic view for illustrating the production method of the cup-shaped container shown in FIG. 2.

As shown in FIG. 5, the cup-shaped container 1 is produced by heating a continuous multilayer structure 20 in a film form, a sheet form or the like by means of the heating apparatus 30 to soften the continuous multilayer structure 20, and thereafter subjecting the softened continuous multilayer structure 20 to thermoforming using a die apparatus 40.

Heating Apparatus

The heating apparatus 30 is provided with a pair of heaters 31, 32, and is configured such that the continuous multilayer structure 20 can be passed between these heaters 31, 32. It is to be noted that an apparatus that can heat the continuous multilayer structure 20 by hot pressing may be used as the heating apparatus 30.

Die Apparatus

The die apparatus 40 is suitable for thermoforming by a plug-assist process, and includes a lower mold half 50 and an upper mold half 51 that are placed in a chamber (not shown in the Figure). The lower mold half 50 and the upper mold half 51 are configured such that they are each independently vertically movable, and in a state of being spaced apart from one another, the continuous multilayer structure 20 can be passed between the lower mold half 50 and the upper mold half 51. The lower mold half 50 includes a plurality of recessed parts 52 for shaping the retaining portion of the cup-shaped container 1. The upper mold half 51 includes a plurality of plugs 53 that protrude toward the lower mold half 50. The plurality of plugs 53 are each provided in the position corresponding to each of the plurality of recessed parts 52 of the lower mold half 50. Each plug 53 can be inserted into the corresponding recessed part 52.

Thermoforming

First, as shown in FIGS. 5 and 6(A), the lower mold half 50 is moved upward with respect to the continuous multilayer structure 20 which has been softened using the heating apparatus 30 to bring the softened continuous multilayer structure 20 into close contact with the lower mold half 50, and the continuous multilayer structure 20 is somewhat lifted up to apply tension to the continuous multilayer structure 20. Next, as shown in FIG. 6(B), the upper mold half 51 is moved downward, whereby the plugs 53 are inserted into each corresponding recessed part 52.

Subsequently, as shown in FIG. 6(C), the upper mold half 51 is moved upward to separate the plugs 53 from each corresponding recessed part 52, and the inside of the chamber (not shown in the Figure) is evacuated to bring the continuous multilayer structure 20 into close contact with the inner face of the recessed parts 52. Thereafter, the mold is cooled by blowing air thereto to fix the shape. As shown in FIG. 6(D), the inside of the chamber (not shown in the Figure) is then exposed to ambient air and the lower mold half 50 is moved downward to release the lower mold half 50, whereby a primary molded article is obtained. The primary molded article is cut away to give the cup-shaped container 1 shown in FIGS. 2 and 3.

Other Embodiment of Thermoformed Container

It is to be noted that the thermoformed container of the present embodiment may be formed by thermoforming a monolayer structure that includes only a first layer formed from the resin composition of the above embodiment. In this case, the thermoforming procedure, as well as the shape and the like of the thermoformed container may be similar to those of the thermoformed container of the above embodiment.

Blow-Molded Product

The blow-molded product of this embodiment includes the multilayer structure of the above embodiment. The blow-molded product can be used, for example, for blow-molded containers, and the like. The blow-molded product will be specifically described below by way of example with reference to a blow-molded container 105 shown in FIG. 7. It is to be noted that FIG. 7 shows a partially cross sectional view illustrating a peripheral wall of the blow-molded container 105.

Figure 7:
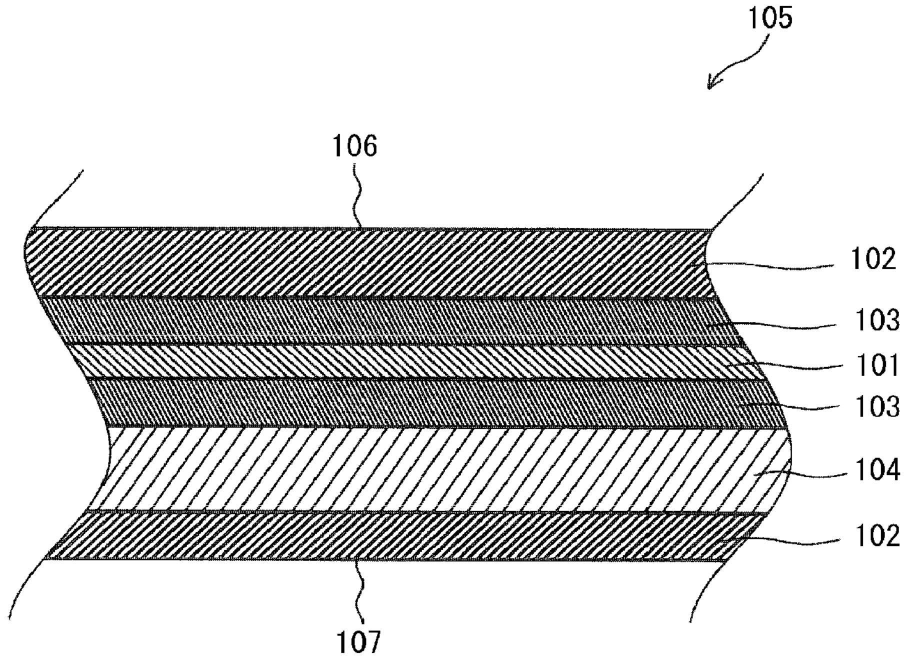
FIG. 7 shows a schematic partially cross sectional view illustrating a blow-molded container which is one embodiment of the blow-molded product according to the present invention.

The blow-molded container 105 shown in FIG. 7 includes:

(1) a layer 101 containing EVOH (A) as a principal component;

(2) a pair of layers 102 that are provided on one face side and other face side of the layer (1), and contain as a principal component a thermoplastic resin having a solubility parameter calculated using the Fedors equation of 11 $(cal/cm^3)^{1/2}$ or less;

(3) a pair of layers 103 that are provided between the layer (1) 101 and the layer (2) 102, and contain as a principal component a carboxylic acid-modified polyolefin; and (4) a layer 104 containing EVOH (A), a thermoplastic resin having a solubility parameter calculated using the Fedors equation of 11 $(cal/cm^3)^{1/2}$ or less, and a carboxylic acid-modified polyolefin.

Specifically, the blow-molded container 105 has a multilayer structure that includes from the container internal surface 106 to the container external surface 107, the layer (2) 102, the layer (3) 103, the layer (1) 101, the layer (3) 103, the layer (4) 104, and the layer (2) 102 laminated in this order.

The lower limit of the overall average thickness of the blow-molded container 105 is preferably 300 μm, more preferably 500 μm, and still more preferably 1,000. On the other hand, the upper limit of the overall average thickness of the blow-molded container 105 is preferably 10,000 μm, more preferably 8,500 μm, and still more preferably 7,000 μm. It is to be noted that the overall average thickness of the blow-molded container 105 as referred herein to means an average thickness of the blow-molded container 105 at a body thereof. When the overall average thickness is greater than the upper limit, a weight may increase, and for example, in the case of the use of the blow-molded container 105 in a fuel container of an automobile and the like, adverse effects on fuel consumption may be caused, and the production cost may also be increased. On the other hand, when the overall average thickness is less than the lower limit, the rigidity of the blow-molded container 105 may not be maintained, leading to easy breakage thereof. Therefore, it is important to select the overall average thickness in accordance with the volume and intended usages.

The component, the average thickness and the like of the layer (1) 101, the layer (2) 102, the layer (3) 103, and the layer (4) 104 may be similar to, for example, those of the layer (1), the layer (2), the layer (3) and the layer (4), respectively, of the thermoformed container described above, description of the same is omitted.

Production Method of Blow-Molded Container

The blow-molded container 105 is preferably produced by a method including the step of carrying out blow molding using a resin composition containing EVOH (A) as a principal component. Specifically, blow molding is carried out by using: dry EVOH-containing resin composition pellets that form the layer (1) 101; high density polyethylene, etc., for forming the layer (2) 102; an adhesive resin for forming the layer (3) 103; and a recovered resin, etc., for forming the layer (4) 104, in a blow-molding machine at a temperature of 100° C. or greater and 400° C. or less, for example, with a parison of 6 layers involving 4 types, i.e., layer (2)/layer (3)/layer (1)/layer (3)/layer (4)/layer (2) (hereinafter, denoted as "2/3/1/3/4/2, from the inside to the outside"), and then cooling at an internal temperature of the die of 10° C. or greater and 30° C. or less for 10 sec to for 30 min, whereby molding of a hollow container having the average thickness of the total layer of 300 μm or greater and 10,000 μm or less is enabled.

Other Embodiment of Blow-Molded Container

The blow-molded container according to the embodiment of the present invention is not limited to the aforementioned mode shown in FIG. 7, and is acceptable as long as at least the layer (1) is provided. Specifically, the (4) layer as the regrind layer, and the like may not be provided. Furthermore, other layer may also be laminated. In addition, by selecting a combination of resins that provide favorable adhesiveness, the layer (3) as the adhesion layer may be omitted.

When the blow-molded container is provided with the layer (2), the (2) layer is preferably provided as the outermost layer. In other words, providing 2/3/1/3/2 from the container inner surface toward the container outer surface is preferred in light of the impact resistance. Alternatively, when the (4) layer as the regrind layer, etc., is included, the construction of 2/3/1/3/4/2 from the inside to the outside, 2/4/3/1/3/4/2 from the inside to the outside, 4/3/1/3/4 from the inside to the outside or the like is preferred, the construction of 2/3/1/3/4/2 from the inside to the outside or 2/4/3/1/3/4/2 from the inside to the outside is more preferred. It is to be noted that a construction in which the (4) layer is included in place of the (2) layer is acceptable, and in the case of a construction in which the layers (1) to (4) are each used in a plurality of number, the resin constituting each layer may be the same or different.

Fuel Container

The fuel container of the embodiment of the present invention includes the blow-molded product of the above embodiment. The fuel container may be further provided with, in addition to the blow-molded product of the above embodiment, a filter, a fuel gauge, a baffle plate and the like. Due to being provided with the blow-molded container of the above embodiment, the fuel container is also superior in appearance characteristics, gas barrier properties, oil resistance and the like; therefore, it can be suitably used as a fuel container. The "fuel container" as referred to herein means a fuel container mounted in an automobile, a motorcycle, a watercraft, an aeroplane, an electric power generator, an industrial or agricultural instrument or the like, or a portable fuel container for supplying the fuel to such a fuel container, as well as a container for retaining the fuel. Further, typical examples of the fuel include gasoline, in particular, oxygen-containing gasoline prepared by blending gasoline with methanol, ethanol, MTBE or the like, and further heavy oil, light mineral oil, kerosene and the like are also included. The fuel container is particularly suitably used as a fuel container for oxygen-containing gasoline among these.

EXAMPLES

Hereinafter, the present invention is specifically explained by way of Examples, but the present invention is not in anyhow limited to these Examples.

Synthesis of EVOH

Synthesis Example 1: Synthesis of EVOH Pellets

Polymerization of Ethylene-Vinyl Acetate Copolymer

Into a 250-L pressurized reactor equipped with a jacket, a stirrer, a nitrogen-feeding port, an ethylene-feeding port and an initiator-adding port, 83 kg of vinyl acetate and 14.9 kg of methanol (hereinafter, referred to as MeOH) were charged, and the temperature was elevated to 60° C. Thereafter, the reaction liquid was bubbled with a nitrogen gas for 30 min so as to execute nitrogen replacement inside the reactor. Then, ethylene was introduced into the reactor so as to give the pressure (ethylene pressure) of 4.0 MPa. After regulating the temperature in the reactor to 60° C., 12.3 g of 2,2'-azobis(2,4-dimethylvaleronitrile) ("V-65", available from Wako Pure Chemical Industries, Ltd.) as an initiator was added in a methanol solution to start polymerization. During the polymerization, the ethylene pressure was maintained at 4.0 MPa and the polymerization temperature was maintained at 60° C. Five hrs later, when the conversion of vinyl acetate (rate of polymerization) reached 40%, the polymerization was stopped by cooling. Ethylene was evacuated from the reactor, and further a nitrogen gas was bubbled into the reaction liquid to completely remove ethylene. Then, after unreacted vinyl acetate was removed under a reduced pressure, an ethylene-vinyl acetate copolymer (hereinafter, referred to as EVAc) was obtained. To vinyl acetate used in the synthesis was added acetaldehyde at the content shown in Table 1.

Saponification

Methanol was added to the EVAc solution thus obtained to obtain an EVAc solution having a concentration of 15% by mass. To 253.4 kg of the methanol solution of EVAc (EVAc in the solution: 38 kg) was added 76.6 L of a methanol solution containing 10% by mass sodium hydroxide (molar ratio: 0.4 with respect to the vinyl acetate unit in EVAc), and the mixture was stirred at 60° C. for 4 hrs to allow EVAc to be saponified. Six hrs later after the start of the reaction, 9.2 kg of acetic acid and 60 L of water were added thereto to neutralize the reaction liquid, whereby the reaction was stopped.

Washing

The neutralized reaction liquid was transferred from the reactor to a cylindrical container, called drum, and left to stand at room temperature for 16 hrs so as to allow for hardening through cooling to give a cake form. Thereafter, the resin cake was deliquored by using a centrifugal separator ("H-130" available from KOKUSAN Co. Ltd., rotation frequency: 1,200 rpm). Next, a step of washing the resin with water was carried out for 10 hrs at the central part of the centrifugal separator while continuously feeding ion exchanged water from the above. The conductivity of the washing liquid 10 hrs later after the start of washing was 30 μS/cm (measured with "CM-30ET" available from TOA Electronics Ltd.).

Pelletizing

The washed resin was dried at 60° C. for 48 hrs by using a dryer to obtain powdery EVOH. The dried powdery EVOH in an amount of 20 kg was dissolved in 43 L of a mixed solution of water and methanol (mass ratio: water/methanol=4/6), and the mixture was stirred at 80° C. for 12 hrs. Next, the stirring was stopped and the temperature of the dissolver vessel was lowered to 65° C., followed by leaving to stand for 5 hrs, and degassing of the solution of EVOH in water and methanol. The solution was then extruded through a die plate provided with a circular opening having a diameter of 3.5 mm into a mixed solution of water and methanol (mass ratio: water/methanol=9/1) at 5° C. to permit deposition into a strand form, followed by cutting away to give pellets having a diameter of about 4 mm and a length of about 5 mm.

Purification

An operation of deliquoring the hydrous EVOH pellets by using a centrifugal separator, and further adding a large amount of water followed by deliquoring was repeated to execute washing, whereby EVOH pellets were obtained. The degree of saponification of EVOH thus obtained was 99 mol %.

Synthesis Examples 2 to 4 and Comparative Synthesis Example 1

EVOH was synthesized in a similar manner to Synthesis Example 1 except that the acetaldehyde content, the ethylene content and the degree of saponification of vinyl acetate were as shown in Table 1.

Synthesis Example 5

EVOH was synthesized in a similar manner to Synthesis Example 1 except that the acetaldehyde content, the ethylene content and the degree of saponification of vinyl acetate were as shown in Table 1 and that 50 ppm tartaric acid was further added to vinyl acetate.

Comparative Synthesis Example 2: Synthesis of Polyvinyl Acetate

Into a 6-L separable flask fitted with a stirrer, a thermometer, a nitrogen introducing tube, a reflux condenser were charged 2,555 parts by mass of a vinyl acetate monomer containing 500 ppm acetaldehyde which had been previously deoxygenated, 945 parts by mass of methanol containing 50 ppm acetaldehydedimethylacetal, and a 1% by mass tartaric acid solution in methanol (amount of addition with respect to the vinyl acetate monomer: 20 ppm), and the temperature was regulated to 60° C. in a stream of nitrogen. It is to be noted that an aqueous ethylene glycol solution at −10° C. was recycled in the reflux condenser. Thereafter, 18.6 mL of a 0.55% by mass di-n-propylperoxydicarbonate solution in methanol was added thereto to start polymerization. After starting the polymerization, the same di-n-propylperoxydicarbonate solution in methanol was continuously added at a rate of 20.9 mL/hour and the temperature during the polymerization was maintained at 60° C. until the polymerization was completed. Four hrs later after the start of polymerization, when the solid content concentration of the polymerization solution became 25.1% by mass, 1,200 parts by mass of methanol containing 0.0141 parts by mass of sorbic acid corresponding to three fold molar equivalent of di-n-propylperoxydicarbonate being undegraded and remaining in the polymerization liquid. The polymerization liquid was cooled to stop the polymerization. It is to be noted that the conversion of the vinyl acetate monomer (rate of polymerization) was 35.0% when the polymerization was stopped. After cooling to room temperature, the vinyl acetate monomer and methanol were distilled away under a reduced pressure with a water aspirator to permit deposition of polyvinyl acetate. An operation of adding 3,000 parts by mass of methanol to thus deposited polyvinyl acetate and dissolving polyvinyl acetate while warming to 30° C., and again conducting the distillation with the water aspirator under a reduced pressure was repeated three times. Methanol was added to thus deposited polyvinyl acetate, whereby a 40% by mass polyvinyl acetate solution in methanol was obtained in which the percentage of removal of vinyl acetate monomer was 99.8%. In addition, a part of thus resulting methanol solution was collected, and a 10% by mass sodium hydroxide solution in methanol was added thereto such that a molar ratio of sodium hydroxide to the vinyl acetate unit in polyvinyl acetate was 0.1. When a gelled matter was produced, the gel was ground, and Soxhlet extraction was carried out with methanol for 3 days. Thus obtained polyvinyl alcohol was dried, and a viscosity average degree of polymerization was measured, consequently indicating the degree of polymerization being 1,700. This was assumed as a reference for the degree of polymerization of polyvinyl acetate.

Comparative Synthesis Example 3: Synthesis of Polyvinyl Alcohol

To the 40% by mass polyvinyl acetate solution in methanol synthesized in Comparative Synthesis Example 2, a 8% by mass sodium hydroxide solution in methanol was added (molar ratio of sodium hydroxide to the vinyl acetate monomer unit in methanol and polyvinyl acetate: 0.020) such that the total solid content concentration (saponification concentration) was 30% by mass under stirring, and the saponification reaction was started at 40° C. When a gelled matter was produced as the saponification reaction proceeds, the gel was ground, and the ground gel was transferred to a container at 40° C. When 60 minutes have passed after starting the saponification reaction, the gel was immersed in a solution of methanol, methyl acetate and water (mass ratio: 25/70/5) to carry out a neutralization treatment. The swollen gel thus obtained was subjected to centrifugal separation, and two times by mass of methanol with respect to the mass of the swollen gel was added and immersion was allowed. After leaving to stand for 30 min, centrifugal separation was carried out. This operation of centrifugal separation, addition of methanol, leaving to stand and again centrifugal separation was repeated four times. By drying at 60° C. for 1 hour and then at 100° C. for 2 hrs, polyvinyl alcohol (PVA) was obtained.

Preparation of Resin Compositions of Examples 1 to 5 and Comparative Examples 1 and 2

EVOH pellets obtained in Synthesis Examples 1 to 5 and Comparative Synthesis Example 1, and 20 kg of PVA obtained in Comparative Synthesis Example 3 were washed with an aqueous acetic acid solution and ion exchanged water, and thereafter subjected to an immersion treatment in an aqueous solution containing sodium acetate. After separating resin composition chips from this aqueous solution for the immersion treatment to conduct deliquoring, by drying in a hot-air dryer at 80° C. for 4 hrs, and further drying at 100° C. for 16 hrs, resin compositions of Examples 1 to 5 and Comparative Example 1 (hereinafter, may be also referred to as "EVOH resin composition") were obtained as dry pellets. In addition, PVA synthesized in Comparative Synthesis Example 3 was prepared to give a resin composition of Comparative Example 2. By using the dry pellets, degree of saponification, ethylene content, alkali metal content, etc., of EVOH, etc., shown in Table 1 were determined in accordance with the method described below. It is to be noted that "-" in Table 1 denotes that the molecular weight was not determined since the resin was not dissolved in the solvent.

Ethylene Content and Degree of Saponification of EVOH

Dry EVOH pellets were ground by freeze grinding. The obtained grind EVOH was sieved with a sieve having a nominal dimension of 1 mm (according to standard sieve designation JIS-Z8801). Five grams of the EVOH powder having passed the sieve were immersed in 100 mL of ion exchanged water, and an operation of stirring the mixture 85° C. for 4 hours, followed by drying through deliquoring was repeated twice. Thus resulting washed powder EVOH was used for conducting $^1$H-NMR measurement under the following measurement conditions, and the ethylene content and the degree of saponification were determined in accordance with the analysis method described below.

Measurement Conditions

- apparatus: superconductive nuclear magnetic resonance apparatus ("Lambda 500" available from JEOL, Ltd.);
- observation frequency: 500 MHz;
- solvent: DMSO-$d_6$;
- polymer concentration: 4% by mass;
- measurement temperature: 40° C. and 95° C.;
- scan times: 600 times;
- pulse delay time: 3.836 sec;
- sample rotation speed: 10 Hz to 12 Hz; and
- pulse width (90° pulse): 6.75 μsec.

Analysis Method

When measured at 40° C., a peak of hydrogen in a water molecule around 3.3 ppm was observed, and this peak was overlapped by the peak of methine hydrogen of the vinyl alcohol unit of EVOH in the region of 3.1 ppm to 3.7 ppm. On the other hand, when measured at 95° C., the overlap found at 40° C. was not observed; however, the peak of hydrogen from the hydroxyl group in the vinyl alcohol unit of EVOH existing around 4 ppm to 4.5 ppm was overlapped by the peak of methine hydrogen of the vinyl alcohol unit of EVOH in the region of 3.7 ppm to 4 ppm. Thus, for the quantitative determination of methine hydrogen of the vinyl alcohol unit in EVOH (3.1 ppm to 4 ppm), in order to avoid the overlap by the peak of hydrogen from water or the hydroxyl group, measurement data at 95° C. were employed in the region of 3.1 ppm to 3.7 ppm, whereas measurement data at 40° C. were employed in the region of 3.7 ppm to 4 ppm, and the total amount of methine hydrogen was quantitatively determined in terms of the total value of these. It is to be noted that the peak of hydrogen from water or a hydroxyl group has been known to shift to the high magnetic field side by elevating the measurement temperature. Therefore, the analysis was performed by using both measurement results at 40° C. and 95° C. as in the following. From the spectrum measured at ° C. as described above, an integrated value ($I_1$) of chemical shift peak at 3.7 ppm to 4 ppm, and an integrated value ($I_2$) of chemical shift peak at 0.6 ppm to 1.8 ppm were determined.

On the other hand, from the spectrum measured at 95° C., an integrated value ($I_3$) of chemical shift peak at 3.1 ppm to 3.7 ppm, and an integrated value ($I_4$) of chemical shift peak at 0.6 ppm to 1.8 ppm were determined. In this regard, the chemical shift peak at 0.6 ppm to 1.8 ppm is derived from mainly methylene hydrogen, whereas the chemical shift peak at 1.9 ppm to 2.1 ppm is derived from methyl hydrogen in saponified vinyl acetate unit. From these integrated values, the ethylene content was calculated in accordance with the following formula (5), and the degree of saponification was calculated in accordance with the following formula (6).

$$\text{ethylene content (mol \%)} = \frac{3I_2I_4 - 6I_1I_4 + 6I_2I_3 + 2I_2I_5}{3I_2I_4 + 6I_1I_4 + 18I_2I_3 + 6I_2I_5} \times 100 \tag{5}$$

$$\text{degree of saponification (mol \%)} = \frac{I_1/I_2 + I_3/I_4}{I_1/I_2 + I_3/I_4 + I_5/3I_4} \times 100 \tag{6}$$

Alkali Metal Content

The alkali metal content was quantitative determined by using a spectrophotometric apparatus. Specifically, 0.5 g of dry EVOH pellets were added to a Teflon (registered trademark) pressure container available from Actac Project Services Corporation, and then 5 mL of nitric acid (for accurate analysis available from Wako Pure Chemical Industries, Ltd.) was added thereto. After the pressure container was left to stand for 30 min, the container was closed with a cap lip having a rupture disk, and the dry EVOH pellets were treated at 150° C. for 10 min, and then 180° C. for 10 min using a microwave high speed decomposition system ("speedwave MWS-2" available from Actac Project Services Corporation), whereby the dry EVOH pellets were decomposed. It is to be noted that in the aforementioned treatment, in the case where the decomposition of the dry EVOH pellets was incomplete, the treatment conditions were appropriately adjusted. The resulting decomposition product was diluted with 10 mL of ion exchanged water, all the liquid was transferred to a 50 mL volumetric flask, and the volume of the liquid was adjusted to 50 mL with ion exchanged water, whereby a decomposition solution was prepared. The decomposition solution was subjected to a quantitative determination analysis at a wavelength for Na of 589.592 nm by using an ICP optical emission spectrophotometer ("Optima 4300 DV" available from PerkinElmer Japan Co., Ltd.) whereby the alkali metal content was measured.

Melt Viscosity (Melt Flow Rate)

The melt viscosity (melt flow rate) was measured in accordance with JIS-K7210 (1999) at a temperature of 190° C., with a load of 2,160 g.

Measurement of Molecular Weight of EVOH

Preparation of Measurement Sample

The measurement EVOH sample was prepared by a heating treatment in a nitrogen atmosphere at 220° C. for 50 hrs.

GPC Measurement

GPC measurement was carried out by using "GPCmax" available from VISCOTECH Co. Ltd. The molecular weight was calculated based on signal strengths detected by a differential refractive index detector and an ultraviolet and visible absorbance detector. As the differential refractive index detector and the ultraviolet and visible absorbance detector, "TDA305" and "UV Detector 2600" available from VISCOTECH Co. Ltd., were used. The cell for detection in the absorbance detector used had an optical path length of 10 mm. GPC column used was "GPC HFIP-806M" available from Showa Denko K.K. Co. Ltd. In addition, the analysis soft used was "OmniSEC (Version 4.7.0.406)" attached to the apparatus.

Measurement Conditions

The measurement sample was collected, and dissolved in hexafluoroisopropanol (hereinafter, referred to as "HFIP") containing 20 mmol/L sodium trifluoroacetate to prepare a 0.100 wt/vol % solution. For the measurement, a solution filtered through a 0.45 μm polytetrafluoroethylene filter was used. The measurement sample was dissolved by leaving to stand at room temperature overnight.

The mobile phase used was 20 mmol/L sodium trifluoroacetate-containing HFIP. The flow rate of the mobile phase was 1.0 mL/min. The amount of injected sample was 100 μL, and the measurement was conducted at a GPC column temperature of 40° C.

It is to be noted that for the sample exhibiting the viscosity average degree of polymerization of PVA exceeding 2,400, the GPC measurement was carried out by using a sample (100 μL) appropriately diluted. The absorbance for the case of the sample concentration being 1.00 mg/mL was calculated from the found value in accordance with the following formula (7). In the formula (7), α (mg/mL) represents the concentration of the diluted sample.

$$\text{Absorbance}=(1.00/\alpha)\times\text{actual measured value of absorbance} \quad (7)$$

Production of Calibration Curve

The calibration curve for converting the elution volume into the molecular weight of PMMA was produced by measuring as an authentic sample, polymethyl methacrylate (hereinafter, abbreviated as "PMMA") (peak top molecular weights: 1,944,000; 790,000; 467,400; 271,400; 144,000; 79,250; 35,300; 13,300; 7,100; 1,960; 1,020; and 690) available from Agilent Technologies, each with an differential refractive index detector and an absorbance detector. For the production of each calibration curve, the analysis software described above was used. It is to be noted that according to this measurement, a column enabling separation of the standard sample peaks of both molecular weights of 1,944,000 and 271,400 was used in the measurement of PMMA.

It is to be noted that the peak strength obtained from the differential refractive index detector was represented in terms of "mV", and when a PMMA sample available from American Polymer Standard Corp. (PMMA 85 K: weight average molecular weight being 85,450; number average molecular weight being 74,300; and intrinsic viscosity being 0.309) was used at a concentration of 1.000 mg/mL as the standard sample, the peak strength was 358.31 mV.

In addition, the peak strength obtained from the ultraviolet and visible absorbance detector was represented by the absorbance (absorbance unit), and the absorbance from the ultraviolet and visible absorbance detector was converted by the analysis software, based on the equality of "1 absorbance unit=1,000 mV".

TABLE 1

| | Vinyl acetate acetaldehyde content (ppm) | Resin composition: ethylene content (mol %) | degree of saponification (mol %) | alkali metal salt (B1) content[1] (ppm) | Melt viscosity MFR (g/10 min) | Molecular weight[3]: RI (Ma) | UV (at 220 nm) (Mb) | UV (at 280 nm) (Mc) | Molecular weight correlation: (Ma − Mb)/Ma | (Ma − Mc)/Ma |
|---|---|---|---|---|---|---|---|---|---|---|
| Example 1 | 50 | 32 | 99 | 200 | 2.1 | 62,000 | 42,000 | 37,000 | 0.323 | 0.403 |
| Example 2 | 30 | 32 | 99 | 500 | 1.5 | 47,000 | 47,000 | 46,000 | 0 | 0.021 |
| Example 3 | 20 | 32 | 99 | 200 | 1.7 | 53,000 | 52,000 | 49,000 | 0.019 | 0.075 |
| Example 4 | 10 | 32 | 99 | 100 | 1.5 | 56,000 | 53,000 | 49,000 | 0.054 | 0.125 |
| Example 5 | 120 | 32 | 99 | 200 | 2.1 | 62,000 | 41,000 | 35,000 | 0.338 | 0.435 |
| Comparative Example 1 | 110 | 32 | 99 | 200 | 1.5 | 64,000 | 35,000 | 33,000 | 0.453 | 0.484 |
| Comparative Example 2 | 500 | 0 | 99 | 7,000 | measurement failed[2] | — | — | — | — | — |

[1] metal equivalent

[2] measurement failed due to increase in viscosity in melt indexer

[3] after subjecting to a heat treatment in a nitrogen atmosphere at 220° C. for 50 hrs Evaluations of EVOH Resin Compositions of Examples 1 to 5 and Comparative Example 1

Flaws in formed film and film appearance characteristics (streak and coloring of roll edge) were evaluated on the EVOH resin compositions of Examples 1 to and Comparative Example 1 thus obtained as in the following. The results of the evaluations are shown in Table 2. It is to be noted that PVA of Comparative Example 2 exhibited severe gelation, leading to a failure of film formation, and therefore, flaws in formed film and film appearance characteristics were not evaluated, which evaluation items on the EVOH resin composition and PVA are indicated by "-" in Table 2.

(1) Evaluation of Flaws in Formed Film

A monolayer film having a thickness of 20 μm was produced from the dry pellets of each EVOH resin composition using a single screw extrusion apparatus ("D2020" available from Toyo Seiki Seisaku-sho, Ltd.; D (mm)=20, L/D=20, compression ratio=2.0; screw: full flight). Each condition in this test was as shown below.

extrusion temperature: 250° C.;
screw rotation speed: 40 rpm;
die width: 30 cm;
take-up roll temperature: 80° C.; and
take-up roll speed: 3.1 m/min.

A monolayer film was produced by a continuous operation under the condition described above, and with respect to the film produced after 10 hours and after 50 hours from the start of the operation, the number of flaws per film length of 17 cm was counted. The counting of the number of flaws was carried out using a film flaw inspection apparatus ("AI-10" available from Frontier system Inc.). It is to be noted that the detection camera of the film flaw inspection apparatus was installed such that the lens thereof was positioned at a distance of 195 mm from the film surface. The flaws in formed film were evaluated to be: "favorable (A)" in the case where the number of flaw was less than 50; "somewhat favorable (B)" in the case where the number of flaw was 50 or greater and less than 200; and "unfavorable (C)" in the case where the number of flaw was 200 or greater.

(2) Evaluation of Film Appearance Characteristics

On films formed 10 hrs later and 50 hrs later after the start of the operation, appearance characteristic (streak) was evaluated by visual observation in accordance with the following evaluation criteria. In addition, a film 100 m in length was wound up around a paper tube to produce a roll, and the coloring was evaluated based yellowing of the roll edge.

Evaluation Criteria of Streak favorable (A): no streak being found;

somewhat favorable (B): any streak being found; and unfavorable (C): a large number of streaks being found.

Evaluation Criteria of Coloring of Roll Edge favorable (A): colorless;

somewhat favorable (B): yellowed; and unfavorable (C): significantly yellowed.

TABLE 2

| | Flaws in formed film | | Streak | | Roll edge coloring | |
|---|---|---|---|---|---|---|
| | 10 hrs later | 50 hrs later | 10 hrs later | 50 hrs later | 10 hrs later | 50 hrs later |
| Example 1 | B | B | B | B | B | B |
| Example 2 | B | B | B | B | B | B |
| Example 3 | A | B | A | B | A | B |
| Example 4 | A | A | A | A | A | A |
| Example 5 | B | B | B | B | B | B |
| Comparative Example 1 | C | C | C | C | C | C |
| Comparative Example 2 | — | — | — | — | — | — |

As shown in Table 2, according to the EVOH resin compositions of Examples 1 to 5, generation of flaws in formed film, streaks, and coloring of roll edge of the films formed 10 hrs and 50 hrs later after the start of the operation was inhibited. In other words, the EVOH resin compositions of Examples 1 to 5 successfully formed a film that was superior in long-run stability in melt molding, and also superior in appearance characteristics.

To the contrary, according to the EVOH resin composition of Comparative Example 1, a large number of both flaws in formed film and streaks were found on any films formed 10 hrs and 50 hrs later after the start of the operation, with the roll edges thereof markedly yellowing.

Example 6 (Coextrusion Sheet Molding Process (Plus Extrusion Temperature))

A multilayer sheet was produced by using the EVOH resin composition obtained in Example 4, and the appearance characteristics were evaluated thereon. Specifically, the EVOH resin composition, an ethylene-α-olefin copolymer, and a carboxylic acid-modified polyolefin were charged into each separate extruder, and a multilayer sheet having the average thickness of the total layer of 500 μm and having a constitution of five layers involving three types: ethylene-α-olefin copolymer/carboxylic acid-modified polyolefin/EVOH resin composition/carboxylic acid-modified polyolefin/ethylene-α-olefin copolymer (average film thickness: 200 μm/25 μm/50 μm/25 μm/200 μm) was obtained by using a coextrusion sheet molding apparatus. The extrusion molding was carried out by operating: for the ethylene-α-olefin copolymer, an extruder provided with a single screw having a diameter of 65 mm and L/D of 22 at a temperature of 200° C. to 240° C.; for the carboxylic acid-modified polyolefin, an extruder provided with a single screw having a diameter of 40 mm and L/D of 26 at a temperature of 200° C. to 240° C.; and for the EVOH resin composition, an extruder provided with a single screw having a diameter of 40 mm and L/D of 22 at a temperature of 200° C. to 240° C., with a feed block die (width: 600 mm) at a temperature of 250° C. The preset temperature of the feed block die (width: 600 mm) was 250° C., which is higher than usual by about 10° C. The appearance characteristics were evaluated on the sheet after continuous molding for 10 hrs, and consequently, the film appearance was favorable.

Next, Examples of the resin compositions of the present invention further containing inorganic particles (C) are demonstrated. First, the quantitative determination method, production method, and measuring method of mean particle size of the inorganic particles (C) will be described.

Quantitative Determination of Inorganic Particles (C)

For the content of each inorganic particle (C), the metal element was quantitatively determined by a similar procedure to the measurement of the alkali metal content described above, and the calculation was executed in terms of a value of oxide equivalent. More specifically, the calculation was executed in terms of silicon oxide, aluminum oxide, magnesium oxide, zirconium oxide, cerium oxide, tungsten oxide, and/or molybdenum oxide. In the case where a plurality of metals were included, the calculation was executed in terms of the amount of the plurality of metal oxides. For the amount of phosphorus compound, the phosphorus element was quantitatively determined, and the calculation was executed in terms of a value of phosphate radical equivalent. For the content of the boron compound, the calculation was executed in terms of a value of boron element equivalent.

The wavelength employed for the measurement of each metal element is shown below.

Na: 589.592 nm
K: 766.490 nm
Mg: 285.213 nm
Ca: 317.933 nm
P: 214.914 nm
B: 249.667 nm
Si: 251.611 nm
Al: 396.153 nm
Zr: 343.823 nm
Ce: 413.764 nm
W: 207.912 nm
Mo: 202.031 nm

Production of Inorganic Particles (C)

As the inorganic particles (C) that include a silicon atom, "Sylysia 380" (mean particle size: 9.0 μm) or "Sylysia 310P" (mean particle size: 2.7 μm), each available from Fuji Silysia Chemical Ltd., was ground and classified by a sieve to adjust the size as desired.

Measurement of Mean Particle Size of Inorganic Particles (C)

The mean particle size of the inorganic particles (C) was measured by using a "laser diffraction particle size distribution analyzer (SALD-2200)" available from Shimadzu Corporation. The evaluation sample was prepared by: placing 50 cc of pure water and 5 g of the inorganic particles (C) to be measured into a glass beaker; stirring the mixture by using a spatula; and thereafter, carrying out a dispersion treatment with an ultrasonic cleaning device for 10 min. Next, the liquid containing the inorganic particles (C) subjected to the dispersion treatment was charged into a sampler part of the apparatus, and the measurement was conducted when a stable absorbance was observed. Then, particle size distribution (particle size and relative particle amount) was calculated from the light intensity distribution data of diffraction/scattering light of the particles. The mean particle size was determined from: an integrated value of values obtained by multiplying the determined particle size by the relative particle amount; and the relative particle amount, through dividing the integrated value by the total of the relative particle amount. It is to be noted that the mean particle size was the average diameter of the particles.

Preparation of EVOH Resin Composition Having Inorganic Particles (C)

Examples 7 to 10 and Comparative Example 3

To the EVOH resin compositions of Examples 1 to 4 and Comparative Example 1 were added the inorganic particles (C) as shown in Table 3 to obtain dry pellets of the EVOH resin compositions of Examples 7 to 10 and Comparative Example 3.

TABLE 3

| | EVOH resin composition | Inorganic particle (C) type | Inorganic particle (C) mean particle size (μm) | Inorganic particle (C) content (ppm) |
|---|---|---|---|---|
| Example 7 | Example 1 | $SiO_2$ | 2.7 | 103 |
| Example 8 | Example 2 | $SiO_2$ | 2.7 | 3,900 |
| Example 9 | Example 3 | $SiO_2$ | 2.7 | 300 |
| Example 10 | Example 4 | $SiO_2$ | 2.7 | 160 |
| Comparative Example 3 | Comparative Example 1 | $SiO_2$ | 2.7 | 4,800 |

Evaluations of EVOH Resin Compositions of Examples 7 to 10 and Comparative Example 3

A film and a multilayer structure were produced by a method described later, and the EVOH resin compositions of Examples 7 to 10 and Comparative Example 3 were evaluated by using the film and the multilayer structure.

Production of Film

The dry EVOH pellets obtained as above were molten at 240° C., and concurrently with extrusion on casting rolls from a die, the air was blown at a rate of 30 m/sec by using an air knife to obtain an unstretched film of EVOH having an average thickness of 170 μm. This EVOH unstretched film was brought into contact with hot water at 80° C. for 10 sec, and by using a tenter-type simultaneous biaxial stretching machine, the film was stretched 3.2 times in the machine direction and 3.0 times in the width direction in an atmosphere of 90° C. Furthermore, the stretched film was subjected to a heat treatment in the tenter at 170° C. for 5 sec. Then the film edge was cut away to obtain the following biaxially stretched film.

film average thickness: 12 μm;
film average width: 50 cm;
wound film average length: 4,000 m; and
number of rolls: 100.

Determination of Color of Film Edge

The biaxially stretched film thus obtained was wound up around a paper tube, and the color of the film edge was evaluated as follows by a visual inspection.

Evaluation Criteria

A: no coloring;
B: pale yellow; and
C: colored.

Measurements of Arithmetic Average Height (Ra) and Average Length of Contour Curve Element (RSm) of Film Surface On the surface of the biaxially stretched film obtained as above, arithmetic average roughness (Ra) and average length of contour curve element (RSm) were measured by using "3D Laser Scanning Microscope VK-X200" available from Keyence Corporation, in accordance with JIS-B0610-2001. The measurement was conducted with n=100, and the average value was decided to be each measurement value. Ra and RSm were evaluated as follows, respectively.

Evaluation Criteria of Arithmetic Average Roughness (Ra)

A: 0.20 μm or greater and 0.40 μm or less;
B: 0.15 μm or greater and less than 0.20 μm, or greater than 0.40 μm and 0.60 μm or less; and
C: 0.10 μm or greater and less than 0.15 μm, or greater than 0.60 μm and 0.80 μm or less.

Evaluation Criteria of Average Length of Contour Curve Element (RSm)

A: 200 μm or greater and 400 μm or less;
B: 150 μm or greater and less than 200 μm, or greater than 400 μm and 600 μm or less; and
C: 100 μm or greater and less than 150 μm, or greater than 600 μm and 800 μm or less.

Evaluation of Film Breakage Resistance

The biaxially stretched film obtained as above was applied to a slitter, and wound while imparting a tension of 100 N/m to the film roll. The number of breakage times was then evaluated as follows.

Evaluation Criteria

A: 0 to once/100 rolls;
B: 2 to 4 times/100 rolls; and
C: 5 to 7 times/100 rolls.

Production of Multilayer Structure

The biaxially stretched film of 100 rolls obtained as above was used to obtain a multilayer structure (vapor-deposited film) by vapor deposition with aluminum on one side of the film with a batch-type vapor deposition equipment "EWA-105" available from ULVAC, Inc., at a film line speed of 200 m/min.

Measurement of Thickness of Metal Vapor-Deposition Layer

The multilayer structure obtained as above was cut with a microtome to expose the cross section. This cross section was observed with a scanning electron microscope (SEM), and the thickness of the metal vapor-deposition layer was measured. SEM observation was carried out by using "ZEISS ULTRA 55" available from SII Nano Technology, Inc., with a backscattered electron detector.

An inhibitory ability of vapor deposition flaw of the multilayer structure obtained was evaluated as follows.

Measurement of Number of Vapor Deposition Flaw (1)

The first roll of the multilayer structure obtained as above was applied to a slitter, and was unwound while illuminating with fluorescent light at 100 W from beneath of the film. The number of vapor deposition flaw was counted with n=10, over the area with a width of 0.5 m and a length of 2 m. The average value of the number was defined as number of vapor deposition flaw per 1 $m^2$, and evaluated as follows:

A: 0 to 20 flaws/$m^2$;
B: 21 to 40 flaws/$m^2$; and
C: 41 to 60 flaws/$m^2$.

Measurement of Number of Vapor Deposition Flaw (2) (Time-Dependent Alteration of Number of Vapor Deposition Flaw)

The 100th roll of the multilayer structure obtained as above was applied to a slitter, and was unwound while illuminating with fluorescent light at 100 W from beneath of the film. The number of vapor deposition flaw was counted with n=10, over the area with a width of 0.5 m and a length of 2 m. The average value of the number was defined as number of vapor deposition flaw per 1 $m^2$, and evaluated as follows:

A: 0 to 20 flaws/$m^2$;

B: 21 to 40 flaws/$m^2$; and

C: 41 to 60 flaws/$m^2$.

Evaluation of Degree of Time-dependent Increase of Number of Vapor Deposition Flaw As an indicative of long-run stability in melt molding of the EVOH resin composition, the degree of time-dependent increase of the number of vapor deposition flaw was evaluated as follows.

Evaluation Criteria

A: no difference found in level of vapor deposition flaw between first and 100th multilayer structures;

B: one difference found in level of vapor deposition flaw between first and 100th multilayer structures; and C: two differences found in level of vapor deposition flaw between first and 100th multilayer structures.

For the evaluation of adhesion strength between the vapor-deposition layer and other resin layer in the multilayer structure and the film formed from the EVOH resin composition, the following measurement was conducted.

Measurement of Adhesion Strength between Vapor-Deposition Layer and EVOH Film Layer On a surface of the metal vapor-deposition layer side of the multilayer structure obtained as above, an adhesive for dry lamination (Mitsui Chemicals, Inc., "TAKELAC A-385/A-50 (solution in ethyl acetate prepared by mixing in a mass ratio of 6/1 to give a solid content concentration of 23% by mass)" was coated by using a bar coater No. 12 available from Dai-ichi Rika Co., Ltd., and after hot-air drying at 50° C. for 5 min, lamination with a PET film ("E5000" available from Toyobo Co., Ltd.; average thickness: 12 μm) was carried out with nip rolls heated to 80° C. In this step, a half of the film was provided with a part where that failed to be laminated, by sandwiching an aluminum foil therebetween. Then, a laminated film was obtained after aging at 40° C. for 72 hrs. The laminated film thus obtained was cut away into a short strip of 100 mm×15 mm with the boundary with the aluminum vapor deposition being centered. Then, a T-peel test was carried out five times by a tensile tester at a tensile rate of 10 mm/min. An average value of the resulting measurement values was herein defined as an adhesion strength. The adhesion strength was evaluated as follows.

Evaluation Criteria

A: 500 g/15 mm or greater;

B: 450 or greater and less than 500 g/15 mm; and

C: 400 or greater and less than 450 g/15 mm.

Production of Film by Biaxial Stretching

A film was produced in accordance with the method of film formation of the EVOH resin composition in Example 10, in which a simultaneous biaxial stretching machine was used, and each physical property was evaluated. The arithmetic average roughness (Ra) of the film surface measured in accordance with JIS-B0601 was 0.28 μm, and the average length of contour curve element (RSm) was 298 μm, both falling within the evaluation criteria A. In addition, after Rollin up, no yellow coloring of the roll edge face was found, falling within the evaluation criteria A. Furthermore, the number of breakage times in film processing was once, falling within the evaluation criteria A. The average thickness of the vapor-deposition layer in the produced multilayer structure (multilayer structure having an aluminum vapor-deposition layer) was nm. The number of the vapor deposition flaw in the first roll of the multilayer structure was 9 flaws/$m^2$, whereas the umber of the vapor deposition flaw in the 100th roll of the multilayer structure was 12 flaws/$m^2$, both falling within the evaluation criteria A. Accordingly, the time-dependent increase of the number of vapor deposition flaw fell within the evaluation criteria A. The adhesion strength between the vapor-deposition layer and the EVOH film layer in the multilayer structure was 530 g/15 mm, falling within the evaluation criteria A.

Production of Film by Casting Process

The EVOH resin composition obtained was molten at 240° C., and extruded on casting rolls from a die. After cutting off the film edge, a film roll was obtained by winding up. Accordingly, it was possible to obtain a film roll that was superior in appearance characteristics.

Production of Film Packaging Material (Pouch)

Using: the EVOH film having the multilayer structure obtained as above (multilayer structure having an aluminum vapor-deposition layer), as an intermediate layer; a PET film ("E5000" available from Toyobo Co., Ltd.) as an outer layer (metal vapor-deposition layer side of the multilayer structure (multilayer structure having an aluminum vapor-deposition layer)); and an unstretched polypropylene film (hereinafter, abbreviated as CPP; "RXC-18" available from Tohcello Co., Ltd., thickness: 60 μm) as an inner layer (EVOH layer side of the multilayer structure (multilayer structure having an aluminum vapor-deposition layer)), a multilayer structure having a layer structure of: PET/adhesive layer/EVOH layer/adhesive layer/CPP was obtained. An adhesive for dry lamination (Mitsui Chemicals, Inc., "TAKELAC A-385/A-50 (solution in ethyl acetate prepared by mixing in a mass ratio of 6/1 to give a solid content concentration of 23% by mass)" was coated by using a bar coater on one face of PET, and one face of CPP, hot-air dried at 50° C. for 5 min, and thereafter, the PET film and the CPP film were pasted together on the adhesive faces such that the EVOH film having the multilayer structure is sandwiched. Aging was carried out at 40° C. for 5 days to obtain the aforementioned multilayer structure. Next, the multilayer structure thus obtained was heat-sealed to form into a pouch, and packed with 100 g of water.

The results of the evaluations on the films and multilayer structures produced by using each EVOH resin composition are shown in Table 4.

TABLE 4

| | Thickness of metal vapor-deposition layer (nm) | Arithmetic average roughness (Ra) | Average length of contour curve element (RSm) | Color of film edge portion | Number of breakage times | Number of vapor deposition flaw | Time-dependent alteration of number of vapor deposition flaw | Time-dependent increase of number of vapor deposition flaw | Adhesion strength |
|---|---|---|---|---|---|---|---|---|---|
| Example 7 | 50 | B | B | B | B | B | B | B | A |
| Example 8 | 50 | B | B | B | B | B | B | B | A |
| Example 9 | 50 | A | A | B | B | B | A | A | A |
| Example 10 | 50 | A | A | A | A | A | A | A | A |
| Comparative Example 3 | 50 | C | C | C | C | C | C | C | C |

As is clear from the results shown in Table 4, the films produced by using the EVOH resin compositions of Examples were superior in appearance characteristics and film breakage resistance. In addition, among the multilayer structures, the multilayer structures obtained by vapor deposition of a metal on the film exhibited fewer vapor deposition flaw, and were superior in adhesion strength between the vapor deposition layer and the EVOH film layer. On the other hand, one including the EVOH (A), deviating from the range in satisfying the inequality (1), was inferior in these characteristics.

Next, Examples of the resin compositions further containing the polyolefin (D) will be described.

Preparation of EVOH Resin Composition Having Polyolefin (D)

Example 11

A mixture was obtained by mixing: 5.5 parts by mass of the EVOH resin composition of Example 1; as the polyolefin (D), 87 parts by mass of low density polyethylene (LDPE) ("HZ8200B" available from Prime Polymer Co., Ltd.) being a unmodified polyolefin; 7.5 parts by mass of maleic anhydride-modified polyethylene ("Admer GT-6A" available from Mitsui Chemicals, Inc.) being an acid-modified polyolefin; and as a fatty acid metal salt, 0.15 parts by mass of zinc stearate.

Under the pelletizing condition shown below, the aforementioned mixture was melt-kneaded to obtain 20 kg of an EVOH resin composition of Example 10 having the formulation shown in Table 5. An operation of melt-kneading the EVOH resin composition thus obtained again, and taking out of the kneading machine was repeated. Thus, each 20 kg of the resin composition having been subjected to the melt-kneading five or ten times (hereinafter, may be also referred to as "number of recovery times") was also obtained (hereinafter, may be also referred to as "resin composition (J)"). It is to be noted that the melt-kneading temperature of these resin compositions was 250° C., which is in the higher temperature region of commonly employed kneading temperature range of EVOH, i.e., from about 150° C. to 250° C. In addition, the content of the fatty acid metal salt was based on the mass in the preparation of the mixture.

Pelletizing Condition

- extruder: manufactured by Toyo Seiki Seisaku-sho, Ltd., twin-screw extruder "Laboplast Mill";
- screw diameter: 25 mmφ;
- screw rotation speed: 100 rpm;
- feeder rotation speed: 100 rpm; and
- cylinders and die temperature settings: C1/C2/C3/C4/C5/D=180° C./230° C./250° C./250° C./250° C./250° C.

Examples 12 to 14 and Comparative Example 4

EVOH resin compositions, and resin compositions (J) obtained by subjecting the EVOH resin compositions to melt-kneading multiple times were produced in a similar manner to Example 11 except that each component of the type and the blended amount shown in Table 5 was employed.

Production of Multilayer Structure

By using a coextrusion molding apparatus, the EVOH resin compositions of Examples 11 to 14 and Comparative Example 4, polyolefin (polyethylene), carboxylic acid-modified polyolefin ("QF-500" available from Mitsui Chemicals Admer Inc.), and resin composition (J) were charged into each separate extruder, and a multilayer sheet having the total layer thickness of 1,000 μm and having a constitution of six layers involving four types, i.e., layered structural constitution: polyolefin layer: 300 μm/carboxylic acid-modified polyolefin layer: 50 μm/EVOH layer: 50 μm/carboxylic acid-modified polyolefin layer: 50 μm/resin composition (J) layer: 400 μm/polyolefin layer: 150 μm were produced.

Each Extruder and Extrusion Condition

- extruder of EVOH resin compositions of Examples 11 to 14 and Comparative Example 4: single screw, diameter 40 mm, L/D=26, temperature 170° C. to 240° C.,
- extruder of polyolefin: single screw, screw diameter 40 mm, L/D=22, temperature 160° C. to 210° C.,
- extruder of resin composition (J): single screw, diameter 65 mm, L/D=22, temperature 200° C. to 240° C., and
- extruder of carboxylic acid-modified polyolefin: single screw, diameter 40 mm, L/D=26, temperature 160° C. to 220° C.).

Molding Condition of Coextrusion Sheet Molding Apparatus

- feed block die (width: 600 mm), temperature 255° C.

Production of Thermoformed Container

The multilayer sheet obtained from the coextrusion molding apparatus (collected 30 min later, and 24 hrs later after starting running of the coextrusion molding apparatus) was cut away into a 15 cm square, and a thermoformed container was produced by thermoforming (compressed air: 5 kg/cm$^2$, plug: 45φ×65 mm, syntax form, plug temperature: 150° C., die temperature: 70° C.) to give a cup-shape (die shape 70φ×70 mm, draw ratio S=1.0) with a batch-type thermoforming testing machine available from Asano Laboratories Co. Ltd. under a condition involving a sheet temperature of 150° C.

Evaluations of EVOH resin compositions of Examples 11 to 14 and Comparative Example 4

Evaluations of performances were performed on the EVOH resin compositions of Examples 11 to 14 and Comparative Example 4 by producing blow-molded containers according to the following method. The structures of these blow-molded containers, and the results of the evaluations are shown in Table 5.

The EVOH resin compositions of Examples 11 to 14 and Comparative Example 4, polyethylene ("HZ8200B" available from Prime Polymer Co., Ltd.), an adhesive resin ("Admer GT-6A" available from Mitsui Chemicals, Inc.), and the resin composition (J) were used for molding 3-L blow-molded containers with a blow molding machine ("TB-ST-6P" available from Suzuki Seiko-sho Co.) at 210° C., with cooling at a die inner temperature of 15° C. for 20 sec. The 3-L blow-molded container had the average thickness of the total layer of 700 μm and had a constitution of six layers involving four types: polyethylene layer, average thickness: 240 μm/adhesive resin layer, average thickness: 40 μm/EVOH layer, average thickness: 40 μm/adhesive resin layer, average thickness: 40 μm/regrind layer, average thickness: 100 μm/polyethylene layer, average thickness: 240 μm from the interior side to the external side. The average diameter of the bottom face of the container was 100 mm, and the average height of the container was 400 mm.

Evaluation of Appearance Characteristics

The 3-L blow-molded container obtained using as the regrind layer, the resin composition (J) recovered ten times was visually observed to evaluate the streak and coloring in accordance with the following criteria, whereby evaluation of appearance characteristics was made.

Evaluation Criteria of Streak

"favorable (A)": no streak found;

"somewhat favorable (B)": streak found; and

"unfavorable (C)": a large number of streaks found.

Evaluation Criteria of Coloring

"favorable (A)": colorless;

"somewhat favorable (B)": yellowed; and

"unfavorable (C)": severely yellowing.

Evaluation of Impact Resistance

The 3-L blow-molded container obtained using as the regrind layer, EVOH resin composition or the resin composition (J) recovered 1, 5 or 10 times was packed with 2.5 L of propylene glycol, and the opening was heat-sealed with a film having a structure of: polyethylene 40 μm/aluminum foil 12 μm/polyethylene terephthalate 12 μm to give a lid. This tank was cooled at −40° C. for 3 days, and dropped from the height of 6 m such that the opening was situated upside. The evaluation was made based on the number of disruption (n=10).

Evaluation Criteria of Impact Resistance

"favorable (A)": less than 3;

"somewhat favorable (B)": 3 or greater and less than 6; and

"unfavorable (C)": 6 or greater.

Mean Dispersion Particle Size of EVOH Included in Regrind Layer

The blow-molded container was carefully cut with a microtome along a direction orthogonal to the lateral face of the container, and further the regrind layer was removed by using a scalpel. To the exposed cross section, vapor deposition of platinum was carried out in a vacuum atmosphere. The cross section on which platinum was vapor-deposited was magnified 10,000 times by using a scanning electron microscope (SEM), and the photograph was taken. A region including about 20 particles of EVOH in this photograph was selected, and the particle size of each particle image present in the region was measured. The average value of the measurements was calculated, which was defined to be the mean dispersion particle size. It is to be noted that for the measurement of the particle size of each particle, a longitudinal diameter (longest portion) of the particle observed in the photograph was measured, which was defined to be the particle size. It is to be noted that the cutting of the film or sheet was carried out orthogonally to the extrusion direction, and the photograph was taken from the orthogonal direction with respect to the cut-cross section.

Evaluation Criteria of Mean Dispersion Particle Size

"favorable (A)": less than 1.5 μm;

"somewhat favorable (B)": 1.5 μm or greater and less than 2.5 μm; and

"unfavorable (C)": 2.5 μm or greater.

TABLE 5

| | EVOH resin composition | | Polyolefin (D) | | Acid-modified polyolefin | | Fatty acid metal salt | | Appearance | | Mean dispersoid particle size | | | Impact resistance | | |
|---|---|---|---|---|---|---|---|---|---|---|---|---|---|---|---|---|
| | type | blended amount (parts by mass) | type | blended amount (parts by mass) | type | blended amount (parts by mass) | type | blended amount (parts by mass) | streak | coloring | once | five times | ten times | once | five times | ten times |
| Example 11 | Example 1 | 5.5 | LDPE | 87 | maleic acid-modified PE | 7.5 | Zinc stearate | 0.15 | B | B | B | B | C | B | B | C |
| Example 12 | Example 2 | 5.5 | LDPE | 87 | maleic acid-modified PE | 7.5 | Zinc stearate | 0.3 | A | A | A | B | B | A | B | B |
| Example 13 | Example 3 | 5.5 | LDPE | 87 | maleic acid-modified PE | 7.5 | calcium stearate | 0.3 | A | A | A | A | B | A | A | B |

TABLE 5-continued

| | EVOH resin composition | | Polyolefin (D) | | Acid-modified polyolefin | | Fatty acid metal salt | | Appearance | | Mean dispersoid particle size | | | Impact resistance | | |
|---|---|---|---|---|---|---|---|---|---|---|---|---|---|---|---|---|
| | type | blended amount (parts by mass) | type | blended amount (parts by mass) | type | blended amount (parts by mass) | type | blended amount (parts by mass) | streak | coloring | once | five times | ten times | once | five times | ten times |
| Example 14 | Example 4 | 5.5 | LDPE | 87 | maleic acid-modified PE | 7.5 | zinc stearate | 0.15 | A | A | A | A | A | A | A | A |
| Comparative Example 4 | Comparative Example 1 | 5.5 | LDPE | 87 | maleic acid-modified PE | 7.5 | zinc stearate | 1.0 | C | C | C | C | C | C | C | C |

As shown in Table 5, it was ascertained that the blow-molded containers produced by using the EVOH resin compositions of Examples were accompanied by inhibited generation of streak and coloring and were superior in appearance characteristics, compared with those of Comparative Examples. In addition, the blow-molded containers of Examples 11 to 14 exhibited superior impact resistance in the multilayer container containing the resin composition (J) repeatedly recovered five times. Furthermore, the blow-molded containers of Examples 12 to were also superior impact resistance even in the multilayer container containing the resin composition (J) repeatedly recovered ten times. Thus, it was proven that the resin composition containing the polyolefin (D) exhibited the effect of: preventing an increase in viscosity which may result from thermal deterioration of the EVOH component during repeated recovery; and inhibiting aggregation of the EVOH component in the resin composition to inhibit impairment of the impact resistance. Therefore, it was revealed that the resin composition containing the polyolefin (D) can be suitably used for blow-molded containers and the like.

Next, Example of the resin composition further containing the polyamide (E) will be described.

Preparation of EVOH resin composition of Example 15

The EVOH resin composition of Example 15 shown in Table 6 was prepared by a similar operation to that of Example 1.

TABLE 6

| | Resin composition | | | | | | | | | |
|---|---|---|---|---|---|---|---|---|---|---|
| | Vinyl acetate acetaldehyde content (ppm) | ethylene content (mol %) | degree of saponification (mol %) | alkali metal salt (B1) content[1)] (ppm) | Melt viscosity MFR (g/10 min) | Molecular weight[3)] RI (Ma) | Molecular weight[3)] UV(at 220 nm) (Mb) | Molecular weight[3)] UV(at 280 nm) (Mc) | Molecular weight correlation (Ma − Mb)/Ma | Molecular weight correlation (Ma − Mc)/Ma |
| Example 15 | 50 | 29 | 99 | 120 | 1.5 | 60,048 | 47,995 | 42,462 | 0.201 | 0.293 |

[1)]metal equivalent

[3)]after subjecting to a heat treatment in a nitrogen atmosphere at 220° C. for 50 hrs Preparation of Resin Composition Containing Polyamide (E) Examples 16 to 21 and Comparative Example 5

The EVOH resin compositions of Examples 1 to 4 and 15, and Comparative Example 1, polyamide (E) ("Ny1018A" (nylon 6) available from Ube Industries, Ltd.), and as the multivalent metal salt (B2), magnesium acetate tetrahydrate, zinc acetate dihydrate or calcium acetate dihydrate were mixed so as to give each content shown in Table 7. After the mixture was dry blended, an intended resin composition pellets was obtained by using a twin-screw extruder (Toyo Seiki Seisaku-sho, Ltd., 2D25W, 25 mmφ) to carry out extrusion under the extrusion condition involving a die temperature of 250° C. and a screw rotation speed of 100 rpm in a nitrogen atmosphere, followed by pelletization.

Production of Multilayer Sheet

A monolayer film having a thickness of 20 μm was produced from the dry pellets of each EVOH resin composition obtained as above, by using a single screw extrusion apparatus ("D2020" available from Toyo Seiki Seisaku-sho, Ltd.; D (mm)=20, L/D=20, compression ratio=2.0; screw: full flight). Each extrusion condition in this test was as follows:

extrusion temperature: 250° C.;
screw rotation speed: 40 rpm;
die width: 30 cm;
take-up roll temperature: 80° C.; and
take-up roll speed: 3.1 m/min.

The monolayer film produced as above, a commercially available biaxially stretched nylon 6 film ("Emblem ON" available from Unitika Limited, average thickness: 15 μm) and a commercially available unstretched polypropylene film ("Tohcello CP" available from Mitsui Chemicals Tohcello Inc. average thickness: 60 μm) were each cut away to give a size of A4. An adhesive for dry lamination was applied on both two faces of the monolayer film, and dry lamination was carried out such that the outer layer was nylon 6 film, and the inner layer was the unstretched polypropylene film. Thus resulting laminated film was dried at 80° C. for 3 min to allow the dilution liquid to be evaporated away to obtain a transparent multilayer sheet having 3 layers. In the adhesive for dry lamination employed, "TAKELAC A-385" available from Mitsui Chemicals, Inc. as a base material, "Takenate A-50" available from Mitsui Chemicals, Inc. as a hardening agent, a d ethyl acetate as a dilution liquid were included. The amount of application of this adhesive was 4.0 g/m. After the lamination, aging was carried out at 40° C. for 3 days.

Evaluations of Resin Compositions of Examples 16 to 21 and Comparative Example 5

The following evaluations were made on the resin compositions of Examples 16 to 21 and Comparative Example 5 obtained as above. The results of the evaluations are shown in Table 7.

Inhibitory Ability of Generation of Burnt Deposits

A monolayer film having a thickness of 20 μm was produced from the dry pellets of each resin composition using a single screw extrusion apparatus ("D2020" available from Toyo Seiki Seisaku-sho, Ltd.; D (mm)=20, L/D=20, compression ratio=2.0; screw: full flight). Each condition in this test was as follows:

extrusion temperature: 250° C.;
screw rotation speed: 40 rpm;
die width: 30 cm;
take-up roll temperature: 80° C.; and
take-up roll speed: 3.1 m/min.

A monolayer film was produced by a continuous operation under the condition described above, and 8 hrs later after starting the operation, the resin was changed to low density polyethylene ("Novatec LF128" available from Japan Polyethylene Corporation), and the film formation was carried out under the same condition for 30 min. Thereafter, the die was released to remove low density polyethylene, and the amount of burnt deposit attached to a die channel surface was measured. The inhibitory ability of generation of burnt deposits was evaluated in accordance with the following evaluation criteria.

"favorable (A)": less than 0.01 g;
"somewhat favorable (B)": 0.01 g or greater and less than 1.0 g; and
"unfavorable (C)": 1.0 g or greater.

Retort Resistance of Molded Article

By using the multilayer sheet obtained as above, a four-sided seal pouch having inside dimension of 12×12 cm was produced. Water was charged as a content. This pouch was subjected to a retorting process by using a retorting equipment (high-temperature and high-pressure cooking sterilization tester, "RCS-40 RTGN" available from Hisaka Works, Ltd.) at 120° C. for 20 min. After the completion of the retorting process, water on the surface was wiped off and the pouch was lest to stand in a high-temperature and high-humidity room at 20° C. and 65% RH for 1 day, and then evaluation of the retort resistance was made. The retort resistance was evaluated to be: "favorable (A)" in a case where the transparency has been maintained; "somewhat favorable (B)" in a case where patchy blooming was found; and "unfavorable (C)" in a case where blooming was found on the whole surface.

TABLE 7

| | EVOH resin composition | Blended amount mass ratio (A/E) | Multivalent metal salt (B2) metal element | Multivalent metal salt (B2) content (ppm) | Evaluation inhibitory ability of generation of burnt deposits | Evaluation retort resistance |
|---|---|---|---|---|---|---|
| Example 16 | Example 1 | 80/20 | Mg | 75 | B | B |
| Example 17 | Example 2 | 80/20 | Mg | 75 | B | A |
| Example 18 | Example 3 | 80/20 | Mg | 75 | A | A |
| Example 19 | Example 4 | 80/20 | Mg | 75 | A | A |
| Example 20 | Example 15 | 80/20 | Zn | 20 | B | B |
| Example 21 | Example 4 | 80/20 | Ca | 150 | A | B |
| Comparative Example 5 | Comparative Example 1 | 80/20 | Mg | 75 | C | C |

As is clear from the results shown in Table 7, the EVOH resin compositions of Examples, and the multilayer sheets formed from the EVOH resin compositions were superior in inhibitory ability of generation of burnt deposits in the molding machine during a long-run operation, and retort resistance. On the other hand, the EVOH resin composition of Comparative Example of which molecular weight correlation deviated from the specified range, and the multilayer sheet formed from the EVOH resin composition were proven to be inferior in inhibitory ability of generation of burnt deposits in the molding machine, or retort resistance.

Next, Examples of the resin compositions further containing the EVOH (F) will be described.

Preparation of EVOH Resin Composition of Example 22

EVOH resin composition of Example 22 shown in Table 8 was prepared by a similar operation to that of Example 1.

TABLE 8

| | Resin composition | | | | | | | | | |
|---|---|---|---|---|---|---|---|---|---|---|
| | acetaldehyde content (ppm) | ethylene content (mol %) | Vinyl acetate degree of saponification (mol %) | alkali metal salt (B1) content[1)] (ppm) | Melt viscosity MFR (g/10 min) | Molecular weight[3)] RI (Ma) | Molecular weight[3)] UV (at 220 nm) (Mb) | Molecular weight[3)] UV (at 280 nm) (Mc) | Molecular weight correlation (Ma − Mb)/Ma | Molecular weight correlation (Ma − Mc)/Ma |
| Example 22 | 50 | 27 | 99 | 120 | 1.5 | 60,048 | 47,995 | 42,462 | 0.201 | 0.293 |

1)metal equivalent 3)after subjecting to a heat treatment in a nitrogen atmosphere at 220° C. for 50 hrs

Synthesis of EVOH (F)

Synthesis Example 6

By a synthesis method similar to that of EVOH (A) of Synthesis Example 1 described above, pellets of EVOH (F) having an ethylene content of 44 mol % and a degree of saponification of 99 mol % were synthesized. The melting point of the EVOH (F) was 165° C.

Synthesis Example 7

By a synthesis method similar to that of EVOH (A) of Synthesis Example 1 described above, pellets of EVOH (F) having an ethylene content of 35 mol % and a degree of saponification of 99 mol % were synthesized. The melting point of the EVOH (F) was 177° C.

Synthesis Example 8

A modified EVOH (F) was synthesized by using epoxypropane and the EVOH (F) having an ethylene content of 44 mol % and a degree of saponification of 99.95 mol %, which was obtained in Synthesis Example 6 described above, on "TEM-35BS" (37 mmφ, L/D=52.5) available from Toshiba Machine Co., Ltd., by injecting epoxypropane from a barrel C9 under conditions involving the barrels C2 and C3 at 200° C., barrels C4 to C15 at 240° C. and the number of revolutions of 400 rpm. The degree of modification of the resulting modified EVOH (F) with respect to the total vinyl alcohol units was 8 mol %. The melting point of the EVOH (F) was 155° C.

Preparation of Resin Composition Containing EVOH (F)

Example 23

After the EVOH resin composition of Example 1, and the EVOH (F) synthesized in Synthesis Example 6 were dry blended in a mass ratio (EVOH (A)/EVOH (F)) of 80/20, a twin-screw extruder ("2D25W" available from Toyo Seiki Seisaku-sho, Ltd., 25 mmφ; die temperature: 220° C.; screw rotation speed: 100 rpm) was used to carry out extrusion in a nitrogen atmosphere, followed by pelletization gave resin composition pellets of Example 22.

Examples 24 to 27 and Comparative Example 6

Resin composition pellets (dry EVOH pellets) of Examples 24 to 27 and Comparative Example 6 were obtained in a similar manner to Example 23 except that the EVOH resin compositions of Examples 2 to 4, Example 22 and Comparative Example 1, and EVOH (F) synthesized in Synthesis Examples 6 to 8 were mixed in a mass ratio (EVOH (A)/EVOH (F)) shown in Table 9.

Evaluations of Resin Compositions of Examples 23 to 27 and Comparative Example 6

Each resin composition thus obtained was evaluated by using the following methods. The results of the evaluations are shown together in Table 9.

Inhibitory Ability of Flow Mark

Using a single screw extrusion apparatus ("D2020" available from Toyo Seiki Seisaku-sho, Ltd.; D (mm)=20, L/D=20, compression ratio=2.0, screw: full flight), a mono-layer film having a thickness of 150 μm was produced from the resin composition pellets obtained in each Example or Comparative Example. The molding conditions are as in the following:

extrusion temperature: 210° C.;
screw rotation speed: 100 rpm;
die width: 15 cm;
take-up roll temperature: 80° C.; and
take-up roll speed: 0.9 m/min.

A continuous operation was carried out under the conditions described above to produce a mono-layer film, and the appearance characteristic of each film produced after 8 hours from the start of the operation was evaluated by a visual inspection. The inhibitory ability of flow mark was evaluated to be: "A (favorable)" in a case where no flow mark was found; "B (somewhat favorable)" in a case where small flow marks were found or the generation frequency of the flow marks was low; and "C (unfavorable)" in a case where large flow marks were found and the generation frequency of the flow marks was high.

Inhibitory Ability of Coloring

The film obtained after 8 hours in the aforementioned molding was visually inspected to evaluate the coloring thereof in accordance with the following criteria:

"A (favorable)": colorless;
"B (somewhat favorable)": yellowed; and
"C (unfavorable)": significantly yellowed.

Heat Stretching Property

The film obtained as described above was preheated at 80° C. for 30 sec in a pantograph type biaxially stretching apparatus available from Toyo Seiki Seisaku-sho, Ltd., and thereafter simultaneously biaxially stretched with a draw ratio of 3×3 times to obtain a stretched film. The obtained stretched film was visually inspected to evaluate the heat stretching property in accordance with the following criteria:

"A (favorable)": no crack being generated;

"B (somewhat favorable)": cracks being locally generated; and

"C (unfavorable)": cracks being entirely generated.

TABLE 9

| | | EVOH (F) | | | | Blended | Evaluation | | |
|---|---|---|---|---|---|---|---|---|---|
| | | | | | | | appearance | | |
| | EVOH resin composition | ethylene content (mol %) | degree of modification (mol %) | degree of saponification (mol %) | Difference in melting point (° C.) | amount mass ratio (A/F) | inhibitory ability of flow mark | inhibitory ability of coloring | heat stretchability |
| Example 23 | Example 1 | 44 | 0 | 99 | 18 | 80/20 | B | B | B |
| Example 24 | Example 2 | 44 | 0 | 99 | 18 | 80/20 | A | B | A |
| Example 25 | Example 3 | 44 | 8 | 99 | 77 | 80/20 | A | A | A |
| Example 26 | Example 4 | 44 | 0 | 99 | 18 | 90/10 | A | A | A |
| Example 27 | Example 22 | 35 | 0 | 99 | 14 | 80/20 | B | B | C |
| Comparative Example 6 | Comparative Example 1 | 44 | 0 | 99 | 18 | 60/40 | C | C | C |

As is clear from the results shown in Table 9, the films formed by using the EVOH resin compositions of Examples were superior in inhibitory ability of flow mark, inhibitory ability of coloring and heat stretching properties. On the other hand, the resin composition of Comparative Example of which molecular weight correlation in the EVOH (A) deviated from the specified range was revealed to be inferior in the inhibitory ability of flow mark, inhibitory ability of coloring and heat stretching properties.

Next, Examples of the vapor-deposited films will be described.

Production of Vapor-Deposited Film

Example 28

Production of Base Film

With respect to 100 parts by mass of the EVOH resin composition pellets of Example 1, 0.03 parts by mass of synthetic silica ("Sylysia 310P" available from Fuji Silysia Chemical Ltd.; mean particle size as measured with a laser procedure: 2.7 μm) were dry blended by using a tumbler. The blend was molten at 240° C., and concurrently with extrusion on casting rolls from a die, the air was blown at a rate of 30 m/sec by using an air knife to obtain an unstretched film having a thickness of 170 μm. This unstretched film was brought into contact with hot water at 80° C. for 10 sec, and by using a tenter-type simultaneous biaxial stretching equipment, the film was stretched 3.2 times in the machine direction and 3.0 times in the width direction at 90° C. Furthermore, the stretched film was subjected to a heat treatment in the tenter at 170° C. for 5 sec to obtain a biaxially stretched film (base film) having a total width of 3.6 m. This base film was slit to give a width of 80 cm while unwinding, with a middle position with respect to the film total width being centered, whereby a roll having a length of 4,000 m was obtained. Furthermore, film formation of the base film was continuously carried out to yield 100 rolls in total having a length of 4,000 m. Volatiles were included in the obtained base film in an amount of 0.15% by mass. In addition, an odor was not percept during the production of the base film. This base film was packed with an aluminum foil-laminated film in order to prevent moisture absorption.

Formation of Metal Vapor-Deposition Layer

A vapor-deposited film was obtained by using a batch-type vapor deposition equipment ("EWA-105" available from ULVAC, Inc.) on the base film through vapor deposition of aluminum on one face of the biaxially stretched film, at the surface temperature of the biaxially stretched film of 38° C., and at a travelling speed of the biaxially stretched film of 200 m/min. The thickness of aluminum of the metal vapor-deposition layer was 70 nm.

On the resultant vapor-deposited film, evaluations of vapor deposition flaw and adhesion strength of the metal vapor-deposition layer were both favorable. The content of volatiles from the vapor-deposited film was identical in all the rolls, and was favorable.

Examples 29 to 32 and Comparative Example 7

Biaxially stretched films (base films) were produced in a similar manner to Example 28 by using EVOH resin composition pellets shown in Table 10, and further a metal vapor-deposition layer was formed to obtain vapor-deposited films. It is to be noted that for Example 32, after vapor deposition of aluminium on one face of the biaxially stretched film, aluminum was vapor further deposited on also other face of the biaxially stretched film.

Similar operations for evaluations on the EVOH resin compositions of Examples 7 to 10 and Comparative Example 3 described above were carried out for the vapor-deposited films of Examples 28 to 32 and Comparative Example 7 to measure/evaluate the thickness, the number of vapor deposition flaw (inhibitory ability of vapor deposition flaw), and adhesion strength of the metal vapor-deposition layer. The results are shown in Table 10.

TABLE 10

| | | Evaluation | | |
|---|---|---|---|---|
| | EVOH resin composition | thickness of vapor deposition layer (nm) | inhibitory ability of vapor deposition defect | adhesion strength |
| Example 28 | Example 1 | 70 | B | B |
| Example 29 | Example 2 | 150 | A | B |
| Example 30 | Example 3 | 100 | A | B |
| Example 31 | Example 4 | 70 | A | A |
| Example 32[4)] | Example 4 | 70 | A | A |
| | | 70 | A | A |
| Comparative Example 7 | Comparative Example 1 | 200 | C | C |

[4)]vapor deposition on both faces using the composition obtained in Example 4

As shown in Table 10, by virtue of using the EVOH (A) having the above-specified features, as a constituent of the base film, the vapor-deposited film that includes this base film was capable of inhibiting voids in aluminum vapor deposition (pinholes) which may be generated in vapor deposition, and was superior in adhesion strength.

Example 33

A laminated film was obtained by laminating a PET film ("E5000" available from Toyobo Co., Ltd., average thickness: 12 μm) on one face of the vapor-deposited film of Example 31, and further laminating on another face of the vapor-deposited film, an unstretched polypropylene film (CPP film) ("RXC-21" available from Mitsui Chemicals Tohcello Inc., average thickness: 50 μm). Oxygen transmission rate of this laminated film was measured. The results are shown in Table 11.

Oxygen Transmission Rate

Oxygen transmission rate was measured in accordance with JIS-K7126 (equal pressure method) (2006), by using a sample cut away from a part of the laminated film, with an oxygen transmission rate meter ("MOCON OX-TRAN2/20" available from Modern Controls, Inc., detection limit value: 0.01 mL/m$^2$·day·atm). The measurement conditions involved: a temperature of 40° C.; a humidity on the oxygen feeding side of 90% RH; a humidity on the carrier gas side of 0% RH; an oxygen pressure of 1 atmospheric pressure; and a carrier gas pressure of 1 atmospheric pressure. With regard to a process for setting of a laminated film to the oxygen transmission rate meter, in a case of a laminated film having a vapor-deposited film formed by providing a metal vapor-deposition layer on one face of a base film, the front face side of the metal vapor-deposition layer was placed on an oxygen feeding side, and the exposed face side of the base film was placed on a carrier gas side. In a case of a laminated film having a vapor-deposited film formed by providing metal vapor-deposition layers on both two faces of a base film, respectively, the film was placed irrespective of the sides of oxygen feeding and carrier gas.

Examples 34 to 36 and Comparative Example 8

Laminated films were prepared in a similar manner to Example 33 except that the layered structural constitutions were as shown in Table 11, and the oxygen transmission rate was measured. The results are shown in Table 11. It is to be noted that as the vapor-deposited PET film shown in Table 11, "VM-PET 1510" available from Toray Advanced Film Co., Ltd. (average thickness: 12 μm) was used. Moreover, in Example 36, the vapor-deposited film obtained in Example 32 was used in place of the vapor-deposited film obtained in Example 31 which was used in Example 33. Furthermore, in Comparative Example 8, the vapor-deposited film obtained in Comparative Example 7 was used in place of the vapor-deposited film obtained in Example 31 which was used in Example 33.

TABLE 11

| | Layer structure | Oxygen transmission rate (mL/m$^2$ · day · atm) |
|---|---|---|
| Example 33 | PET film/vapor-deposited film of Example 31/CPP film | 0.09 |
| Example 34 | vapor deposited PET film/vapor-deposited film of Example 31/ CPP film | 0.04 |
| Example 35 | PET film/vapor-deposited film of Example 31/vapor-deposited film of Example 31/CPP film | <0.01 |
| Example 36 | PET film/vapor-deposited film of Example 32/CPP film | <0.01 |
| Comparative Example 8 | PET film/vapor-deposited film of Comparative Example 7/CPP film | 0.34 |

As shown in Table 11, laminated films of Examples 33 to 36 exhibited lower oxygen transmission rate and superior gas barrier properties as compared with the laminated film of Comparative Example 8.

Next, Examples of the thermoformed containers will be described.

Production of Thermoformed Container

Examples 37 to 40 and Comparative Example 9

Thermoformed containers were produced by using the EVOH resin compositions of Examples 1 to 4 and Comparative Example 1, according to a method described later.

Production of Multilayer Sheet

By using a coextrusion molding apparatus, homopolypropylene for forming the layer (2) ("PY220" available from Mitsubishi NOBLEN Co., Ltd.), the EVOH resin compositions of Examples 1 to 4 and Comparative Example 1 for forming the layer (1), a carboxylic acid-modified polyolefin for forming the layer (3) ("QF-500" available from Mitsui Chemicals, Inc. Admer) were charged into each separate extruder, and a multilayer sheet having the average thickness of the total layer of 1,000 μm and having the layered structural constitution of (2): 425 μm/(3): 50 μm/(1): 50 μm/(3): 50 μm/(2): 425 μm. The extrusion molding was carried out by an operation with: an extruder provided with a single screw having a diameter of 65 mm and L/D of 22 at a temperature of 200° C. to 240° C. for homopolypropylene; an extruder provided with a single screw having a diameter of 40 mm and L/D of 26 at a temperature of 200° C. to 240° C. for the EVOH resin composition; and an extruder provided with a single screw having a diameter of 40 mm and L/D of 26 at a temperature of 200° C. to 240° C. for the carboxylic acid-modified polyolefin, and with and feed block die (width 600 mm) at 255° C.

Thermoforming

The multilayer sheet obtained from the coextrusion molding apparatus (collected 30 min later, and 24 hrs later after starting running of the coextrusion molding apparatus) was cut away into a 15 cm square, and a thermoformed container was produced by thermoforming (compressed air: 5 kg/cm$^2$, plug: 45φ×65 mm, syntax form, plug temperature: 150° C., die temperature: 70° C.) to give a cup-shape (die shape 70φ×70 mm, draw ratio S=1.0) with a batch-type thermoforming testing machine available from Asano Laboratories Co. Ltd. under a condition involving a sheet temperature of 150° C.

Evaluations of Examples 37 to 40 and Comparative Example 9

The motor torque fluctuation, the appearance characteristics and the impact resistance were evaluated on the resin composition, the multilayer sheet and the thermoformed container obtained as above, according to the procedures described below. The results of the evaluations are shown in Table 12.

Evaluation of Motor Torque Fluctuation

A change in torque when 60 g of EVOH pellets were kneaded in a Laboplast Mill ("20R200" available from Toyo Seiki Seisaku-sho, Ltd.; twin-screw, counter rotating type) at 100 rpm and 260° C. was measured. The torque was measured after 5 min from the beginning of the kneading, and the motor torque was evaluated in accordance with a time period which was required until the torque value reached 1.5 times the aforementioned torque value after 5 min from the beginning. This time period being longer indicates less change in viscosity, and more superior long-run stability.

Evaluation Criteria

A: 60 min or longer;

B: 40 min or longer and shorter than 60 min; and

C: 20 min or longer and shorter than 40 min.

Evaluation of Appearance Characteristics of Thermoformed Container

With respect to a thermoformed container molded using a multilayer sheet obtained after 6 hours from the starting running of a coextrusion molding apparatus, evaluations of appearance characteristics were made through evaluating streaks and coloring by a visual inspection in accordance with the following criteria.

Evaluation Criteria of Streaks

A (favorable): no streak found;

B (somewhat favorable): streaks found; and

C (unfavorable): a large number of streak found.

Evaluation Criteria of Coloring

A (favorable): colorless;

B (somewhat favorable): yellowed; and

C (unfavorable): significantly yellowed.

Evaluation of Impact Resistance

Thermoformed containers formed from multilayer sheets obtained after 20 min, 40 min, or 10 hours from the start of running of a coextrusion molding apparatus was filled with 250 mL of ethylene glycol, and the opening was capped by heat sealing using a film having a three-layer structure of polyethylene 40 μm/aluminum foil 12 μm/polyethylene terephthalate 12 μm. This thermoformed container was cooled at −40° C. for 3 days. Ten thermoformed containers thus treated were allowed to drop from a height of 6 m with the opening of the thermoformed containers facing upward, and the impact resistance was evaluated in accordance with the number of broken thermoformed containers. It is to be noted that the impact resistance of the samples formed from the multilayer sheet obtained after 20 min from the starting of the coextrusion molding apparatus may be an indicative of the self-purge feature.

Evaluation Criteria of Impact Resistance

A (favorable): less than 3;

B (somewhat favorable): 3 or greater and less than 6; and

C (unfavorable): 6 or greater.

TABLE 12

| | | Evaluation | | | | | |
|---|---|---|---|---|---|---|---|
| | | motor torque | appearance characteristics | | impact resistance | | |
| | EVOH resin composition | fluctuation | streak | coloring | 20 min later | 40 min later | 10 hrs later |
| Example 37 | Example 1 | B | B | B | B | B | B |
| Example 38 | Example 2 | A | B | B | A | B | B |
| Example 39 | Example 3 | A | A | A | A | B | B |
| Example 40 | Example 4 | A | A | A | A | A | A |
| Comparative Example 9 | Comparative Example 1 | C | C | C | C | C | C |

As shown in Table 12, the thermoformed containers of Examples 37 to 40 exhibited more inhibited coloring and generation of the streaks, and more superior appearance characteristics, as compared with the thermoformed container of Comparative Example 9. Moreover, the thermoformed containers of Examples 37 to 40 exhibited superior impact resistance even when the thermoformed containers were molded after 20 min from the start of running of the coextrusion molding apparatus. It was revealed that due to the use of the EVOH-containing resin composition that was superior in self-purge feature, the thermoformed containers of Examples 37 to 40 exhibited inhibited generation of gelatinous seeds and the like which would deteriorate the impact resistance within a short time period from the starting of the coextrusion molding apparatus.

Next, Examples of the blow-molded containers, as one embodiment of the blow-molded product will be described.

Production of Blow-Molded Container

Blow-molded containers were produced by using the EVOH resin compositions of Examples 1 to 4 and Comparative Example 1, and recovered resins prepared with the EVOH resin compositions.

Preparation of Recovered Resin

The EVOH resin compositions of Examples 1 to 4 and Comparative Example 1 in an amount of 4 parts by mass, 86 parts by mass of high density polyethylene ("HZ8200B" available from Mitsui Chemicals, Inc., melt flow rate (MFR) =0.01 g/10 min at 190° C.-2, 160 g), and 10 parts by mass of an adhesive resin ("ADMER GT-6A" available from Mitsui Chemicals, Inc., melt flow rate=0.94 g/10 min at 190° C.-2, 160 g) were dry blended, and thereafter extruded by using a twin-screw extruder ("2D25W" available from Toyo Seiki Seisaku-sho, Ltd.; 25 mmφ, die temperature: 220° C., screw rotation speed: 100 rpm) in a nitrogen atmosphere, followed by pelletization. Furthermore, in order to obtain a model recovered resin, the extrusion pellets were further subjected to extrusion with the same extruder under the same condition, followed by carrying out pelletization, and these operations were performed four times (blending in the extruder was repeated five times in total) to obtain a recovered resin.

Production of Blow-Molded Containers of Examples 41 to 44 and Comparative Example 10

Dry pellets of the EVOH resin composition, the high-density polyethylene, the adhesive resin and the recovered resin were used to give a parison of 6 layers involving 4 types, i.e., high-density polyethylene/adhesive resin/EVOH resin composition/adhesive resin/recovered resin/resin composition, from the inside to the outside, which was allowed to run for 2 hours in a blow-molding machine "TB-ST-6P"

manufactured by Suzuki Seiko Co., Ltd. at 210° C., and the operation was stopped for 2 hours with the state of heating. Thereafter, the operation was restarted, and blow molded containers produced after each specified time period were evaluated. It is to be noted that in the production of the blow-molded container, cooling at an internal temperature of the die of 15° C. for sec lead molding of a 3-L tank having the average thickness of the total layer of 1,000 μm (high-density polyethylene/adhesive resin/EVOH resin composition/adhesive resin/recovered resin/resin composition, from the inside to the outside, =340/50/40/50/400/120 μm, from the inside to the outside. The tank had a bottom face diameter of 100 mm, and a height of 400 mm.

Evaluations of Blow-Molded Container

Evaluations were made as follows, on each blow-molded container thus obtained. The results of the evaluations are shown together in Table 13.

Motor Torque Fluctuation

Dry resin composition pellets in an amount of 60 g were kneaded in a Laboplast Mill ("20R200" available from Toyo Seiki Seisaku-sho, Ltd.; twin-screw, counter rotating type) at 100 rpm and 260° C. A time period which was required until the torque value reached 1.5 times the torque value after 5 min from the beginning was determined, and the evaluation was made in accordance with the following evaluation criteria.

"favorable (A)": 60 min or longer;

"somewhat favorable (B)": 40 min or longer and shorter than 60 min; and

"unfavorable (C)": shorter than 40 min.

Evaluations of Appearance Characteristics

With respect to the 3-L tanks having been molded 40 min later after the restarting, evaluations of appearance characteristics were made through evaluating streaks and coloring by a visual inspection in accordance with the following criteria.

Evaluation Criteria of Streak

"favorable (A)": no streak being found;

"somewhat favorable (B)": any streak being found; and

"unfavorable (C)": a large number of streaks being found.

Evaluation Criteria of Coloring

"favorable (A)": colorless;

"somewhat favorable (B)": yellowed; and

"unfavorable (C)": significantly yellowed.

Evaluation of Impact Resistance

The 3-L tanks having been blow molded 20 min later, min later, and 10 hrs later after restarting were charged with 2.5 L of propylene glycol, and the opening was capped by heat sealing using a film having a constitution of polyethylene 40 μm/aluminum foil 12 μm/polyethylene terephthalate 12 μm. The tank was cooled at −40° C. for 3 days, and allowed to drop from a height of 6 m with the opening thereof facing upward. The impact resistance was evaluated in accordance with the number of broken tank (n=10). The impact resistance of the sample obtained 20 min later after the restarting may be an indicative of the self-purge feature.

Evaluation Criteria of Impact Resistance

"favorable (A)": less than 3;

"somewhat favorable (B)": 3 or greater and less than 6; and

"unfavorable (C)": 6 or greater.

TABLE 13

| | EVOH resin composition | Average thickness of layer (1) (%) | EVOH content in layer (4) (% by mass) | Evaluation: motor torque fluctuation | Evaluation: appearance characteristics streak | Evaluation: appearance characteristics coloring | Evaluation: impact resistance 20 min later | Evaluation: impact resistance 40 min later | Evaluation: impact resistance 10 hrs later |
|---|---|---|---|---|---|---|---|---|---|
| Example 41 | Example 1 | 4 | 6.7 | B | B | B | B | B | B |
| Example 42 | Example 2 | 4 | 6.7 | B | B | B | A | B | B |
| Example 43 | Example 3 | 4 | 6.7 | A | A | A | A | A | B |
| Example 44 | Example 4 | 4 | 6.7 | A | A | A | A | A | A |
| Comparative Example 10 | Comparative Example 1 | 4 | 6.7 | C | C | C | C | C | C |

As shown in Table 13, it was proven that the blow-molded containers of Examples exhibited superior appearance characteristics and the like, with inhibited generation of streak and coloring. In addition, the blow-molded containers of Examples exhibited superior impact resistance even if molded 20 min later after the restarting of the molding apparatus. Thus, it was revealed that by virtue of using the EVOH-containing resin composition that was superior in self-purge feature, the blow-molded containers of Examples circumvented generation of gelatinous seeds and the like that reduced impact resistance within an extremely short time period after restarting.

On the other hand, in the case where EVOH (A) does not having the above-specified feature (Comparative Example 10), it was proven that the inhibitory ability of generation of streak and coloring, as well as impact resistance and the like were impaired.

INDUSTRIAL APPLICABILITY

The ethylene-vinyl alcohol copolymer and the resin composition of the embodiments of the present invention result in superior long-run stability in melt molding, and enable generation of film forming defects such as streaks and flaws in formed film, and coloring to be inhibited. Thus, the ethylene-vinyl alcohol copolymer and resin composition are capable of providing a molded article such as a multilayer structure that is superior in appearance characteristics.

EXPLANATION OF THE REFERENCE SYMBOLS

1 cup-shaped container
2 cup main body
3 flange portion
4 opening
5 inner surface
6 outer surface
7 lid
11 layer (1) (EVOH layer)
12 layer (2) (thermoplastic resin layer)
13 layer (3) (polyolefin layer)
14 layer (4) (regrind layer)
20 continuous multilayer structure
30 heating apparatus
31, 32 heater
40 die apparatus
50 lower mold half
51 upper mold half
52 recessed part
53 plug
101 layer (1) (ethylene-vinyl alcohol copolymer layer)
102 layer (2) (thermoplastic resin layer)
103 layer (3) (carboxylic acid-modified polyolefin layer)
104 layer (4) (layer containing ethylene-vinyl alcohol copolymer, thermoplastic resin and carboxylic acid-modified polyolefin)
105 blow-molded container
106 container internal surface
107 container external surface

The invention claimed is:

1. A method of producing a resin composition, comprising:

copolymerizing ethylene with vinyl acetate having a content of acetaldehyde of from 1 ppm to 100 ppm to obtain an ethylene-vinyl acetate copolymer;

saponifying the ethylene-vinyl acetate copolymer to obtain an ethylene-vinyl alcohol copolymer (A) having a degree of saponification of at least 85 mol %;

neutralizing a catalyst for the saponification;

washing the ethylene-vinyl alcohol copolymer (A) with water;

pelletizing the washed ethylene-vinyl alcohol copolymer (A) to obtain pellets of the washed ethylene-vinyl alcohol copolymer (A), immersing the pellets in an aqueous solution of an alkali metal salt (B1), wherein the alkali metal salt is one or more selected from the group consisting of sodium acetate, potassium acetate, sodium stearate, potassium stearate, and a sodium salt of ethylenediaminetetraacetic acid, separating the pellets containing the alkali metal salt (B1) from the aqueous solution, and drying the pellets containing the alkali metal salt (B1) to obtain the resin composition; and adding an ethylene-vinyl alcohol copolymer (F) having an ethylene content of 30 mol % to 60 mol % and a degree of saponification of at least 85 mol % to the resin composition, wherein:

an ethylene content of the ethylene-vinyl alcohol copolymer (A) is from 20 mol % to 60 mol % as measured by $H^1$-NMR, a value obtained by subtracting the ethylene content of the ethylene-vinyl alcohol copolymer (A) from the ethylene content of the ethylene-vinyl alcohol copolymer (F) is 8 mol % or greater, a mass ratio of (A/F) of the ethylene-vinyl alcohol copolymer (A) to the ethylene-vinyl alcohol copolymer (F) is from 60/40 to 95/5, after subjecting the ethylene-vinyl alcohol copolymer (A) to heat treatment in a nitrogen atmosphere at 220° C. for 50 hrs, molecular weights of the ethylene-vinyl alcohol copolymer (A) determined by gel permeation chromatography with a differential refractive index detector and an ultraviolet and visible absorbance detector satisfy (I') and (i):

$$(Ma-Mb)/Ma \leq 0.019 \qquad \text{(I')},$$

$$Mb \geq 50{,}000 \qquad \text{(i)};$$

Ma represents a peak top molecular weight of the ethylene-vinyl alcohol copolymer (A) after the heat treatment measured by the differential refractive index detector calibrated with polymethyl methacrylate, and Mb represents an absorption peak molecular weight of the ethylene-vinyl alcohol copolymer (A) at a wavelength of 220 nm after the heat treatment measured by the ultraviolet and visible absorbance detector calibrated with polymethyl methacrylate; and a content of the alkali metal salt (B1) in terms of metal equivalent is from 10 ppm to 150 ppm of the resin composition.

2. The method according to claim 1, wherein:

after subjecting the ethylene-vinyl alcohol copolymer (A) to a heat treatment in a nitrogen atmosphere at 220° C. for 50 hrs, molecular weights of the ethylene-vinyl alcohol copolymer (A) determined by gel permeation chromatography with a differential refractive index detector and an ultraviolet and visible absorbance detector further satisfy (2):

$$(Ma-Mc)/Ma < 0.45 \qquad \text{(2)};$$

Ma represents a peak top molecular weight of the ethylene-vinyl alcohol copolymer (A) after the heat treatment measured by the differential refractive index detector calibrated with polymethyl methacrylate, and Mc represents an absorption peak molecular weight of the ethylene-vinyl alcohol copolymer (A) at a wavelength of 280 nm after the heat treatment measured by the ultraviolet and visible absorbance detector calibrated with polymethyl methacrylate.

3. The method according to claim 1, wherein:

the ethylene-vinyl alcohol copolymer (F) comprises a structural unit represented by formula (3):

(3)

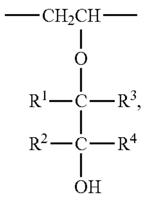

in which $R^1$, $R^2$, $R^3$ and $R^4$ each independently represent a hydrogen atom, a hydrocarbon group having 1 to 10 carbon atoms or an alkoxy group having 1 to 10 carbon atoms, a part or all of hydrogen atoms included in the hydrocarbon group are unsubstituted or substituted with a hydroxyl group, an alkoxy group, a carboxy group or a halogen atom, and $R^1$ and $R^2$ taken together represent or do not represent a ring structure; and a content of the structural unit represented by the formula (3) with respect to total vinyl alcohol units is from 0.3 mol % to 40 mol %.

4. The method according to claim 1, wherein a difference between a melting point of the ethylene-vinyl alcohol copolymer (A) and a melting point of the ethylene-vinyl alcohol copolymer (F) is 15° C. or greater.

5. The method according to claim 1, further comprising: adding a multivalent metal salt (B2) of an organic acid to the resin composition, wherein a content of the multivalent metal salt (B2) in terms of metal equivalent is from 1 ppm to 500 ppm of the resin composition.

6. The method according to claim 5, wherein the content of the multivalent metal salt (B2) in terms of metal equivalent is from 50 ppm to 500 ppm.

7. The method according to claim 1, further comprising: adding inorganic particles (C) to the resin composition, wherein a content of the inorganic particles (C) is from 50 ppm to 5,000 ppm of the resin composition.

8. The method according to claim 7, wherein the inorganic particles (C) are selected from the group consisting of an oxide, nitride and oxynitride of a metal selected from the group consisting of silicon, aluminum, magnesium, zirconium, cerium, tungsten, and molybdenum.

9. The method according to claim 1, further comprising: adding a polyolefin (D) to the resin composition.

10. The method according to claim 1, further comprising: adding a polyamide (E) to the resin composition, wherein a mass ratio (A/E) of the ethylene-vinyl alcohol copolymer (A) to the polyamide (E) is from 60/40 to 95/5.

11. The method according to claim 1, wherein the content of the alkali metal salt (B1) in terms of metal equivalent is from 30 ppm to 100 ppm.

12. The method according to claim 1, wherein the copolymerizing of the ethylene with the vinyl acetate is terminated when a conversion of the vinyl acetate reaches 40%.

13. A film, comprising the resin composition obtained according to the method of claim 1.

14. A vapor-deposited film, comprising the film according to claim 13, and a metal vapor-deposition layer laminated on the film.

15. A multilayer structure, comprising a first layer comprising the resin composition obtained according to the method according to claim 1.

16. A thermoformed container, comprising the multilayer structure according to claim 15.

17. A blow-molded product, comprising the multilayer structure according to claim 15.

* * * * *